US012700858B2

(12) United States Patent
Okuda et al.

(10) Patent No.: US 12,700,858 B2
(45) Date of Patent: Aug. 4, 2026

(54) SEMICONDUCTOR DEVICE

(71) Applicant: ROHM CO., LTD., Kyoto (JP)

(72) Inventors: Hajime Okuda, Kyoto (JP); Yoshinori Fukuda, Kyoto (JP); Yuji Osumi, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 362 days.

(21) Appl. No.: 18/476,929

(22) Filed: Sep. 28, 2023

(65) Prior Publication Data

US 2024/0030907 A1     Jan. 25, 2024

Related U.S. Application Data

(63) Continuation of application No. PCT/JP2022/012840, filed on Mar. 18, 2022.

(30) Foreign Application Priority Data

Mar. 31, 2021     (JP) ................................. 2021-060325

(51) Int. Cl.
| *H03K 17/0812* | (2006.01) |
| *H03K 17/08* | (2006.01) |

(52) U.S. Cl.
CPC ................. *H03K 17/08122* (2013.01); *H03K 2017/0806* (2013.01)

(58) Field of Classification Search
CPC ..... H03K 17/08122; H03K 2017/0806; H03K 17/0822; H03K 17/102; H10D 30/021;

(Continued)

(56) References Cited

U.S. PATENT DOCUMENTS

| 2016/0133742 A1* | 5/2016 | Okuda | .............. | H01L 23/49562 |
| | | | | 438/270 |
| 2019/0260371 A1 | 8/2019 | Wada et al. | | |
| 2020/0273858 A1* | 8/2020 | Nasu | ...................... | H10D 30/66 |

FOREIGN PATENT DOCUMENTS

JP        2021044578 A        3/2021

OTHER PUBLICATIONS

International Search Report for PCT/JP2022/012840, mailed on Jun. 7, 2022.
Written Opinion for PCT/JP2022/012840, mailed on Jun. 7, 2022.

* cited by examiner

*Primary Examiner* — Duy T Nguyen
(74) *Attorney, Agent, or Firm* — Rabin & Berdo, P.C.

(57)                ABSTRACT

A semiconductor device includes a semiconductor chip which has a main surface and a main transistor which includes a first system transistor and a second system transistor that are each formed in the main surface so as to be individually controlled, in which the first system transistor includes a first composite cell which is constituted of an $\alpha$-number ($\alpha \geq 2$) of first unit transistors that are arrayed so as to be mutually adjacent to the main surface and that each have a first trench structure including a first electrode embedded in a first trench formed in the main surface, and the second system transistor includes a second composite cell which is arranged so as to be adjacent to the first composite cell and constituted of a $\beta$-number ($\beta \geq 2$) of second unit transistors that are arrayed so as to be mutually adjacent to the main surface and that each have a second trench structure including a second electrode embedded in a second trench formed in the main surface.

20 Claims, 36 Drawing Sheets

(58) Field of Classification Search
CPC .... H10D 30/60; H10D 84/0126; H10D 84/83;
H10D 84/00; H10D 84/038; H01L 21/76
USPC ........................................................ 257/368
See application file for complete search history.

8

1

1

1

1

1

SEMICONDUCTOR DEVICE

CROSS REFERENCE TO RELATED APPLICATIONS

The present application is a bypass continuation of International Patent Application No. PCT/JP2022/012840, filed on Mar. 18, 2022, which claims priority to Japanese Patent Application No. 2021-060325 filed in the Japan Patent Office on Mar. 31, 2021, and the entire disclosure of the application is incorporated herein by reference.

BACKGROUND

1. Field of the Disclosure

The present disclosure relates to a semiconductor device.

2. Description of the Related Art

US Patent Application Publication No. 2019/0260371 discloses a semiconductor device which includes a first power transistor, a second power transistor, an active clamp circuit and an active clamp shut-off circuit. A drain of the second power transistor is electrically connected to a drain of the first power transistor. A source of the second power transistor is electrically connected to a source of the first power transistor. The active clamp circuit is electrically connected to the drain and a gate of the first power transistor and electrically connected to the drain and a gate of the second power transistor. The active clamp shut-off circuit is electrically connected to the active clamp circuit and the gate of the second power transistor.

DETAILED DESCRIPTION OF THE PREFERRED EMBODIMENTS

Hereinafter, a detailed description of the embodiments shall be given. The attached drawings are not drawn precisely but are schematic views and are not necessarily matched in scale, etc.

Figures 1, 2:
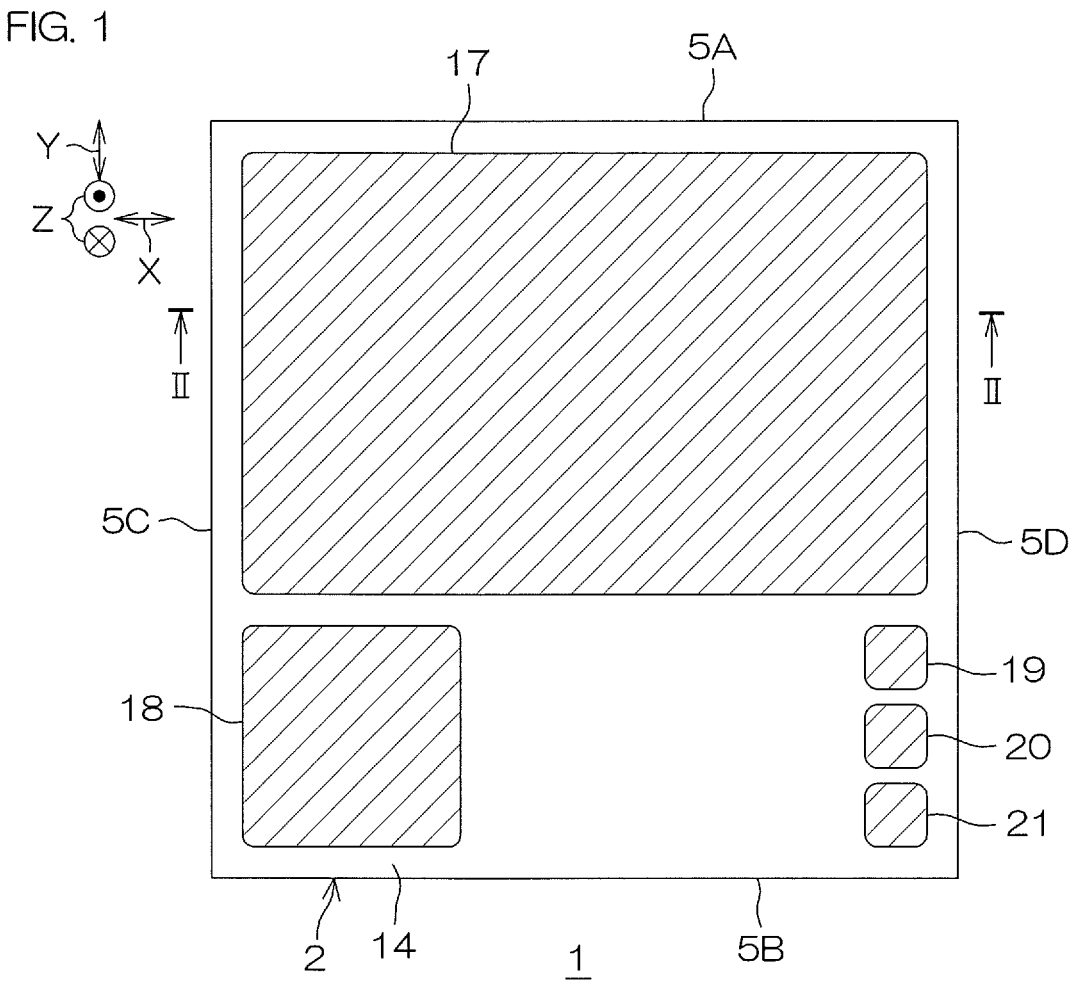
FIG. 1 is a plan view which shows a semiconductor device according to an embodiment of the present invention.
FIG. 2 is a cross-sectional view taken along line II-II shown in FIG. 1.
Figure 3:
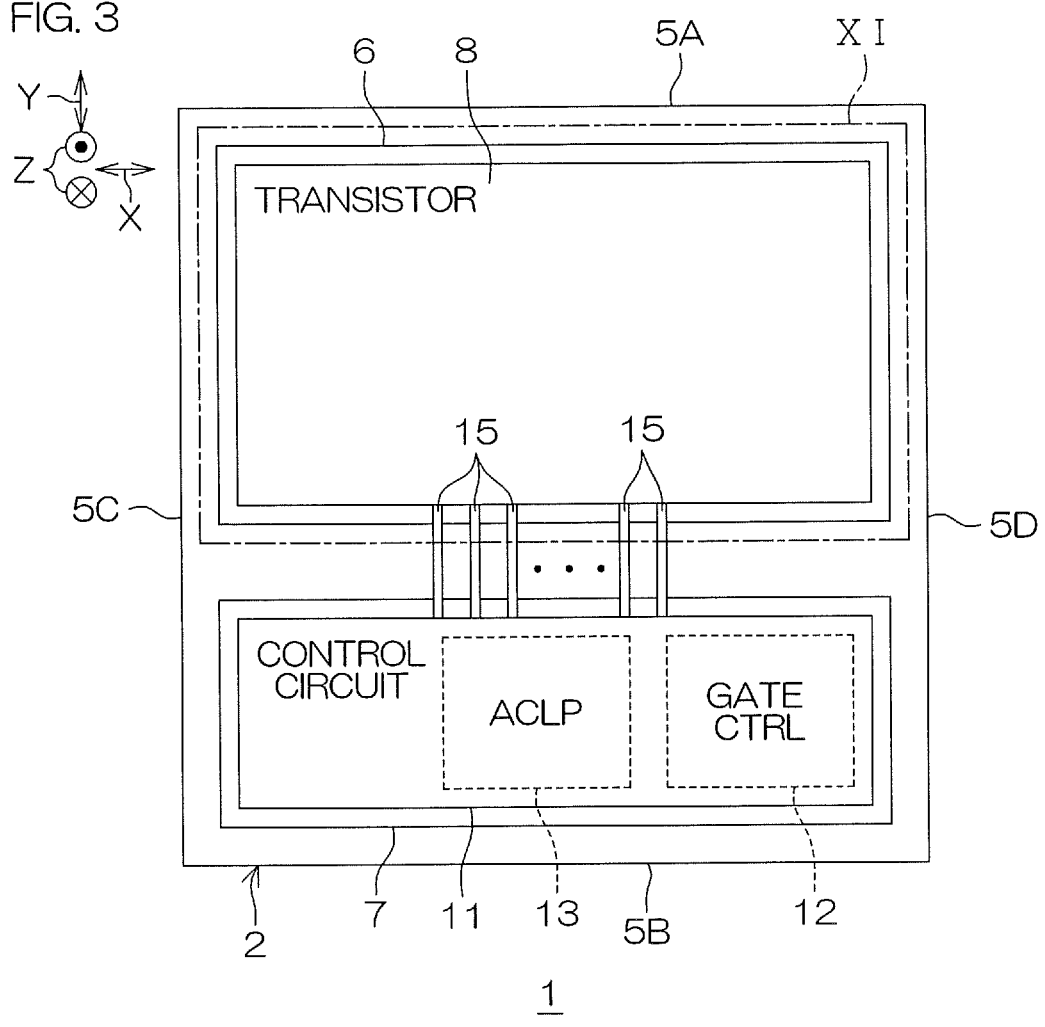
FIG. 3 is a plan view which shows a layout example inside a semiconductor chip shown in FIG. 1.
Figure 4:
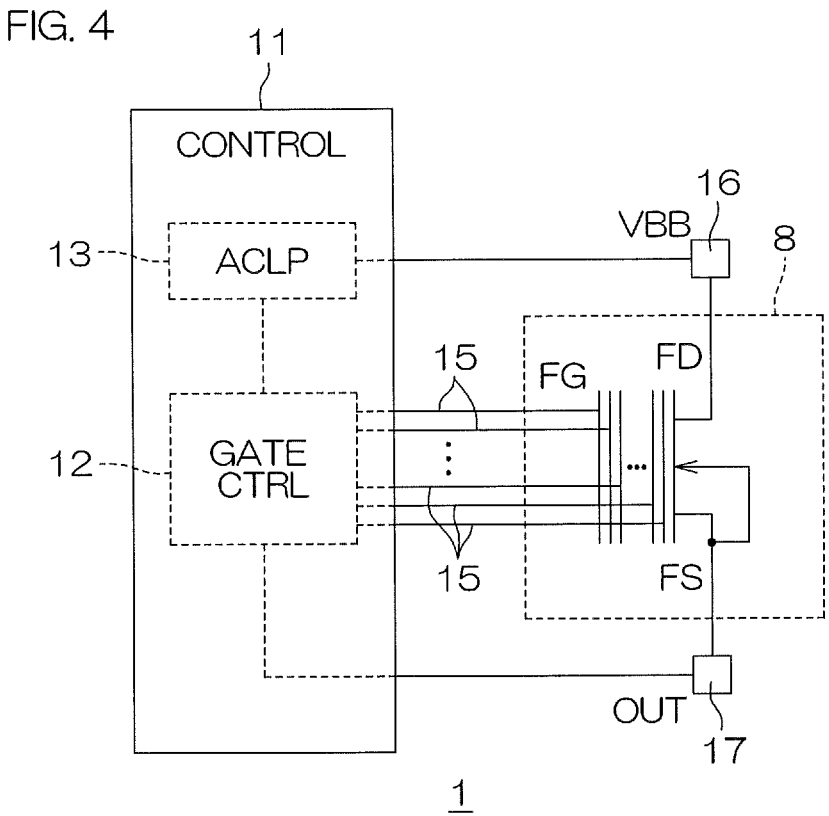
FIG. 4 is a block circuit diagram which shows an electrical arrangement example of the semiconductor device shown in FIG. 1.
Figure 5:
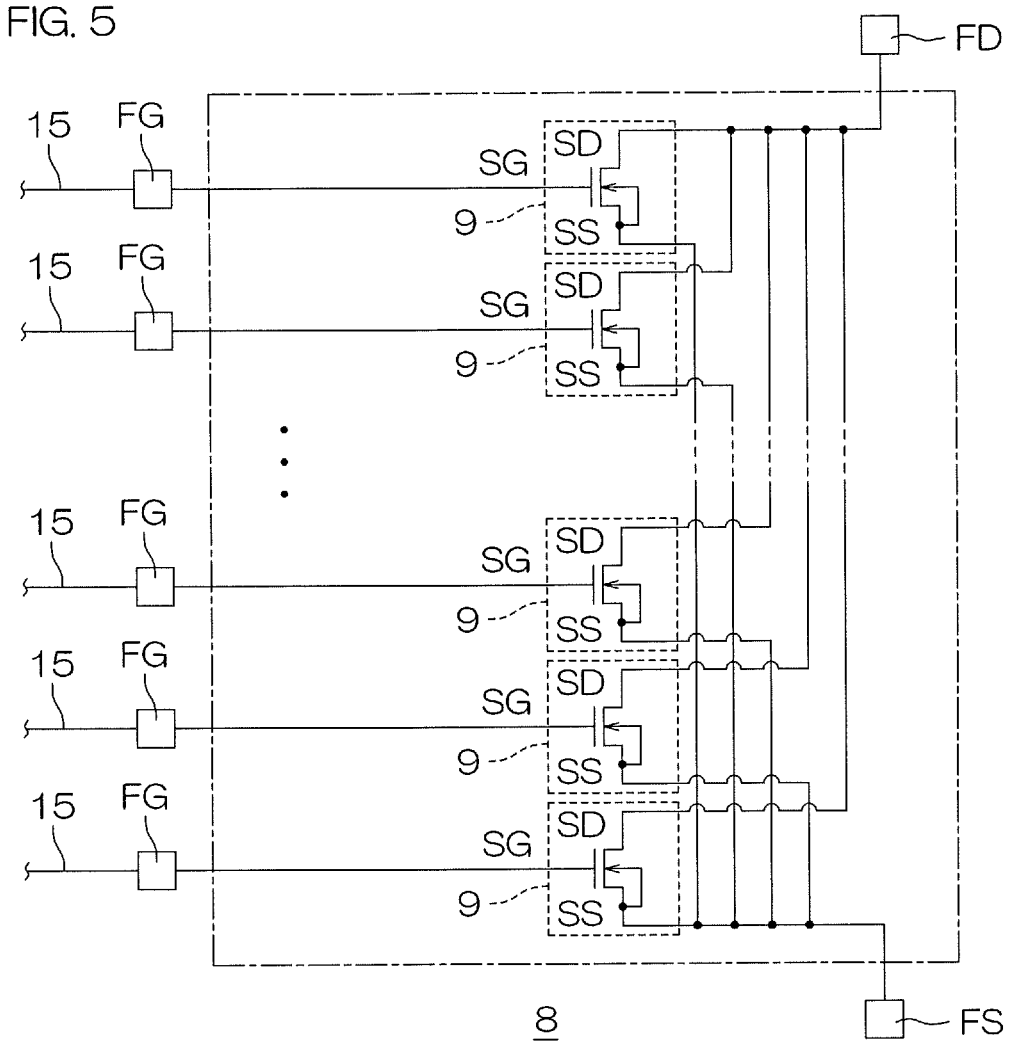
FIG. 5 is an equivalent circuit diagram of a main transistor shown in FIG. 4.
Figure 6:
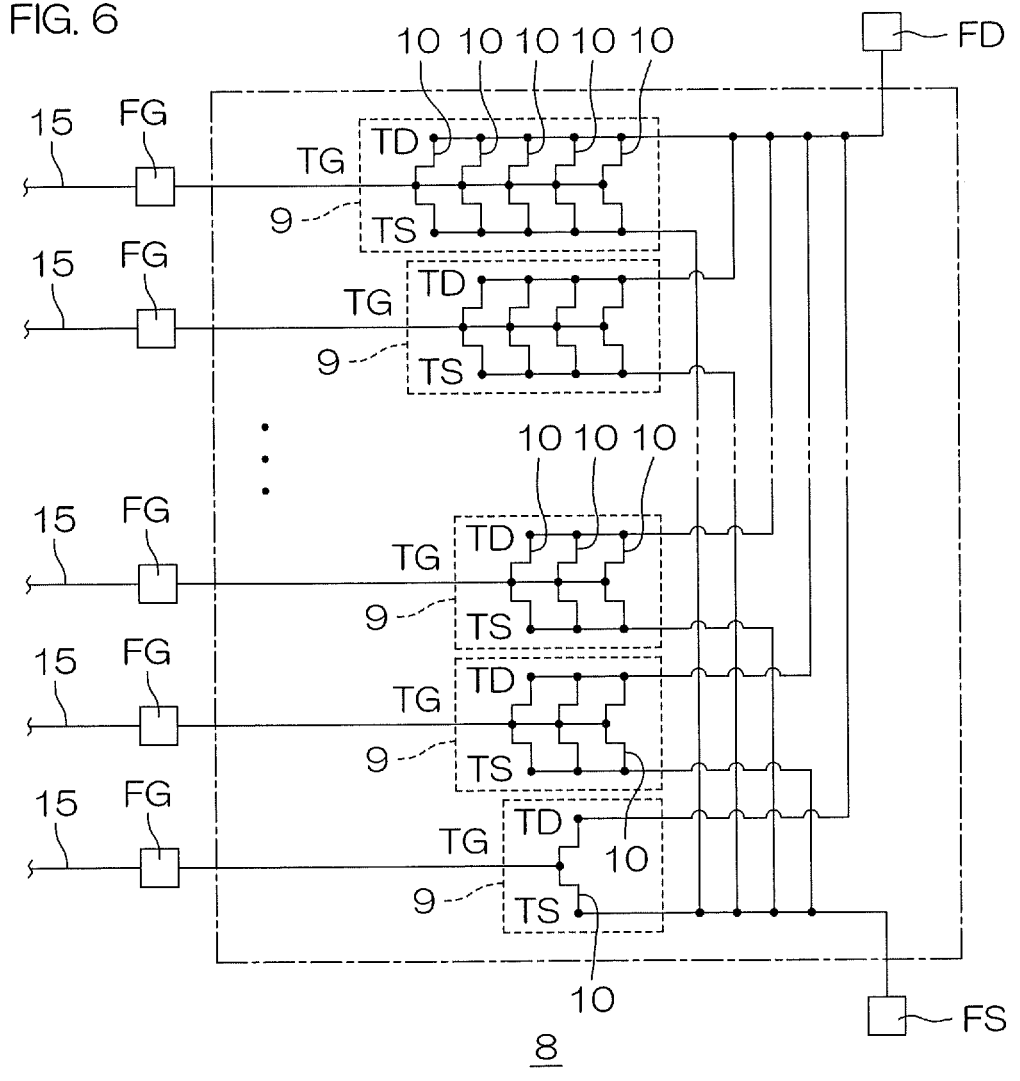
FIG. 6 is another equivalent circuit diagram of a main transistor shown in FIG. 5.

FIG. 1 is a plan view which shows a semiconductor device 1 according to an embodiment. FIG. 2 is a cross-sectional view taken along line II-II shown in FIG. 1. FIG. 3 is a plan view which shows a layout example inside a semiconductor chip 2 shown in FIG. 1. FIG. 4 is a block circuit diagram showing an electrical arrangement example of the semiconductor device 1 in FIG. 1. FIG. 5 is an equivalent circuit diagram of a main transistor 8 shown in FIG. 4. FIG. 6 is another equivalent circuit diagram of the main transistor 8 shown in FIG. 5.

With reference to FIG. 1 and FIG. 2, in this embodiment, the semiconductor device 1 includes the semiconductor chip 2 which is formed in a rectangular parallelepiped shape. The semiconductor chip 2 is constituted of a chip which includes Si (silicon). The semiconductor chip 2 may be constituted of a chip which includes an Si monocrystal or an SiC monocrystal. The semiconductor chip 2 has a first main surface 3 on one side, a second main surface 4 on the other side, and first to fourth side surfaces 5A to 5D which connect the first main surface 3 and the second main surface 4. The first main surface 3 and the second main surface 4 are formed in a quadrilateral shape as viewed in plan from a normal direction Z thereto (hereinafter, simply referred to "as viewed in plan").

The first main surface 3 is a device surface in which a functional device is formed. The second main surface 4 is a mounting surface and may be constituted of a ground surface having ground marks. The first to fourth side surfaces 5A to 5D include a first side surface 5A, a second side surface 5B, a third side surface 5C, and a fourth side surface 5D. The first side surface 5A and the second side surface 5B extend in a first direction X along the first main surface 3 and oppose a second direction Y that intersects (specifically, orthogonal to) in the first direction X. The third side surface 5C and the fourth side surface 5D extend in the second direction Y and oppose the first direction X.

With reference to FIG. 3, the semiconductor device 1 includes a first device region 6 which is arranged in the first main surface 3. The first device region 6 is an output region in which an output signal that is output to the outside is to be generated. In this embodiment, the first device region 6 is demarcated in a region of the first main surface 3 on the first side surface 5A side. The first device region 6 may be demarcated in a quadrilateral shape or may be demarcated in a polygonal shape other than the quadrilateral shape as viewed in plan. The arrangement and planar shape of the first device region 6 are arbitrary and not restricted to a particular mode.

The semiconductor device 1 includes a second device region 7 which is arranged in a region of the first main surface 3 different from the first device region 6. The second device region 7 is an input region into which an electric signal from the outside is to be input. In this embodiment, the second device region 7 is demarcated in a region on the second side surface 5B side with respect to the first device region 6. The second device region 7 may be demarcated in a quadrilateral shape or may be demarcated in a polygonal shape other than the quadrilateral shape as viewed in plan. The arrangement and planar shape of the second device region 7 are arbitrary and not restricted to a particular mode.

The second device region 7 preferably has a planar area which is not more than a planar area of the first device region 6. The second device region 7 is preferably formed so as to have an area ratio of not less than 0.1 and not more than 1 with respect to the first device region 6. The area ratio is a ratio of the planar area of the second device region 7 to the planar area of the first device region 6. The area ratio is preferably less than 1. As a matter of course, the second device region 7 that has a planar area exceeding the planar area of the first device region 6 may be adopted.

With reference to FIG. 4, the semiconductor device 1 includes an n-system ($n \geq 2$) insulated gate type main transistor 8 which is formed in the first device region 6. The main transistor 8 may be referred to as a "gate divided transistor," a "power transistor" or a "power MISFET (Metal Insulator Semiconductor Field Effect Transistor)." The main transistor 8 includes an n-number of first gates FG, one first drain FD, and one first source FS. The first gate FG, the first drain FD and the first source FS may be respectively referred to as a "main gate," a "main drain" and a "main source."

The same or different n-number of gate signals G (gate voltages) are to be input into the n-number of the first gates FG at arbitrary timings. Each gate signal G includes an on signal which controls a part of the main transistor 8 so as to be in an on state and an off signal which controls a part of the main transistor 8 so as to be in an off state. The main transistor 8 generates a single output current IOUT (output signal) in response to the n-number of the gate signals G and outputs it from the first drain FD and the first source FS. That is, the main transistor 8 is constituted of a multi-input/single-output type switching device. Specifically, the output current TOUT is a drain-source current which flows between the first drain FD and the first source FS. The output current TOUT is output to the outside of the first device region 6.

With reference to FIG. 5, the main transistor 8 includes an n-number of system transistors 9. The n-number of the system transistors 9 are formed to concentrate in the single first device region 6 and configured so as to be controlled in an on state and in an off state electrically independently of each other. Specifically, the n-number of the system transistors 9 are connected in parallel to each other so that the n-number of the gate signals G are to be individually input and configures one parallel circuit (=main transistor 8). That is, the n-system main transistor 8 is configured so that the system transistor 9 in an on state coexist with the system transistor 9 in an off state at an arbitrary timing.

The n-number of the system transistors 9 each include a second gate SG, a second drain SD, and a second source SS. The second gate SG, the second drain SD, and the second source SS may be respectively referred to as a "system gate," a "system drain," and a "system source." The n-number of the second gates SG are each connected to the n-number of the first gates FG in a one-to-one correspondence. The n-number of the second drains SD are each connected to one first drain FD. The n-number of the second sources SS are each connected to one first source FS.

That is, the n-number of the second gates SG, the n-number of the second drains SD and the n-number of the second sources SS of the n-number of the system transistors 9 respectively configure the n-number of the first gates FG, one first drain FD and one first source FS of the main transistor 8. The n-number of the first gates FG are practically constituted of the n-number of the second gates SG.

The n-number of the system transistors 9 each generate a system current (electric signal) in response to the corresponding gate signal G and each output the system current from the first drain FD and the first source FS. Specifically, each system current is a drain-source current which flows between the second drain SD and the second source SS of each of the system transistors 9. The n-number of the system currents may be values different from each other or may be values equal to each other. The n-number of the system currents are added between the first drain FD and the first source FS. Thereby, a single output current IOUT which is constituted of an added value of the n-number of the system currents is generated.

With reference to FIG. 6, the n-number of the system transistors 9 each include a single or a plurality of unit transistors 10 which are systematized (grouped) as an individually controlled object. In this embodiment, the plurality of unit transistors 10 are each constituted of a trench gate type. Specifically, the n-number of the system transistors 9 each have a parallel circuit which is constituted of the single or the plurality of unit transistors 10.

A case that the system transistor 9 is constituted of the single unit transistor 10 is also included in a "parallel circuit" described here. Although the number of the unit transistors 10 included in each system transistor 9 is arbitrary, at least one system transistor 9 preferably includes the plurality of unit transistors 10. The n-number of the system transistors 9 may be constituted of the same number or different numbers of the unit transistors 10.

Each unit transistor 10 includes a third gate TG, a third drain TD, and a third source TS. The third gate TG, the third drain TD, and the third source TS may be respectively referred to as a "unit gate," a "unit drain" and a "unit source." In each of the system transistors 9, all of the third gates TG of the single or the plurality of unit transistors 10 are electrically connected to the second gate SG, all of the third drains TD are electrically connected to the second drain SD, and all of the third sources TS are electrically connected to the second source SS. That is, the third gate TG, the third drain TD and the third source TS of the single or the plurality of unit transistors 10 which was systematized configure the second gate SG, the second drain SD and the second source SS of each system transistor 9, respectively.

Electrical characteristics of each system transistors 9 are adjusted according to electrical specifications of the main transistor 8 to be achieved. The electrical specifications of the main transistor 8 include, for example, a channel utilization rate, an on-resistance and a switching waveform, etc. Hereinafter, the term, "substantially equal" in this description includes a case that a value to be measured completely matches a value to be compared and also includes a case that a value to be measured is within a range of not less than 0.9 times and not more than 1.1 times a value to be compared.

The n-number of the system transistors 9 may have a substantially equal gate threshold voltage or may have different gate threshold voltages. The n-number of the system transistors 9 may have a channel area that is substantially equal or may have a channel area that is different for each unit area. That is, the n-number of the system transistors 9 may have substantially similar on-resistance characteristics or may have different on-resistance characteristics.

The plurality of unit transistors 10 may have a substantially equal gate threshold voltage or may have different gate threshold voltages. The plurality of unit transistors 10 may have a substantially equal channel area or may have a different channel area for each unit area. That is, the plurality of unit transistors 10 may have substantially similar on-resistance characteristics or may have different on-resistance characteristics. Electrical characteristics of each system transistor 9 are precisely adjusted by adjusting the number of the plurality of unit transistors 10, a gate threshold voltage, a channel area, etc.

With reference to FIG. 3 and FIG. 4, the semiconductor device 1 includes a control IC 11 (Control Integrated Circuit) as an example of a control circuit which is formed in the second device region 7. The control IC 11 configures an IPD (Intelligent Power Device) together with the main transistor 8. The IPD may be referred to as an "IPM (Intelligent Power Module)." The control IC 11 includes multiple types of functional circuits which realize various functions in response to an electric signal input from the outside. The multiple types of functional circuits include a gate control circuit 12 and an active clamp circuit 13. Although not shown, the control IC 11 may include multiple types of abnormality detection circuits which detect abnormalities (for example, overvoltage, overheating, etc.) of the main transistor 8, the functional circuit, etc.

The gate control circuit 12 is electrically connected to the first gates FG of the main transistor 8 and drives and controls the main transistor 8 in response to an electric signal from the outside. Specifically, the gate control circuit 12 is configured so as to be electrically connected to the n-number of the first gates FG of the main transistor 8 (second gates SG of n number of the system transistors 9) and individually control the n-number of the first gates FG (n-number of system transistors 9).

The active clamp circuit 13 is electrically connected to the main transistor 8 and the gate control circuit 12. The active clamp circuit 13 is configured so as to protect the main transistor 8 from a back electromotive force by restricting (clamping) an output voltage VOUT when the back electromotive force is input into the main transistor 8 due to an energy accumulated in the inductive load L. That is, the active clamp circuit 13 restricts the output voltage VOUT until the back electromotive force is consumed by making the main transistor 8 perform an active clamp operation when the back electromotive force is input.

Specifically, the active clamp circuit 13 is electrically connected to one or a plurality (not all) of the first gates FG and the first drain FD. The active clamp circuit 13 controls some of the system transistors 9 so as to be in an on state and controls the rest of the system transistors 9 so as to be in an off state during an active clamp operation. That is, the active clamp circuit 13 raises an on-resistance of the main transistor 8 during the active clamp operation and protects the main transistor 8 from the back electromotive force. The active clamp circuit 13 may be configured so that when the first source FS of the main transistor 8 is at a voltage not more than a predetermined voltage (for example, a predetermined negative voltage), on/off control of the n-number of the system transistors 9 is performed.

With reference to FIG. 2, the semiconductor device 1 includes an interlayer insulating layer 14 which covers the first main surface 3. The interlayer insulating layer 14 collectively covers the first device region 6 and the second device region 7. In this embodiment, the interlayer insulating layer 14 is constituted of a multi-layer wiring structure having a laminated structure in which a plurality of insulating layers and a plurality of wiring layers are alternately laminated. Each of the insulating layers includes at least one of a silicon oxide film and a silicon nitride film. Each of the wiring layers may include at least one among a pure Al layer (Al layer with purity of not less than 99%), a Cu layer (Cu layer with purity of not less than 99%), an AlCu alloy layer, an AlSiCu alloy layer and an AlSi alloy layer.

With reference to FIG. 2 to FIG. 6, the semiconductor device 1 includes an n-number of gate wirings 15 as an example of a control wiring formed anywhere above the first main surface 3. The n-number of the gate wirings 15 are constituted of the n-number of wiring layers selectively routed inside the interlayer insulating layer 14. The n-number of the gate wirings 15 are electrically connected to the n-number of the first gates FG of the main transistor 8 in a one-to-one correspondence in a state electrically independent of each other in the first device region 6. The n-number of the gate wirings 15 are each electrically connected to the control IC 11 (gate control circuit 12) in the second device region 7. The n-number of the gate wirings 15 individually transmit the n-number of the gate signals G generated by the control IC 11 (gate control circuit 12) to the n-number of the first gates FG of the main transistor 8.

That is, n-number of the gate wirings 15 are each electrically connected to the third gate TG of one or the plurality of unit transistors 10 which are to be systematized as an individually controlled object from an assembly constituted of the plurality of unit transistors 10. The n-number of the gate wirings 15 may include one or the plurality of gate wirings 15 electrically connected to one unit transistor 10 which is to be systematized as an individually controlled object. Also, the n-number of the gate wirings 15 may include one or the plurality of gate wirings 15 which connect in parallel the plurality of unit transistors 10 which are to be systematized as an individually controlled object.

With reference to FIG. 1 and FIG. 2, the semiconductor device 1 includes a plurality of terminal electrodes 16 to 21. In FIG. 1, the plurality of terminal electrodes 16 to 21 are indicated by hatching. The number, the arrangement and planar shape of the plurality of terminal electrodes 16 to 21 are adjusted to an arbitrary mode according to specifications of the main transistor 8 and specifications of the control IC 11 and not limited to a mode shown in FIG. 1. In this embodiment, the plurality of terminal electrodes 16 to 21 include a drain terminal 16 (power terminal VBB), a source terminal 17 (output terminal OUT), an input terminal 18, a ground terminal 19, an enable terminal 20 and a sense terminal 21.

The drain terminal 16 is electrically connected to the first drain FD of the main transistor 8 and the control IC 11. The drain terminal 16 transmits a power voltage VB to various circuits such as the first drain FD of the main transistor 8 and the control IC 11. The source terminal 17 is electrically connected to the first source FS of the main transistor 8 and the control IC 11. The source terminal 17 transmits to the outside the output current TOUT generated by the main transistor 8.

The input terminal 18 transmits an input voltage which drives the control IC 11. The ground terminal 19 transmits a ground voltage GND. The enable terminal 20 transmits an electric signal for enabling or disabling some of or all of functions of the control IC 11. The sense terminal 21 transmits an electric signal for detecting abnormalities of the main transistor 8 and the control IC 11, etc.

The drain terminal 16 directly covers the second main surface 4 of the semiconductor chip 2 and is electrically connected to the second main surface 4. The drain terminal 16 may include at least one among a Ti layer, an Ni layer, an Au layer, an Ag layer and an Al layer. The drain terminal 16 may have a laminated structure in which at least two of the Ti layer, the Ni layer, the Au layer, the Ag layer and the Al layer are laminated in an arbitrary mode.

The source terminal 17, the input terminal 18, the ground terminal 19, the enable terminal 20 and the sense terminal 21 are arranged on the interlayer insulating layer 14. The source terminal 17 is arranged above the first device region 6 in the first main surface 3. The input terminal 18, the ground terminal 19, the enable terminal 20 and the sense terminal 21 are each arranged above a region of the first main surface 3 outside the first device region 6 (specifically, the second device region 7).

The terminal electrodes 17 to 21 may include at least one among a pure Al layer, a pure Cu layer, an AlCu alloy layer, an AlSiCu alloy layer and an AlSi alloy layer. A plated layer may be formed on an outer surface of each of the terminal electrodes 17 to 21. The plated layer may include at least one among an Ni layer, a Pd layer and an Au layer.

Figure 7A:
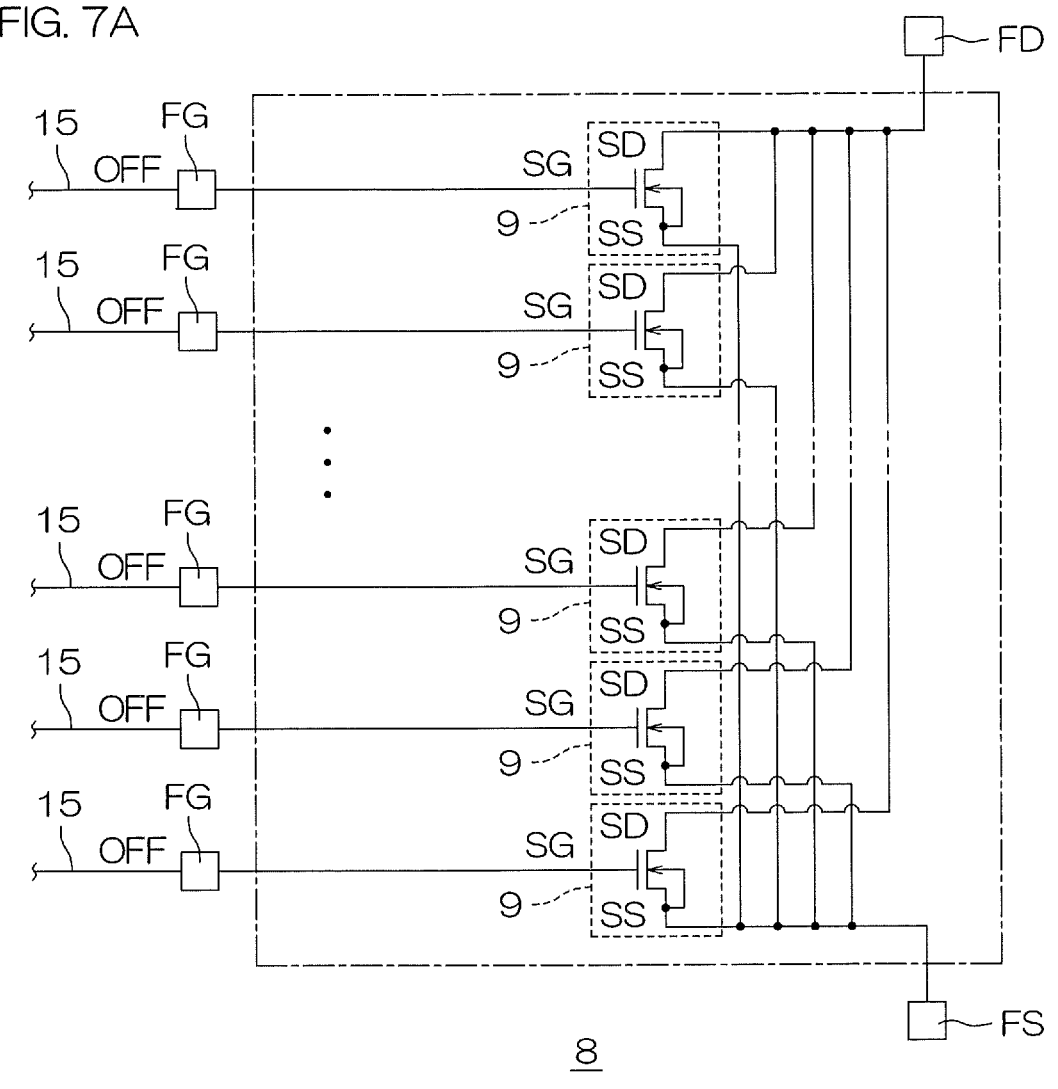
FIG. 7A is a circuit diagram which shows an operation example of the main transistor.
Figure 7B:
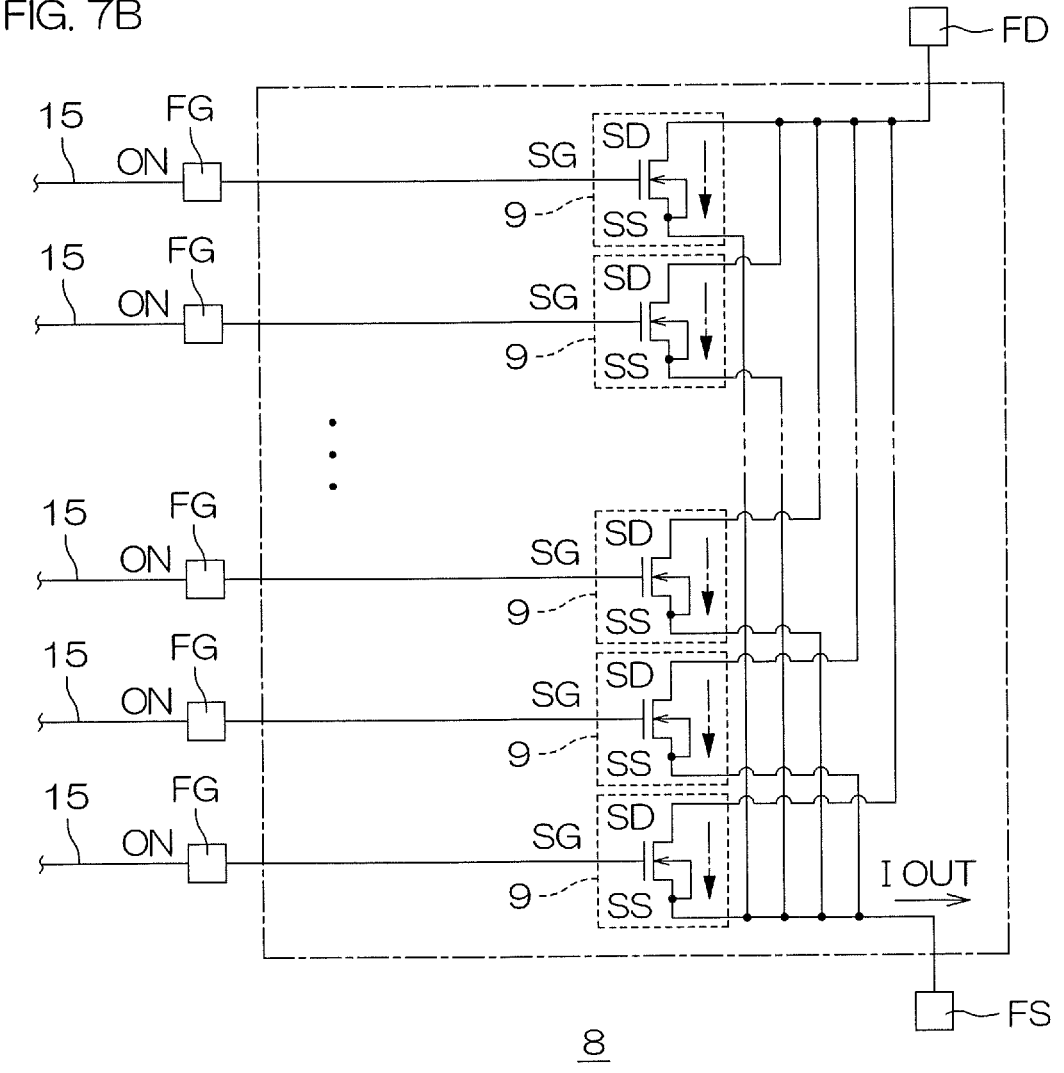
FIG. 7B is a circuit diagram which shows an operation example of the main transistor.
Figure 7C:
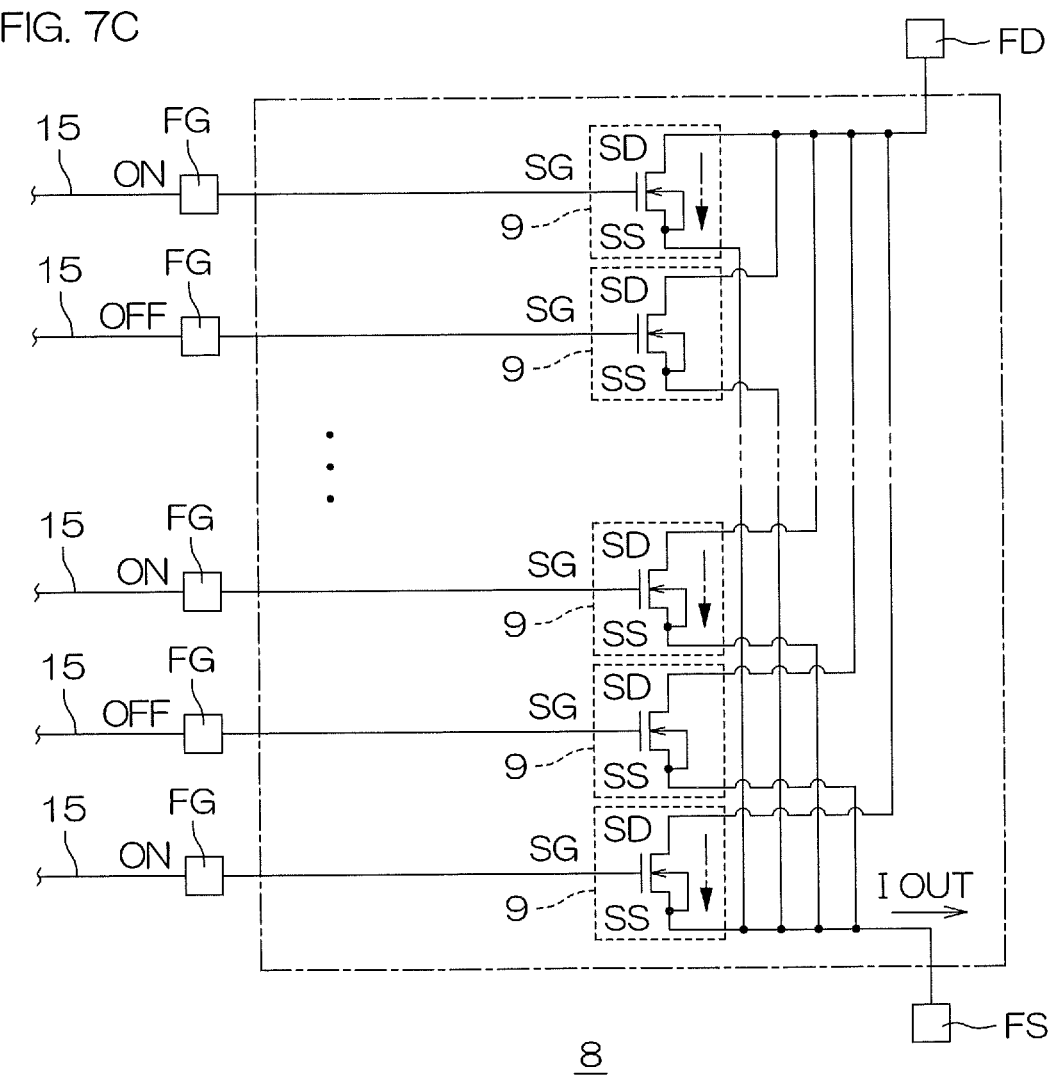
FIG. 7C is a circuit diagram which shows an operation example of the main transistor.

FIG. 7A to FIG. 7C each correspond to FIG. 5 and are a circuit diagram for describing operation examples of the main transistor 8. With reference to FIG. 7A, the gate signal G (that is, off signal) less than the gate threshold voltage is input into all of the n-number of the gate wirings 15. This control is to be applied during an off operation of the main transistor 8. Thereby, in the main transistor 8, all of the system transistors 9 are turned into an off state. The main transistor 8 is thereby turned into an off state.

With reference to FIG. 7B, the gate signal G which is not less than the gate threshold voltage (that is, on signal) is input into all of the n-number of the gate wirings 15. This control is to be applied during a normal operation of the main transistor 8. Thereby, as a result of the n-number of the system transistors 9 being turned into an on state, the main transistor 8 is turned into an on state. The main transistor 8 generates the output current TOUT including the n-number of the system currents generated by the n-number of the system transistors 9. In this case, the main transistor 8 is relatively increased in channel utilization rate and relatively decreased in on-resistance.

With reference to FIG. 7C, the gate signal G which is not less than the gate threshold voltage (that is, on signal) is to be input into an x-number ($1 \leq x < n$) of the gate wirings 15, and the gate signal G which is less than the gate threshold voltage (that is, off signal) is to be input into the (n-x)-number of the gate wirings 15. This control is to be applied during the active clamp operation of the main transistor 8. Thereby, as a result of the x-number of the system transistors 9 being turned into an on state and the (n-x)-number of the system transistors 9 being turned into an off state, the main transistor 8 is turned into an on state in such a state that some of the current paths are made conductive and some of the current paths are blocked.

The main transistor 8 generates the output current TOUT including the x-number of the system currents generated by the x-number of the system transistors 9. In other words, the main transistor 8 generates the output current IOUT including the x-number of the system currents constituted of an absolute value exceeding 0 A and the (n-x)-number of the system currents constituted of 0 A. In this case, the main transistor 8 is relatively decreased in channel utilization rate and relatively increased in on-resistance.

As described above, in the semiconductor device 1, the n-system main transistor 8 is configured so that an on-resistance (channel utilization rate) is changed by individual controls of the n-number of the system transistors 9. Specifically, the main transistor 8 is controlled so that an on-resistance during the active clamp operation is made different from an on-resistance during the normal operation by individual controls of the n-number of the system transistors 9. More specifically, the main transistor 8 is controlled so that an on-resistance during the active clamp operation exceeds an on-resistance during the normal operation by individual controls of the n-number of the system transistors 9.

Figure 8:
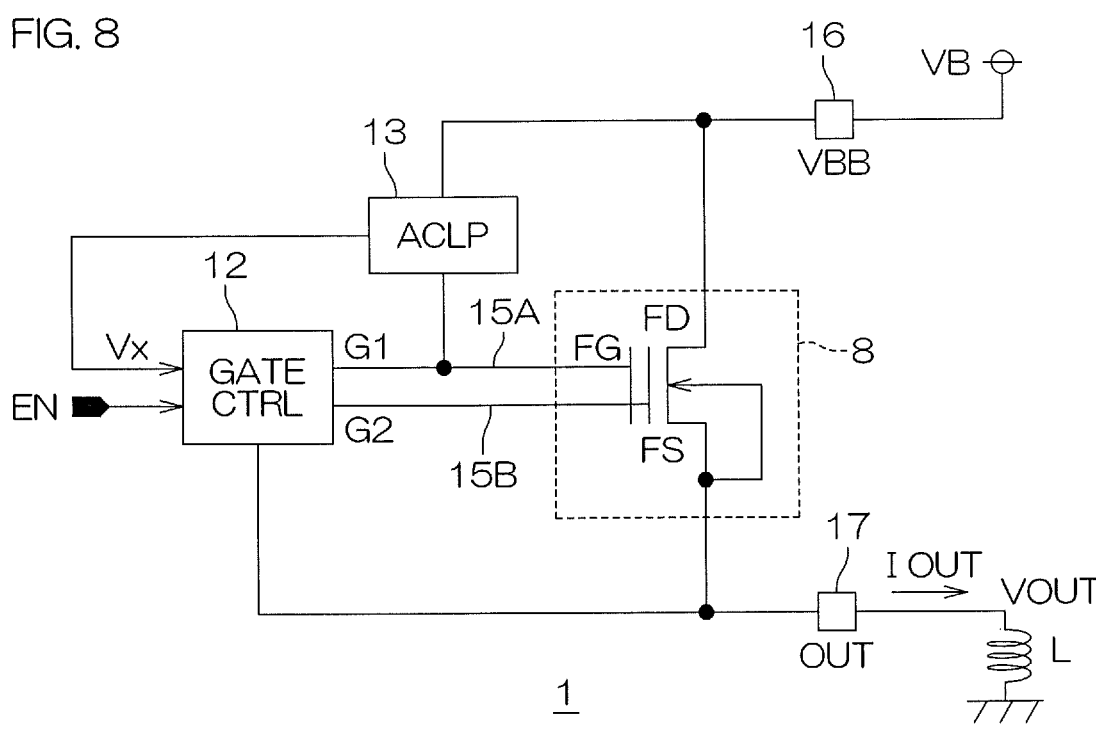
FIG. 8 is a block circuit diagram which shows a configuration example of an electrical arrangement of the semiconductor device shown in FIG. 1 (=a configuration example to which a two-system main transistor is applied).
Figure 9:
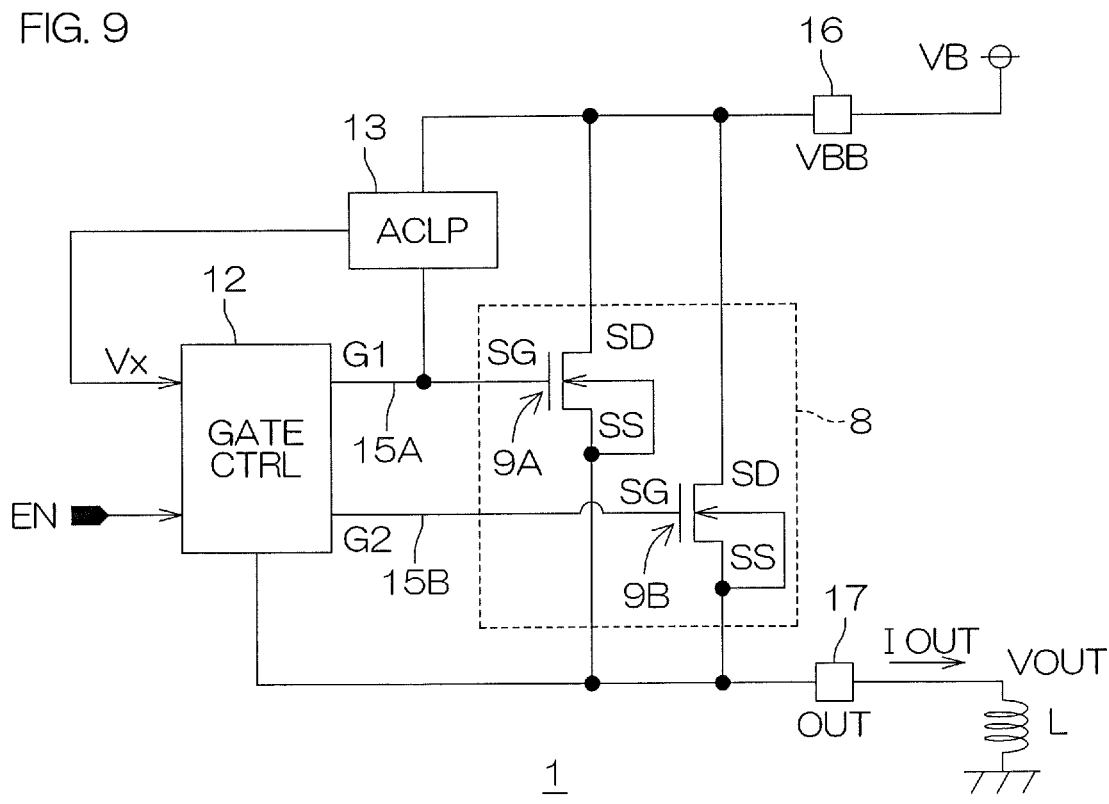
FIG. 9 is a circuit diagram which shows a configuration example of the block circuit diagram shown in FIG. 8.
Figure 10:
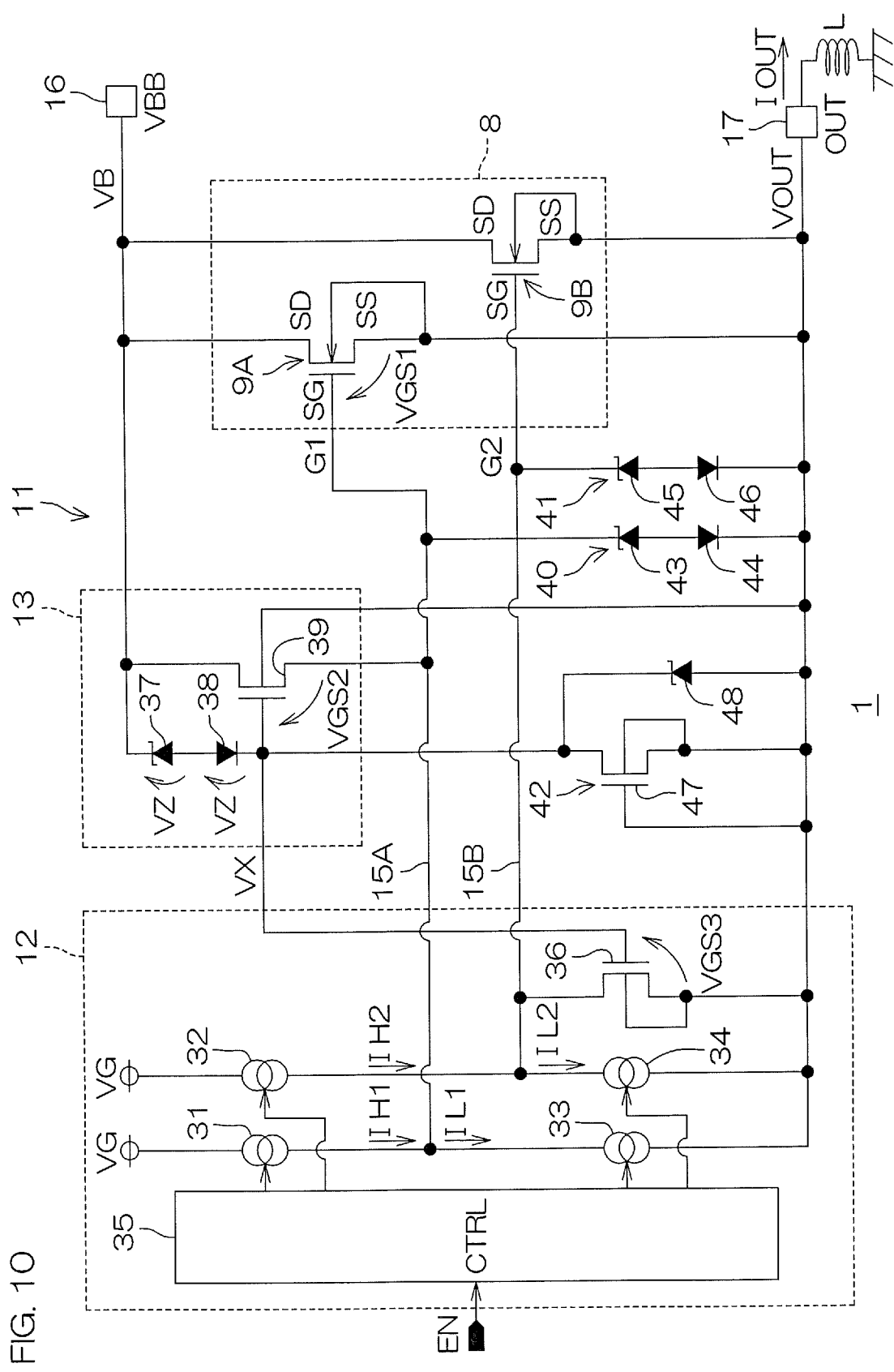
FIG. 10 is a circuit diagram which shows the configuration example of the block circuit diagram shown in FIG. 9.

FIG. 8 is a block circuit diagram which shows a configuration example of an electrical arrangement of the semiconductor device 1 in FIG. 1 (=configuration example to which 2-system main transistor 8 is applied). FIG. 10 is a circuit diagram which shows the configuration example of the block circuit diagram shown in FIG. 9. Each of FIG. 8 to FIG. 10 is also a circuit diagram which shows a main portion of the control IC 11. FIG. 8 to FIG. 10 show an example where the inductive load L is connected to the source terminal 17.

The 2-system (n=2) main transistor 8 includes a first system transistor 9A and a second system transistor 9B. The two second gates SG of the first and second system transistors 9A and 9B configure the two first gates FG of the main transistor 8. The second drains SD of the first and second system transistors 9A and 9B are each electrically connected to the drain terminal 16. The second sources SS of the first and second system transistors 9A and 9B are each electrically connected to the source terminal 17.

The 2-system main transistor 8 is controlled in a first operation mode, a second operation mode and a third operation mode. In the first operation mode, the first and second system transistors 9A and 9B are controlled so as to be in an off state at the same time. In the second operation mode, the first and second system transistors 9A and 9B are controlled so as to be in an on state at the same time. In the third operation mode, only one of the first and second system transistors 9A and 9B is controlled so as to be in an on state. In this embodiment, in the third operation mode, the first system transistor 9A is controlled so as to be in an on state and the second system transistor 9B is controlled so as to be in an off state.

The two gate wirings 15 include a first gate wiring 15A and a second gate wiring 15B. The first gate wiring 15A is electrically connected to the second gate SG of the first system transistor 9A. The second gate wiring 15B is electrically connected to the second gate SG of the second system transistor 9B. In the following description, "a state that is electrically connected to the first gate wiring 15A" includes "a state that is electrically connected to the second gate SG of the first system transistor 9A." Also, "a state that is electrically connected to the second gate wiring 15B" includes "a state that is electrically connected to the second gate SG of the second system transistor 9B."

The gate control circuit 12 is electrically connected to the first and second gate wirings 15A and 15B. The gate control circuit 12 generates a first gate signal G1 and a second gate signal G2 in response to an enable signal EN and individually outputs the first and second gate signals G1 and G2 to the first and second gate wirings 15A and 15B. Specifically, in an enabled state that the enable signal EN is at a high level (EN=H), the gate control circuit 12 generates the first and second gate signals G1 and G2 which control both of the first and second system transistors 9A and 9B so as to be in an on state. In a disabled state that the enable signal EN is at a low level (EN=L), the gate control circuit 12 generates the first and second gate signals G1 and G2 which control both of the first and second system transistors 9A and 9B so as to be in an off state.

In this embodiment, the gate control circuit 12 includes a first current source 31, a second current source 32, a third current source 33, a fourth current source 34, a controller 35 and an n channel type drive MISFET 36. Although not shown specifically, the first current source 31, the second current source 32, the third current source 33, the fourth current source 34, the controller 35 and the drive MISFET 36 are each formed in the second device region 7.

The first current source 31 generates a first source current IH1. The first current source 31 is electrically connected to an application end of a boosted voltage VG (=charge pump output) and the first gate wiring 15A. The second current source 32 generates a second source current IH2. The second current source 32 is electrically connected to the application end of boosted voltage VG and the second gate wiring 15B. The third current source 33 generates a first sink current ILL The third current source 33 is electrically connected to the first gate wiring 15A and the source terminal 17. The fourth current source 34 generates a second sink current IL2. The fourth current source 34 is electrically connected to the second gate wiring 15B and the source terminal 17.

The controller 35 is electrically connected to the first to fourth current sources 31 to 34. In an enabled state (EN=H), while controlling the first and second current sources 31 and 32 so as to be in an on state, the controller 35 controls the third and fourth current sources 33 and 34 so as to be in an off state. Thereby, the first source current IH1 is output to the first gate wiring 15A, and the second source current IH2 is output to the second gate wiring 15B. In a disabled state (EN=L), while controlling the first and second current sources 31 and 32 so as to be in an off state, the controller 35 controls the third and fourth current sources 33 and 34 so as to be in an on state. Thereby, the first sink current IL1 is drawn from the first gate wiring 15A, and the second sink current IL2 is drawn from the second gate wiring 15B.

The drive MISFET 36 is electrically connected to the second gate wiring 15B and the source terminal 17. The drive MISFET 36 includes a drain, a source, a gate and a back gate. The drain of the drive MISFET 36 is electrically connected to the second gate wiring 15B. The source of the drive MISFET 36 is electrically connected to the source terminal 17. The back gate of the drive MISFET 36 is electrically connected to the source terminal 17.

The active clamp circuit 13 is connected between a drain and a gate of the first system transistor 9A. The active clamp circuit 13 is configured so as to control the first system transistor 9A in an on state and control the second system transistor 9B in an off state in collaboration with the gate control circuit 12, when the first source FS (source terminal 17) of the main transistor 8 is at a negative voltage.

Specifically, the active clamp circuit 13 has an internal node voltage Vx which is electrically connected to the gate control circuit 12. The active clamp circuit 13 generates the first and second gate signals G1 and G2 which control both of the first system transistor 9A so as to be in an on state and controls the second system transistor 9B so as to be in an off state by controlling the gate control circuit 12 via the internal node voltage Vx.

More specifically, the active clamp circuit 13 generates the first and second gate signals G1 and G2 which control the first system transistor 9A so as to be in an on state and control the second system transistor 9B so as to be in an off state by controlling the gate control circuit 12 via the internal node voltage Vx after being shifted from the enabled state (EN=H) to the disabled state (EN=L) and before the main transistor 8 is shifted to an active clamp operation.

Specifically, that before the main transistor 8 is shifted to an active clamp operation means, that before the output voltage VOUT is clamped. The second system transistor 9B is controlled so as to be in an off state by the second gate signal G2 which is to be fixed at the output voltage VOUT. That is, a gate-to-source portion of the second system transistor 9B is short-circuited.

The active clamp circuit 13 limits a drain-source voltage (=VBB−VOUT) of the main transistor 8 to a voltage not more than a clamp voltage Vclp. In this embodiment, the second system transistor 9B is not involved in the active clamp operation. Therefore, the active clamp circuit 13 is not connected to the second system transistor 9B.

In this embodiment, the active clamp circuit 13 includes a Zener diode array 37, a diode array 38 and an n channel type clamp MISFET 39. Although not shown specifically, the Zener diode array 37, the diode array 38 and the clamp MISFET 39 are each formed in the second device region 7.

The Zener diode array 37 is constituted of a series circuit including a plurality (for example, eight) of Zener diodes connected in series in a forward direction. The number of the Zener diodes is arbitrary and the Zener diode may be one. The Zener diode array 37 includes a cathode and an anode. The cathode of the Zener diode array 37 is electrically connected to the drain terminal 16 and the second drains SD of the first and second system transistors 9A and 9B.

The diode array 38 is constituted of a series circuit including a plurality (for example, three) of pn junction diodes connected in series in a forward direction. The number of the pn junction diodes is arbitrary and the Zener diode may be one. The diode array 38 includes a cathode and an anode. The anode of the diode array 38 is connected to the anode of the Zener diode array 37 in a reverse biased manner.

The clamp MISFET 39 includes a drain, a source, a gate and a back gate. The drain of the clamp MISFET 39 is electrically connected to the drain terminal 16 and the second drains SD of the first and second system transistors 9A and 9B. The source of the clamp MISFET 39 is electrically connected to the first gate wiring 15A. The gate of the clamp MISFET 39 is electrically connected to the cathode of the diode array 38. The back gate of the clamp MISFET 39 is electrically connected to the source terminal 17.

The internal node voltage Vx of the active clamp circuit 13 is electrically connected to the gate of the drive MISFET 36. The active clamp circuit 13 controls the drive MISFET 36 so as to be in an on state or in an off state according to the internal node voltage Vx. The internal node voltage Vx may be an arbitrary voltage inside the active clamp circuit 13. The internal node voltage Vx may be a gate voltage of the clamp MISFET 39 or may be an anode voltage of any one of the pn junction diodes of the diode array 38.

In this embodiment, the control IC 11 includes a first protection circuit 40, a second protection circuit 41 and a third protection circuit 42. The first to third protection circuits 40 to 42 are each arranged as an example of an electrostatic breakdown protection circuit which protects various circuits from an overvoltage such as static electricity.

The first protection circuit 40 is electrically connected to the first gate wiring 15A and the source terminal 17 and protects the first system transistor 9A. The first protection circuit 40 is constituted of a diode pair which includes a first Zener diode 43 and a first diode 44 connected in a reverse biased manner. The first Zener diode 43 includes a cathode and an anode. The cathode of the first Zener diode 43 is connected to the first gate wiring 15A. The first diode 44 includes a cathode and an anode. The anode of the first diode 44 is connected to the anode of the first Zener diode 43. The cathode of the first diode 44 is connected to the source terminal 17.

The second protection circuit 41 is electrically connected to the second gate wiring 15B and the source terminal 17 and protects the second system transistor 9B. The second protection circuit 41 is constituted of a diode pair which includes a second Zener diode and a second diode 46 connected in a reverse biased manner. The second Zener diode 45 includes a cathode and an anode. The cathode of the second Zener diode 45 is connected to the second gate wiring 15B. The second diode 46 includes a cathode and an anode. The anode of the second diode 46 is connected to the anode of the second Zener diode 45. The cathode of the second diode 46 is connected to the source terminal 17.

The third protection circuit 42 is electrically connected to the active clamp circuit 13 and the source terminal 17 and protects the active clamp circuit 13. The third protection circuit 42 is constituted of a parallel circuit which includes an n channel-type protection MISFET 47 and a third Zener diode 48. The protection MISFET 47 includes a drain, a source, a gate and a back gate. The drain of the protection MISFET 47 is connected to a gate of the clamp MISFET 39. The source, the gate and the back gate of the protection MISFET 47 are connected to the source terminal 17. The third Zener diode 48 includes a cathode and an anode. The cathode of the third Zener diode 48 is connected to the drain of the protection MISFET 47. The anode of the third Zener diode 48 is connected to the source terminal 17.

Figure 11:
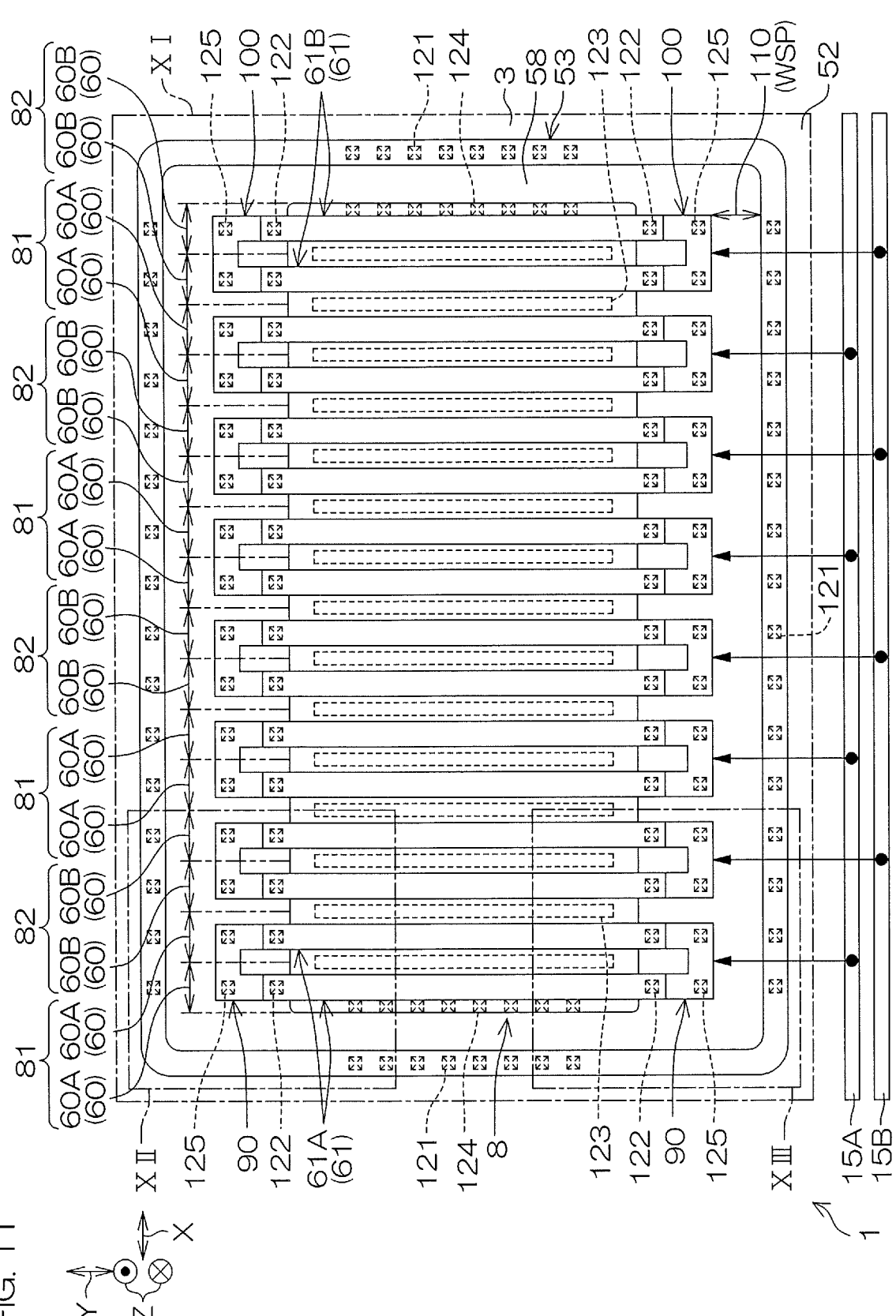
FIG. 11 is an enlarged view of a region X shown in FIG. 3 and a plan view which shows a layout example of the main transistor shown in FIG. 8.
Figure 12:
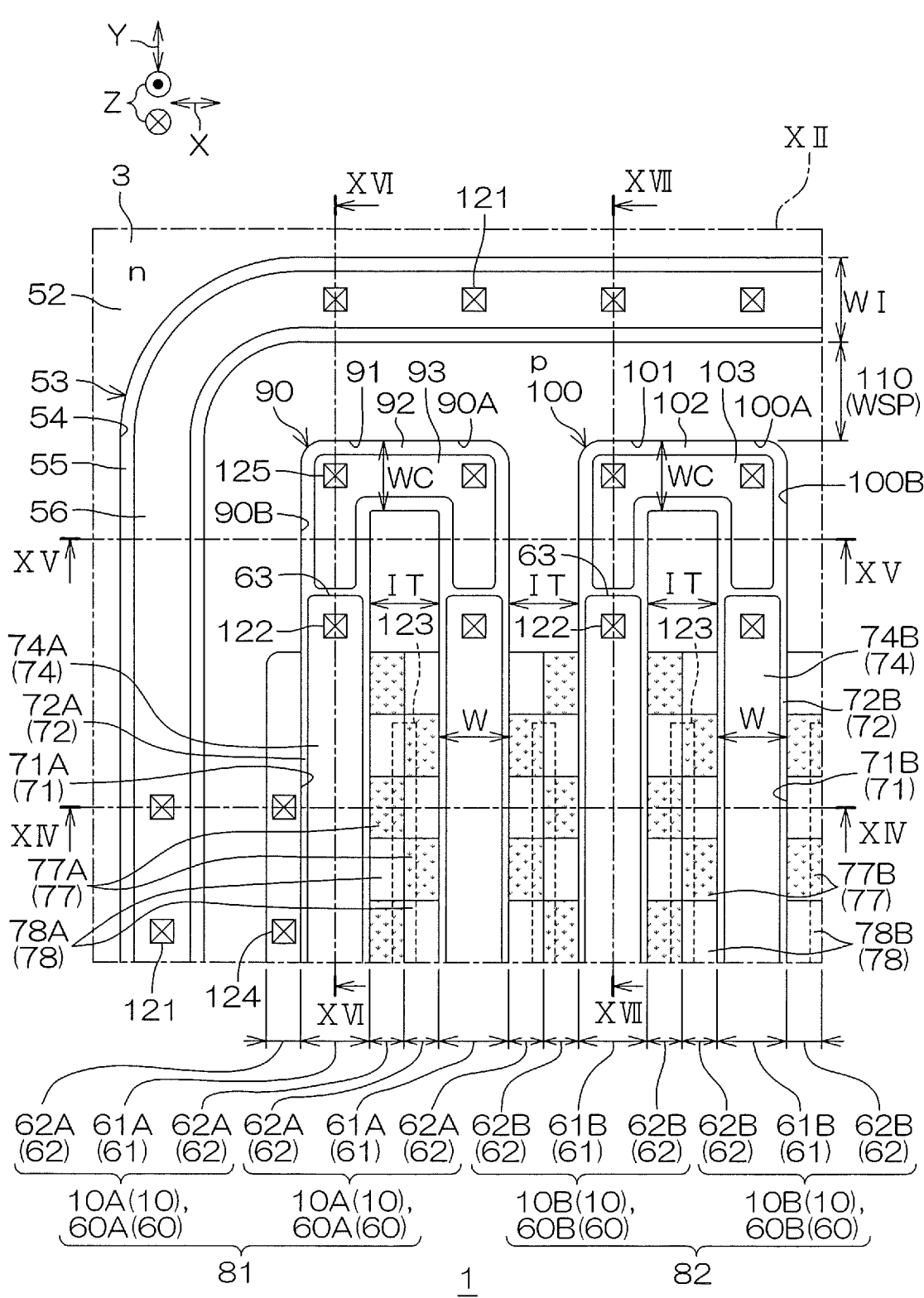
FIG. 12 is an enlarged view of a region XII shown in FIG. 11.
Figure 13:
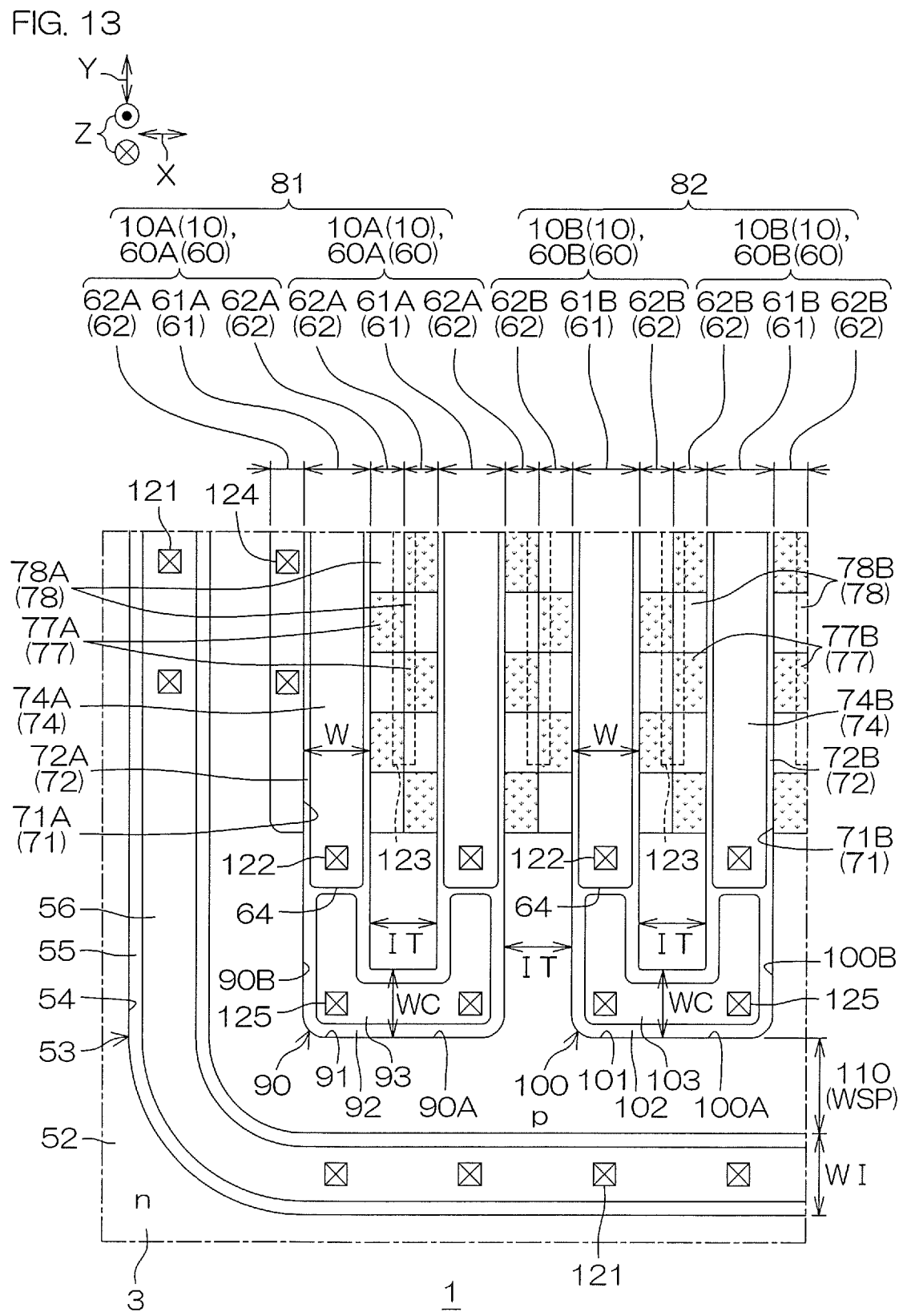
FIG. 13 is an enlarged of a region XIII shown in FIG. 11.
Figure 14:
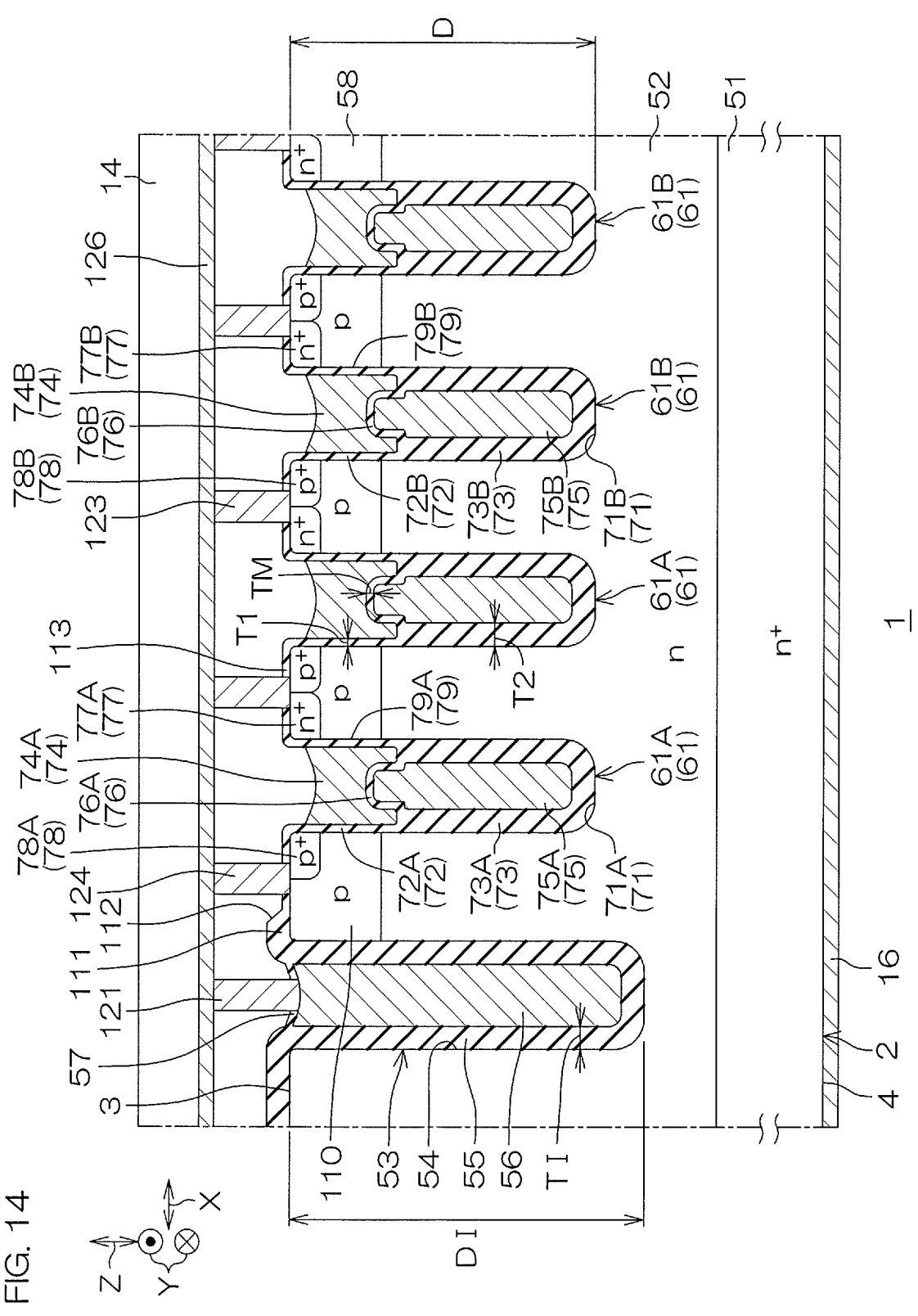
FIG. 14 is a cross-sectional view taken along line XIV-XIV shown in FIG. 12.
Figure 15:
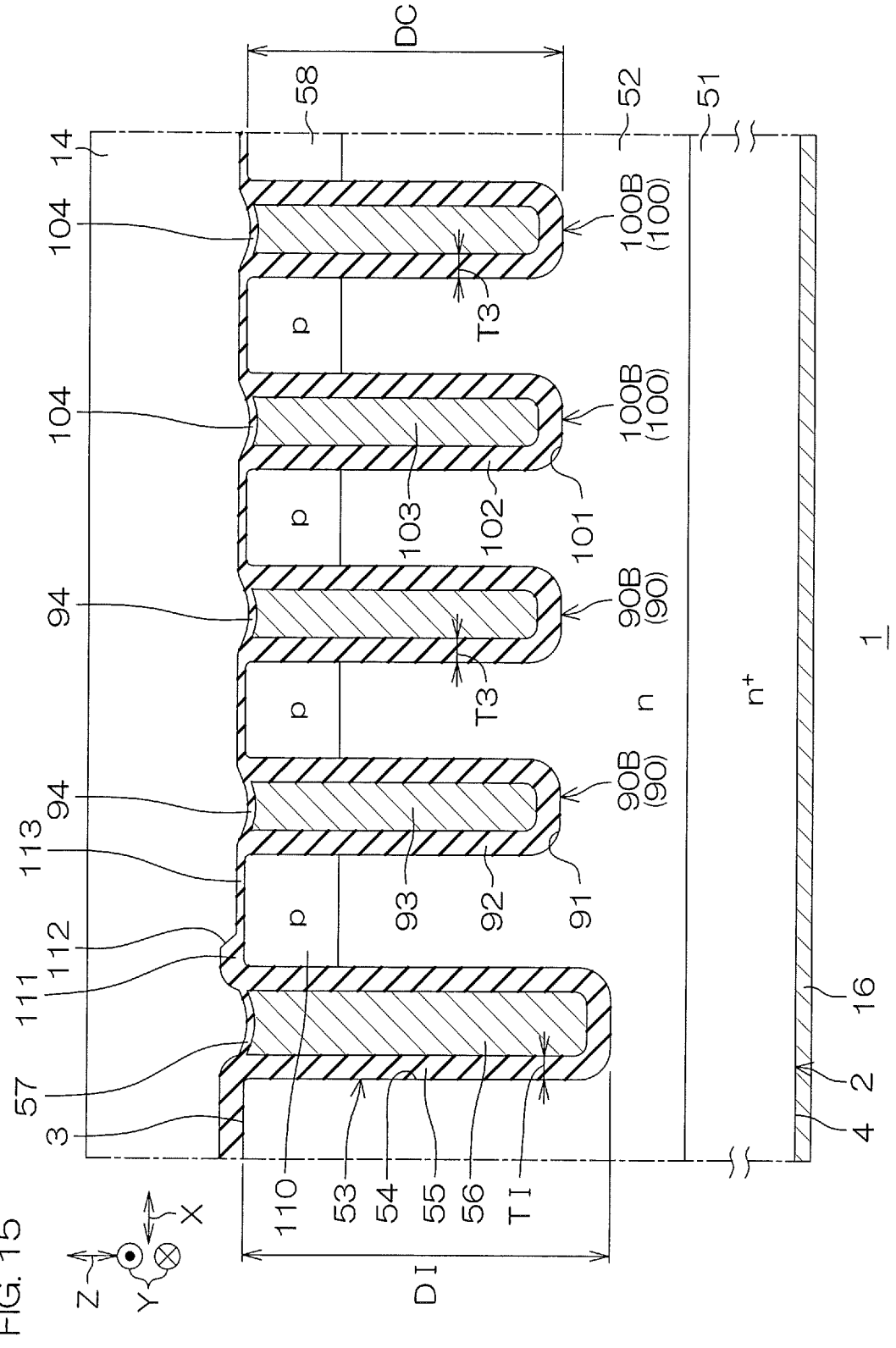
FIG. 15 is a cross-sectional view taken along line XV-XV shown in FIG. 12.
Figure 16:
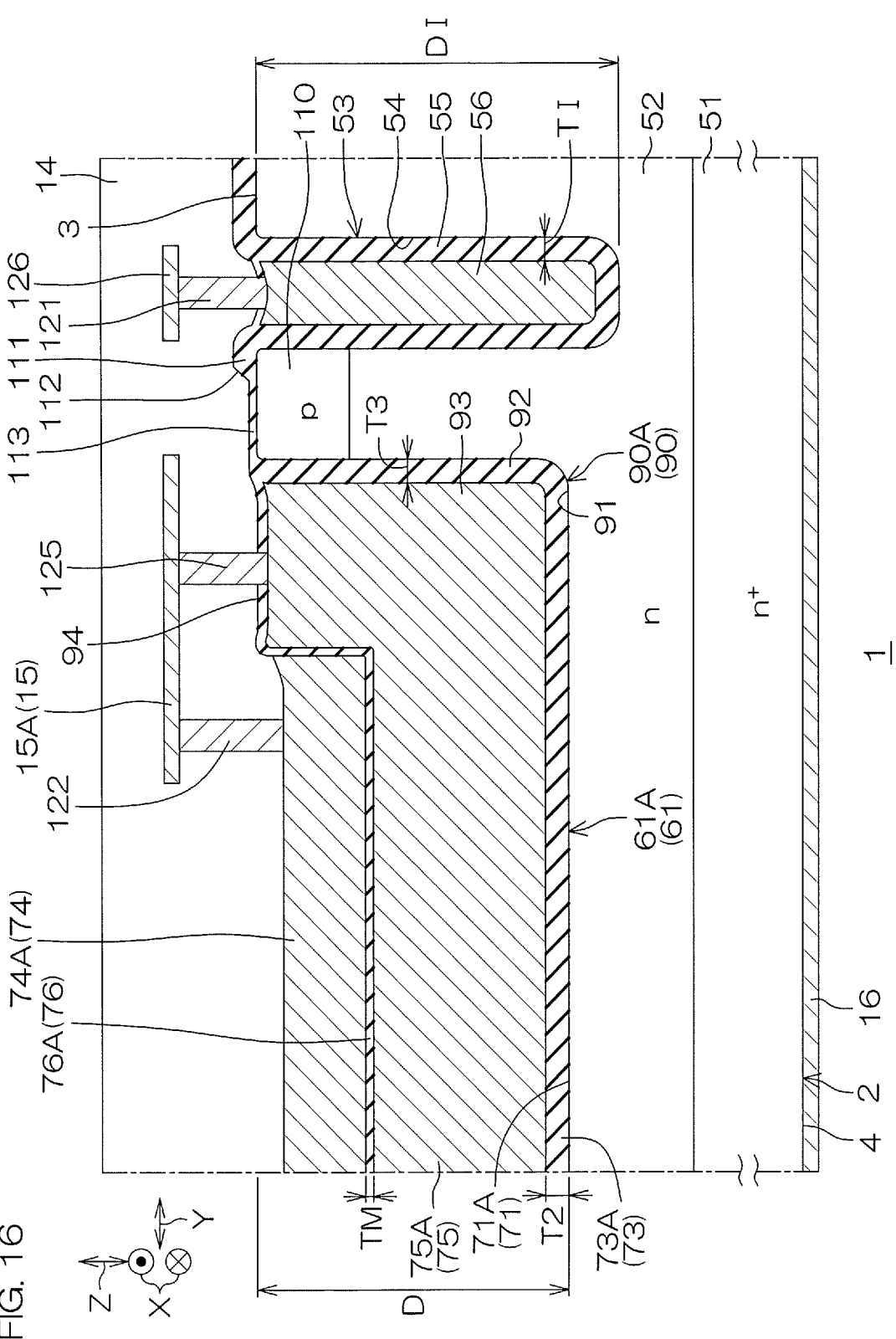
FIG. 16 is a cross-sectional view taken along line XVI-XVI shown in FIG. 12.
Figure 17:
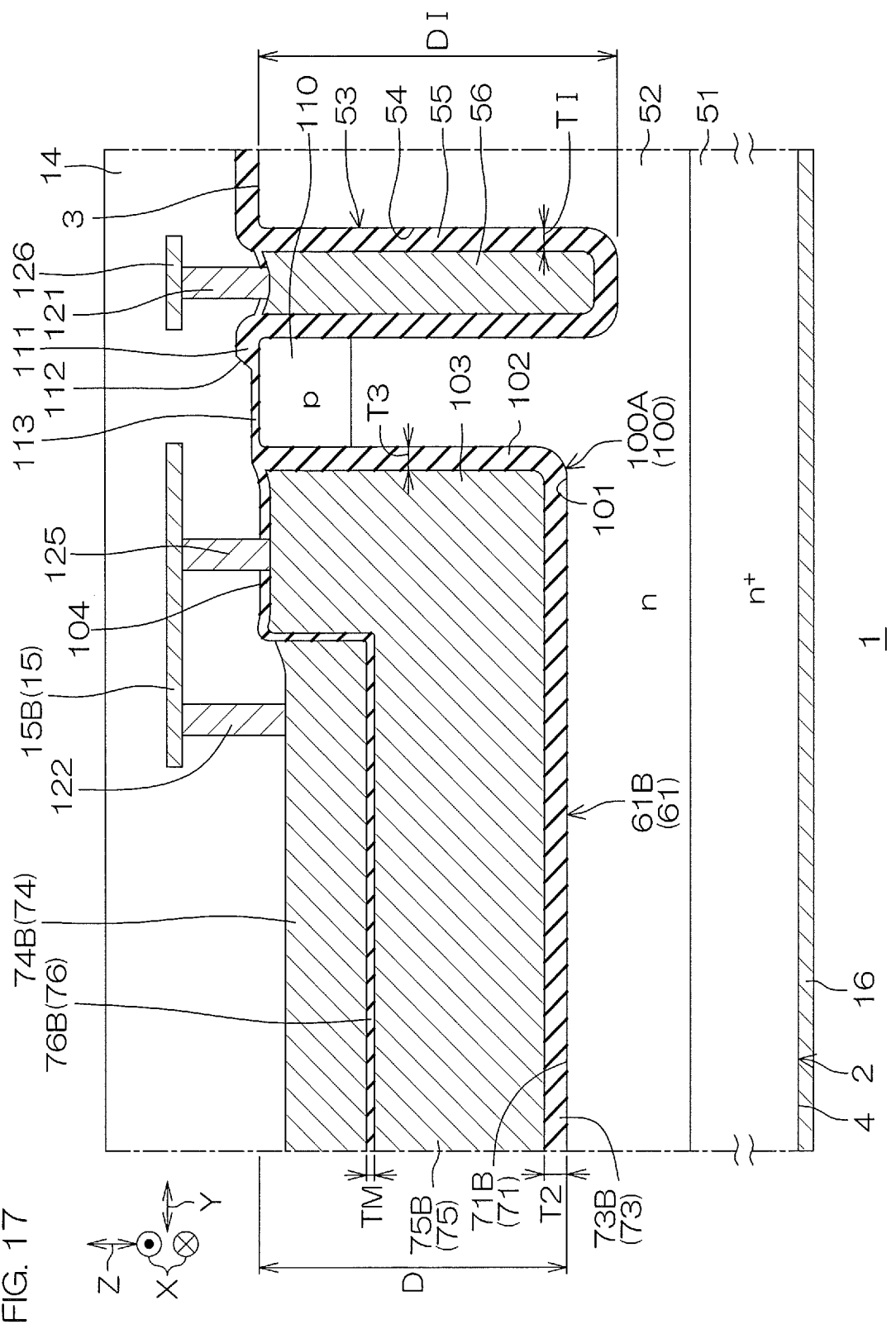
FIG. 17 is a cross-sectional view taken along line XVII-XVII shown in FIG. 12.

FIG. 11 is an enlarged view of the region XI shown in FIG. 3 and a plan view which shows a layout example of the main transistor 8 in FIG. 8. FIG. 12 is an enlarged view of the region XII shown in FIG. 11. FIG. 13 is an enlarged view of the region XIII shown in FIG. 11. FIG. 14 is a cross-sectional view taken along line XIV-XIV shown in FIG. 12. FIG. 15 is a cross-sectional view taken along line XV-XV shown in FIG. 12. FIG. 16 is a cross-sectional view taken along line XVI-XVI shown in FIG. 12. FIG. 17 is a cross-sectional view taken along line XVII-XVII shown in FIG. 12.

With reference to FIG. 11 to FIG. 17, the semiconductor device 1 includes an n-type (first conductive type) first semiconductor region 51 which is formed in a surface layer portion of the second main surface 4 of the semiconductor chip 2. The first semiconductor region 51 forms the first drain FD of the main transistor 8. The first semiconductor region 51 may be referred to as a "drain region." The first semiconductor region 51 is formed in an entire area of the surface layer portion of the second main surface 4 and exposed from the second main surface 4 and the first to fourth side surfaces 5A to 5D.

An n-type impurity concentration of the first semiconductor region 51 may be not less than $1 \times 10^{18}$ cm$^{-3}$ and not more than $1 \times 10^{21}$ cm$^{-3}$. A thickness of the first semiconductor region 51 may be not less than 10 μm and not more than 450 The thickness of the first semiconductor region 51 is preferably not less than 50 μm and not more than 150 μm. In this embodiment, the first semiconductor region 51 is formed of an n-type semiconductor substrate (Si substrate).

The semiconductor device 1 includes an n-type second semiconductor region 52 which is formed in a surface layer portion of the first main surface 3 of the semiconductor chip 2. The second semiconductor region 52 forms the first drain FD of the main transistor 8 together with the first semiconductor region 51. The second semiconductor region 52 may be referred to as a "drift region." The second semiconductor region 52 is formed in an entire area of the surface layer portion of the first main surface 3 so as to be electrically connected to the first semiconductor region 51 and exposed from the first main surface 3 and the first to fourth side surfaces 5A to 5D.

The second semiconductor region 52 has an n-type impurity concentration less than the n-type impurity concentration of the first semiconductor region 51. The n-type impurity concentration of the second semiconductor region 52 may be not less than $1 \times 10^{15}$ cm$^{-3}$ and not more than $1 \times 10^{18}$ cm$^{-3}$. The second semiconductor region 52 has a thickness less than the thickness of the first semiconductor region 51. The thickness of the second semiconductor region 52 may be not less than 1 μm and not more than 25 The thickness of the second semiconductor region 52 is preferably not less than 5 μm and not more than 15 μm. In this embodiment, the second semiconductor region 52 is formed of an n-type epitaxial layer (Si epitaxial layer).

The semiconductor device 1 includes a trench separation structure 53 as an example of a region separation structure which demarcates the first device region 6 in the first main surface 3. The trench separation structure 53 may be referred to as a "DTI (deep trench isolation) structure." The trench separation structure 53 is formed in an annular shape surrounding some regions of the first main surface 3 as viewed in plan and demarcates the first device region 6 which is in a predetermined shape.

In this embodiment, the trench separation structure 53 is formed in a quadrilateral annular shape having four sides parallel to the first to fourth side surfaces 5A to 5D as viewed in plan and demarcates the first device region 6 in a quadrilateral shape. The planar shape of the trench separation structure 53 is arbitrary and the trench separation structure 53 may be formed in a polygonal annular shape. The first device region 6 may be demarcated in a polygonal shape according to the planar shape of the trench separation structure 53.

The trench separation structure 53 has a separation width WI and a separation depth DI. The separation width WI is a width in a direction orthogonal to a direction in which the trench separation structure 53 extends as viewed in plan. The separation width WI may be not less than 0.5 μm and not more than 2.5 μm. The separation width WI is preferably not less than 1.2 μm and not more than 2 μm. The separation depth DI may be not less than 1 μm and not more than 10 μm. The separation depth DI is preferably not less than 2 μm and not more than 6 μm.

An aspect ratio DIM of the trench separation structure 53 may be more than 1 and not more than 5. The aspect ratio DIM is a ratio of the separation depth DI to the separation width WI. The aspect ratio DI/WI is preferably not less than 2. A bottom wall of the trench separation structure 53 is preferably at an interval of not less than 1 μm and not more than 5 μm from a bottom portion of the second semiconductor region 52.

The trench separation structure 53 has a corner portion which connects a portion extending in the first direction X with a portion extending in the second direction Y in a circular arc shape (curved shape). In this embodiment, four corners of the trench separation structure 53 are formed in a circular arc shape. That is, the first device region 6 is demarcated in a quadrilateral shape having four corners, each of which extends in a circular arc shape. The corner portion of the trench separation structure 53 preferably has a constant separation width WI along a circular arc direction.

The trench separation structure 53 has a single electrode structure including a separation trench 54, a separation insulating film 55 (separation insulator), a separation electrode 56 and a separation cap insulating film 57. The separation trench 54 is dug down from the first main surface 3 toward the second main surface 4. The separation trench 54 is formed at an interval from the bottom portion of the second semiconductor region 52 to the first main surface 3 side.

The separation trench 54 includes a side wall and a bottom wall. An angle formed between the side wall of the separation trench 54 and the first main surface 3 inside the semiconductor chip 2 may be not less than 90° and not more than 92°. The separation trench 54 may be formed in a tapered shape in which an opening width is narrowed from an opening to the bottom wall. A corner portion of the bottom wall of the separation trench 54 is preferably formed in a curved shape. An entirety of the bottom wall of the separation trench 54 may be formed in a curved shape toward the second main surface 4.

The separation insulating film 55 is formed on a wall surface of the separation trench 54. Specifically, the separation insulating film 55 is formed as a film in an entire area of the wall surface of the separation trench 54 and demarcates a recess space inside the separation trench 54. The separation insulating film 55 preferably includes a silicon oxide film. It is particularly preferable that the separation insulating film 55 includes a silicon oxide film constituted of an oxide of the semiconductor chip 2.

The separation insulating film 55 has a separation thickness TI. The separation thickness TI is a thickness along a normal direction of the wall surface of the separation trench 54. The separation thickness TI may be not less than 0.1 μm and not more than 1 μm. The separation thickness TI is preferably not less than 0.15 μm and not more than 0.65 μm. In the separation insulating film 55, a thickness of a portion which covers the bottom wall of the separation trench 54 may be less than a thickness of a portion which covers the side wall of the separation trench 54.

The separation electrode 56 is embedded as an integrated member in the separation trench 54 across the separation insulating film 55. In this embodiment, the separation electrode 56 includes conductive polysilicon. A source potential is to be applied to the separation electrode 56. The separation electrode 56 has an electrode surface (separation electrode surface) which is exposed from the separation trench 54. The electrode surface of the separation electrode 56 may be recessed toward the bottom wall of the separation trench 54 in a curved shape. The electrode surface of the separation electrode 56 is preferably at an interval of not less than 0 Å and less than 2000 Å from the first main surface 3 to the bottom wall of the separation trench 54 regarding a depth direction of the separation trench 54. It is in particular preferable that the electrode surface of the separation electrode 56 is at an interval of less than 1000 Å from the first main surface 3 to the bottom wall of the separation trench 54.

The separation cap insulating film 57 covers the electrode surface of the separation electrode 56 as a film inside the separation trench 54. The separation cap insulating film 57 prevents a short circuit of the separation electrode 56 with another electrode. The separation cap insulating film 57 continues to the separation insulating film 55. The separation cap insulating film 57 preferably includes a silicon oxide film. It is in particular preferable that the separation cap insulating film 57 includes a silicon oxide film constituted of an oxide of the separation electrode 56. That is, it is preferable that the separation cap insulating film 57 includes an oxide of polysilicon and the separation insulating film 55 includes an oxide of silicon monocrystal.

The semiconductor device 1 includes a p-type (second conductive type) body region 58 which is formed in a surface layer portion of the first main surface 3 in the first device region 6. A p-type impurity concentration of the body region 58 may be not less than $1 \times 10^{16}$ cm$^{-3}$ and not more than $1 \times 10^{18}$ cm$^{-3}$. The body region 58 is formed in an entire area of the surface layer portion of the first main surface 3 in the first device region 6 and in contact with the side wall of the trench separation structure 53. The body region 58 is formed in a region on the first main surface 3 side with respect to the bottom wall of the trench separation structure 53. The body region 58 is preferably formed in a region on the first main surface 3 side with respect to an intermediate portion of the trench separation structure 53.

The semiconductor device 1 includes the 2-system (n=2) main transistor 8 which is formed in the first main surface 3 in the first device region 6. The main transistor 8 is formed in the first main surface 3 at an interval from the trench separation structure 53 as viewed in plan. The main transistor 8 includes the plurality of unit transistors 10 which are formed so as to concentrate on the first main surface 3 of the first device region 6.

The number of the unit transistors 10 is arbitrary. FIG. 11 shows an example where the 16 unit transistors 10 are formed. The number of the unit transistors 10 is preferably an even number. The plurality of unit transistors 10 are aligned in a single row in the first direction X as viewed in plan and are each formed as a band extending in the second direction Y. The plurality of unit transistors 10 are formed as a stripe extending in the second direction Y as viewed in plan.

Specifically, the plurality of unit transistors 10 are each constituted of a unit cell Each unit cell 60 includes one trench structure 61 and a channel cell 62 which is controlled by the trench structure 61. The trench structure 61 may be referred to as a "gate structure" or a "trench gate structure." Each trench structure 61 configures the third gate TG of each unit transistor 10. The channel cell 62 is a region in which opening/closing of a current path is controlled by the trench structure 61. In this embodiment, the unit cell 60 includes a pair of the channel cells 62 which are formed in both sides of one trench structure 61.

The plurality of trench structures 61 are arrayed at an interval in the first direction X as viewed in plan and are each formed as a band extending in the second direction Y. That is, the plurality of trench structures 61 are formed as a stripe extending in the second direction Y as viewed in plan. The plurality of trench structures 61 each have a first end portion 63 on one side and a second end portion 64 on the other side with respect to a longitudinal direction (second direction Y).

Each trench structure 61 has a trench width W and a trench depth D. The trench width W is a width in a direction orthogonal to a direction in which the trench structure 61 extends (first direction X). The trench width W is preferably less than the separation width WI of the trench separation structure 53 (W<WI). The trench width W may be not less than μm and not more than 2 μm. The trench width W is preferably not less than 0.5 μm and not more than 1.5 μm. As a matter of course, the trench width W may be substantially equal to the separation width WI (W≈WI).

The trench depth D is preferably less than the separation depth DI of the trench separation structure 53 (D<DI). The trench depth D may be not less than 1 μm and not more than 10 μm. The trench depth D is preferably not less than 2 μm and not more than 6 μm. As a matter of course, the trench depth D may be substantially equal to the separation depth DI (D≈DI).

An aspect ratio D/W of the trench structure 61 may be more than 1 and not more than 5. The aspect ratio D/W is a ratio of the trench depth D to the trench width W. The aspect ratio D/W is in particular preferably not less than 2. A bottom wall of the trench structure 61 is preferably at an interval of not less than 1 μm and not more than 5 μm from the bottom portion of the second semiconductor region 52.

The plurality of trench structures 61 are arrayed with a trench interval IT kept in the first direction X. The trench interval IT is preferably set at a value at which a depletion layer expanding from the plurality of trench structures 61 is made integral further below the bottom wall of the plurality of trench structures 61. The trench interval IT may be not less than 0.25 times the trench width W and not more than 1.5 times the trench width W. The trench interval IT is preferably not more than the trench width W (IT≤W). The trench interval IT may be not less than 0.5 μm and not more than 2 μm.

Hereinafter, a description of a configuration of one trench structure 61 shall be given. The trench structure 61 has a multi-electrode structure including a trench 71, an upper insulating film 72, a lower insulating film 73, an upper electrode 74, a lower electrode 75 and an intermediate insulating film 76. The trench 71 may be referred to as a "gate trench." The trench structure 61 includes an embedded electrode (gate electrode) which is embedded in the trench 71 across an embedded insulator. The embedded insulator is constituted of the upper insulating film 72, the lower insulating film 73 and the intermediate insulating film 76. The embedded electrode is constituted of the upper electrode 74 and the lower electrode 75.

The trench 71 is dug down from the first main surface 3 toward the second main surface 4. The trench 71 penetrates through the body region 58 and is formed at an interval from the bottom portion of the second semiconductor region 52 to the first main surface 3 side. The trench 71 includes a side wall and a bottom wall. An angle formed between the side wall of the trench 71 and the first main surface 3 inside the semiconductor chip 2 may be not less than and not more than 92°. The trench 71 may be formed in a tapered shape in which an opening width is narrowed from an opening to the bottom wall. A corner portion of the bottom wall of the trench 71 is preferably formed in a curved shape. An entirety of the bottom wall of the trench 71 may be formed in a curved shape toward the second main surface 4.

The upper insulating film 72 covers an upper wall surface of the trench 71. Specifically, the upper insulating film 72 covers the upper wall surface of the trench 71 located in a region on the opening side thereof with respect to a bottom portion of the body region 58. The upper insulating film 72 crosses a boundary between the second semiconductor region 52 and the body region 58. The upper insulating film 72 has a portion which covers the body region 58 and a portion which covers the second semiconductor region 52. The area covered by the upper insulating film 72 with respect to the body region 58 is larger than the area covered by upper insulating film 72 with respect to the second semiconductor region 52. The upper insulating film 72 preferably includes a silicon oxide film. It is in particular preferable that the upper insulating film 72 includes a silicon oxide film constituted of an oxide of the semiconductor chip 2. The upper insulating film 72 is formed as a gate insulating film.

The upper insulating film 72 has a first thickness T1. The first thickness T1 is a thickness along a normal direction of a wall surface of the trench 71. The first thickness T1 is less than the separation thickness TI of the separation insulating film 55 (T1<TI). The first thickness T1 may be not less than 0.01 μm and not more than 0.05 μm. The first thickness T1 is preferably not less than 0.02 μm and not more than 0.04 μm.

The lower insulating film 73 covers a lower wall surface of the trench 71. Specifically, the lower insulating film 73 covers the lower wall surface of the trench 71 which is located in a region on the bottom wall side thereof with respect to the bottom portion of the body region 58. The lower insulating film 73 demarcates a recess space in a region on the bottom wall side of the trench 71. The lower insulating film 73 is in contact with the second semiconductor region 52. The lower insulating film 73 preferably includes a silicon oxide film. It is in particular preferable that the lower insulating film 73 incudes a silicon oxide film constituted of an oxide of the semiconductor chip 2.

The lower insulating film 73 has a second thickness T2. The second thickness T2 is a thickness along a normal direction of the wall surface of the trench 71. The second thickness T2 exceeds the first thickness T1 of the upper insulating film 72 (T1<T2). The second thickness T2 may be substantially equal to the separation thickness TI of the separation insulating film 55 (T2≈TI). The second thickness T2 may be not less than 0.1 μm and not more than 1 μm. The second thickness T2 is preferably not less than 0.15 μm and not more than 0.65 μm. In the lower insulating film 73, a thickness of a portion which covers the bottom wall of the trench 71 may be less than a thickness of a portion which covers the side wall of the trench 71.

The upper electrode 74 is embedded on the upper side (opening side) inside the trench 71 across the upper insulating film 72. The upper electrode 74 is embedded as a band extending in the second direction Y as viewed in plan. The upper electrode 74 faces the body region 58 and the second semiconductor region 52 across the upper insulating film 72. A facing area of the upper electrode 74 with respect to the body region 58 is larger than a facing area of the upper electrode 74 with respect to the second semiconductor region 52. The upper electrode 74 includes conductive polysilicon. The upper electrode 74 is formed as a gate electrode. The gate signal G is to be input into the upper electrode 74.

The upper electrode 74 has an electrode surface (embedded electrode surface) which is exposed from the trench 71. The electrode surface of the upper electrode 74 may be recessed in a curved shape toward the bottom wall of the trench 71. The electrode surface of the upper electrode 74 is preferably positioned further on the bottom wall side of the trench 71 than a depth position of the electrode surface of the separation electrode 56 regarding a depth direction of the trench 71. The electrode surface of the upper electrode 74 is preferably at an interval of not less than 2000 Å from the first main surface 3 to the bottom wall of the trench 71 with respect to the depth direction of the trench 71. It is in particular preferable that the electrode surface of the upper electrode 74 is at an interval of not less than 2500 Å and not more than 4500 Å from the first main surface 3 to the bottom wall of the trench 71.

The lower electrode 75 is embedded on the lower side (bottom wall side) inside the trench 71 across the lower insulating film 73. The lower electrode 75 is embedded as a band extending in the second direction Y as viewed in plan. The lower electrode 75 has a thickness (length) exceeding a thickness (length) of the upper electrode 74 with respect to the depth direction of the trench 71. The lower electrode 75 faces the second semiconductor region 52 across the lower insulating film 73. The lower electrode 75 has an upper end portion which protrudes from the lower insulating film 73 to the first main surface 3 side. The upper end portion of the lower electrode 75 meshes with the bottom portion of the upper electrode 74 and faces the upper insulating film 72 across the bottom portion of the upper electrode 74 in a lateral direction along the first main surface 3.

The lower electrode 75 includes conductive polysilicon. In this embodiment, the lower electrode 75 is formed as a gate electrode. The lower electrode 75 is to be fixed at the same potential as the upper electrode 74. That is, the same gate signal G is to be applied to the lower electrode 75 at the same time with the upper electrode 74. Thereby, since it is possible to suppress a voltage drop between the upper electrode 74 and the lower electrode 75, it is possible to suppress an electric field concentration between the upper electrode 74 and the lower electrode 75. Also, the semiconductor chip 2 (in particular, second semiconductor region 52) can be decreased in on-resistance.

The intermediate insulating film 76 is interposed between the upper electrode 74 and the lower electrode 75 and electrically insulates the upper electrode 74 and the lower electrode 75. Specifically, the intermediate insulating film 76 covers the lower electrode 75 which is exposed from the lower insulating film 73 in a region between the upper electrode 74 and the lower electrode 75. The intermediate insulating film 76 continues to the upper insulating film 72 and the lower insulating film 73. The intermediate insulating film 76 preferably includes a silicon oxide film. It is in particular preferable that the intermediate insulating film 76 includes a silicon oxide film constituted of an oxide of the lower electrode 75.

The intermediate insulating film 76 has an intermediate thickness TM with respect to the normal direction Z. The intermediate thickness TM is less than the second thickness T2 of the lower insulating film 73 (TM<T2). The intermediate thickness TM may be not less than 0.01 μm and not more than 0.05 μm. The intermediate thickness TM is preferably not less than 0.02 μm and not more than 0.04 μm.

The pair of channel cells 62 are each formed as a band extending in the second direction Y on both sides of each trench structure 61. The pair of channel cells 62 have a length less than a length of the trench structure 61 with respect to the second direction Y. An entire area of the pair of channel cells 62 faces the upper electrode 74 across the upper insulating film 72. The pair of channel cells 62 each have a channel width equivalent to a value that is one-half the trench interval IT.

The pair of channel cells 62 include at least one n-type source region 77 which is formed in a surface layer portion of the body region 58. The number of the source regions 77 included in the pair of channel cells 62 is arbitrary. In this embodiment, the pair of channel cells 62 each include the plurality of source regions 77. All of the source regions 77 included in each unit cell 60 forms the third source TS of each unit transistor 10.

An n-type impurity concentration of the source region 77 exceeds the n-type impurity concentration of the second semiconductor region 52. The n-type impurity concentration of the source region 77 may be not less than $1 \times 10^{18}$ cm$^{-3}$ and not more than $1 \times 10^{21}$ cm$^{-3}$. The plurality of source regions 77 are formed in a region on the first main surface 3 side at an interval from the bottom portion of the body region 58 and face the upper electrode 74 across the upper insulating film 72. The plurality of source regions 77 are arrayed in each channel cell 62 at an interval in the second direction Y. That is, the plurality of source regions 77 are arrayed on both sides of the corresponding trench structure 61 at an interval along the trench structure 61.

The pair of channel cells 62 include at least one p-type contact region 78 which is formed in a region different from the source region 77 at the surface layer portion of the body region 58. The number of the contact regions 78 included in the pair of channel cells 62 is arbitrary. In this embodiment, the pair of channel cells 62 each include the plurality of contact regions 78. A p-type impurity concentration of the contact region 78 exceeds the p-type impurity concentration of the body region 58. The p-type impurity concentration of the contact region 78 may be not less than $1 \times 10^{18}$ cm$^{-3}$ and not more than $1 \times 10^{21}$ cm$^{-3}$.

The plurality of contact regions 78 are formed in a region on the first main surface 3 side at an interval from the bottom portion of the body region 58 and face the upper insulating film 72. The plurality of contact regions 78 are formed alternately with the plurality of source regions 77 in the second direction Y in a manner that one source region 77 is sandwiched therebetween. That is, the plurality of contact regions 78 are arrayed on both sides of the corresponding trench structure 61 at an interval along the trench structure 61.

The pair of channel cells 62 include a plurality of channel regions 79 which are formed between the plurality of source regions 77 and the second semiconductor region 52 inside the body region 58. On/off control of the plurality of channel regions 79 in the pair of channel cells 62 is performed by one trench structure 61. The plurality of channel regions 79 included in the pair of channel cells 62 form one channel of the unit transistor 10. Thereby, one unit cell functions as one unit transistor 10.

In this embodiment, the two unit cells 60 arranged on both sides in the first direction X inside the first device region 6 do not include the source region 77 in the channel cell 62 on the trench separation structure 53 side. According to this structure, it is possible to suppress a leakage current between the trench structure 61 and the trench separation structure 53. In this embodiment, the two unit cells 60 arranged on both sides include only the contact region 78 (hereinafter, referred to as the "outermost contact region 78") in the channel cell 62 on the trench separation structure 53 side. The outermost contact region 78 is formed at an interval from the trench separation structure 53 to the trench structure 61 side and is connected to a side wall of the corresponding trench structure 61. The outermost contact region 78 may be formed as a band extending along the side wall of the corresponding trench structure 61.

The main transistor 8 includes two (n=2) system transistors 9 which are formed so as to concentrate in the first device region 6. The two system transistors 9 include the first system transistor 9A and the second system transistor 9B. The first system transistor 9A includes a plurality (in this embodiment, 8) of first unit transistors 10A which are selectively systematized as an individually controlled object from the plurality of unit transistors 10.

The second system transistor 9B includes a plurality (in this embodiment, 8) of second unit transistors 10B which are selectively systematized as an individually controlled object from the plurality of unit transistors 10 excluding the first unit transistors 10A. The number of the second unit transistors 10B may be different from the number of the first unit transistors 10A. The number of the second unit transistors 10B is preferably equal to the number of the first unit transistors 10A.

Hereinafter, the "unit cell 60," the "trench structure 61," the "channel cell 62," the "trench 71," the "upper insulating film 72," the "lower insulating film 73," the "upper electrode 74," the "lower electrode 75," the "intermediate insulating film 76," the "source region 77," the "contact region 78" and the "channel region 79" of the first unit transistor 10A are respectively referred to as a "first unit cell 60A," a "first trench structure 61A," a "first channel cell 62A," a "first trench 71A," a "first upper insulating film 72A," a "first lower insulating film 73A," a "first upper electrode 74A," a "first lower electrode 75A," a "first intermediate insulating film 76A," a "first source region 77A," a "first contact region 78A" and a "first channel region 79A." The first gate signal G1 is to be input into the first upper electrode 74A and the first lower electrode 75A.

Hereinafter, the "unit cell 60," the "trench structure 61," the "channel cell 62," the "trench 71," the "upper insulating film 72," the "lower insulating film 73," the "upper electrode 74," the "lower electrode 75," and the "intermediate insulating film 76," the "source region 77," the "contact region 78" and the "channel region 79" of the second unit transistor 10B are respectively referred to as a "second unit cell 60B," a "second trench structure 61B," a "second channel cell 62B," a "second trench 71B," a "second upper insulating film 72B," a "second lower insulating film 73B," a "second upper electrode 74B," a "second lower electrode 75B," a "second intermediate insulating film 76B," a "second source region 77B," a "second contact region 78B" and a "second channel region 79B." The second gate signal G2 which is electrically independent of the first gate signal G1 is to be input into the second upper electrode 74B and the second lower electrode 75B.

The first system transistor 9A includes at least one first composite cell 81. The number of the first composite cells 81 is arbitrary and is adjusted according to a size of the first device region 6 (a total number of the unit transistors 10). In this embodiment, the first system transistor 9A includes the plurality (in this embodiment, 4) of first composite cells 81. The plurality of first composite cells 81 are each constituted of an $\alpha$-number ($\alpha \geq 2$) of the first unit transistors 10A (first unit cell 60A) arrayed which are mutually adjacent to the first main surface 3 as viewed in plan. The plurality of first composite cells 81 are arrayed at an interval in the first direction X as viewed in plan.

The second system transistor 9B includes at least one second composite cell 82. The number of the second composite cells 82 is arbitrary and is adjusted according to a size of the first device region 6 (a total number of the unit transistors 10). The number of the second composite cells 82 may be different from the number of the first composite cells 81. The number of the second composite cells 82 is preferably equal to the number of the first composite cells 81. In this embodiment, the second system transistor 9B includes the plurality (in this embodiment, 4) of second composite cells 82. The plurality of second composite cells 82 are each constituted of a $\beta$-number ($\beta \geq 2$) of the second unit transistors 10B (second unit cell 60B) which are arrayed mutually adjacent to the first main surface 3 as viewed in plan.

The plurality of second composite cells 82 are each arranged mutually adjacent to the plurality of first composite cells 81 as viewed in plan. Specifically, the plurality of second composite cells 82 are each arranged in a region between the plurality of first composite cells 81 which are in close proximity to each other as viewed in plan. More specifically, the plurality of second composite cells 82 are arrayed alternately with the plurality of first composite cells 81 along the first direction X in a manner that one first composite cell 81 is sandwiched therebetween as viewed in plan.

The number of the first unit transistors 10A included in one first composite cell 81 may be given as one ($\alpha$=1) and the number of the second unit transistors 10B included in one second composite cell 82 may be given as one ($\beta$=1). That is, the plurality of second unit transistors 10B may be arrayed alternately with the plurality of first unit transistors 10A in a manner that one unit transistor 10 is sandwiched therebetween as viewed in plan.

However, in this case, the number of the plurality of first unit transistors 10A and the plurality of second unit transistors 10B which face each other increase. As a result, a risk of short circuit between the first unit transistor 10A and the second unit transistor 10B which are in close proximity to each other is increased due to a process error, etc. Here, "short circuit" refers to a short circuit between the first trench structure 61A (third gate TG) of the first unit transistor 10A and the second trench structure 61B (third gate TG) of the second unit transistor (also see the circuit diagram of FIG. 6).

For example, where one first unit transistor 10A short-circuits with one second unit transistor 10B to which the first unit transistor 10A is in close proximity, all of the first unit transistors 10A are short-circuited by all of the second unit transistors 10B. That is, as a result of the first system transistor 9A and the second system transistor 9B functioning as one system transistor 9, the first system transistor 9A and the second system transistor 9B do not configure the 2-system main transistor 8 (also see the circuit diagram of FIG. 6).

Therefore, the number of the first unit transistors 10A included in one first composite cell 81 is preferably not less than 2 ($\alpha \geq 2$), and the number of the second unit transistors 10B included in one second composite cell 82 is preferably not less than 2 ($\beta \geq 2$). In this structure, the number of the plurality of first unit transistors 10A and the plurality of second unit transistors 10B which face each other can be decreased. As a result, it is possible to decrease a risk of short circuit between the first unit transistor 10A and the second unit transistor 10B which are in close proximity to each other.

In this case, an electrode surface of the first upper electrode 74A according to the first system transistor 9A is preferably at an interval of not less than 2000 Å (preferably not less than 2500 Å and not more than 4500 Å) from the first main surface 3 to the bottom wall of the first trench 71A regarding a depth direction of the first trench 71A. A depth position of the electrode surface of the first upper electrode 74A is adjusted to a depth position at which characteristics of the gate threshold voltage of the first unit transistor 10A will not deteriorate.

Similarly, an electrode surface of the second upper electrode 74B according to the second system transistor 9B is preferably at an interval of not less than 2000 Å (preferably, not less than 2500 Å and not more than 4500 Å) from the first main surface 3 to the bottom wall of the second trench 71B regarding a depth direction of the second trench 71B. A depth position of the electrode surface of the second upper electrode 74B is adjusted to a depth position at which characteristics of the gate threshold voltage of the second unit transistor 10B will not deteriorate.

According to the structures above, the first upper electrode 74A can be appropriately separated from the second upper electrode 74B and embedded in the first trench 71A, and the second upper electrode 74B can be appropriately separated from the first upper electrode 74A and embedded in the second trench 71B. Thereby, risk of short circuit of the first upper electrode 74A and the second upper electrode 74B can be appropriately decreased. Also, the first source region 77A (first channel region 79A) can be appropriately faced to the first upper electrode 74A, and the second source region 77B (second channel region 79B) can be appropriately faced to the second upper electrode 74B.

The first unit transistor 10A (specifically, first channel region 79A) serves as a heating source in the first device region 6. Therefore, the number of the first unit transistors regulates a heating amount of one first composite cell 81, and an arrangement of the plurality of first composite cells 81 regulates a heating site in the first device region 6. That is, an increase in the number of the first unit transistors 10A which configure one first composite cell 81 results in an increase in heating amount inside one first composite cell 81. Also, where the plurality of first composite cells 81 are arranged so as to be mutually adjacent, the heating sites of the first device region 6 are localized.

Therefore, the number of the first unit transistors 10A is preferably not more than four ($\alpha \leq 4$). According to this structure, it is possible to suppress a local temperature rise in one first composite cell 81. In view of the risk of short circuit and the heating amount, the number of the first unit transistors 10A is in particular preferably two ($\alpha = 2$). The plurality of first composite cells 81 are preferably arrayed at an equal interval in a region between one end portion and the other end portion of the first device region 6. According to this structure, it is possible to thin out the heating sites coming from the plurality of first composite cells 81 in the first device region 6 and it is possible to suppress a local temperature rise in the first device region 6.

In each first composite cell 81, the plurality of first channel regions 79A (first source regions 77A) arrayed on the side of one of the first trench structures 61A preferably face a region between the plurality of first channel regions 79A (first source regions 77A) arrayed on the side of the other of the first trench structures 61A in the first direction X. According to this structure, it is possible to thin out starting points of heating in each first composite cell 81. Thereby, it is possible to suppress a local temperature rise in each first composite cell 81.

In this case, in each first unit cell 60A, the plurality of first channel regions 79A formed in one of the first channel cells 62A preferably face the plurality of first channel regions 79A formed in the other of the first channel cells 62A across the corresponding first trench structure 61A. In each first composite cell 81, the plurality of first channel regions 79A formed in a region between a pair of the first trench structures 61A are preferably arrayed so as to be shifted from each other in the second direction Y as viewed in plan. As a matter of course, in each first unit cell 60A, the plurality of first channel regions 79A formed in one of the first channel cells 62A may face a region between the plurality of first channel regions 79A formed in the other of the first channel cells 62A across the corresponding first trench structure 61A.

In each first unit cell 60A, the plurality of first contact regions 78A formed in one of the first channel cells 62A may face the plurality of first contact regions 78A formed in the other of the first channel cells 62A across the corresponding first trench structure 61A. In each first composite cell 81, the plurality of first contact regions 78A arrayed on the side of one of the first trench structures 61A may face a region between the plurality of first contact regions 78A arrayed on the side of the other of the first trench structures 61A in the first direction X.

In each first composite cell 81, the plurality of first contact regions 78A formed in a region between the pair of first trench structures 61A may be arrayed so as to be shifted from each other in the second direction Y as viewed in plan. Also, the plurality of first contact regions 78A may face the plurality of first source regions 77A in the first direction X as viewed in plan.

The second unit transistor 10B serves as a heating source in the first device region 6. Therefore, the number of the second unit transistors 10B regulates a heating amount of one second composite cell 82, and an arrangement of the plurality of second composite cells 82 regulates the heating site in the first device region 6. That is, an increase in the number of the second unit transistors 10B which configure one second composite cell 82 results in an increase in heating amount inside one second composite cell 82. Also, where the plurality of second composite cells 82 are arranged so as to be mutually adjacent, the heating sites of the first device region 6 are localized.

Therefore, the number of the second unit transistors 10B is preferably not more than four ($\beta \leq 4$). According to this structure, it is possible to suppress a local temperature rise in one second composite cell 82. In this case, the number of the second unit transistors 10B is preferably equal to the number of the first unit transistors 10A. According to this structure, it is possible to suppress a variation in heating range due to the first composite cell 81 and a variation in heating range due to the second composite cell 82. In view of the risk of short circuit and the heating amount, the number of the second unit transistors 10B is in particular preferably two ($\beta = 2$).

The plurality of second composite cells 82 are preferably arrayed at an equal interval in a region between one end portion and the other end portion of the first device region 6. According to this structure, it is possible to thin out the heating sites coming from the plurality of second composite cells 82 in the first device region 6 and it is possible to suppress a local temperature rise in the first device region 6. In this case, it is preferable that at least one second composite cell 82 is arranged so as to be in close proximity to at least one first composite cell 81. According to this structure, it is possible to create such a situation that, in the first composite cell 81 and the second composite cell 82 which are in close proximity to each other, one of the cells is in an on state and the other of the cells is in an off state. It is therefore possible to suppress a local temperature rise due to the first composite cell 81 and the second composite cell 82.

In this case, at least one second composite cell 82 is preferably arranged in a region between the two mutually adjacent first composite cells 81. Further, in this case, it is in particular preferable that the plurality of second composite cells 82 are alternately arrayed with the plurality of first composite cells 81 in a manner that one first composite cell 81 is sandwiched therebetween. According to the structures above, the two first composite cells 81 which are in close proximity to each other can be isolated at an interval corresponding to the second composite cell 82. Thereby, it is possible to appropriately thin out the heating sites coming from the plurality of first composite cells 81 and the plurality of second composite cells 82 and it is possible to appropriately suppress a local temperature rise in the first device region 6.

In each second composite cell 82, the plurality of second channel regions 79B (second source regions 77B) arrayed on the side of one of the second trench structures 61B preferably face a region between the plurality of second channel regions 79B (second source regions 77B) arrayed on the side of the other of the second trench structures 61B in the first direction X. According to this structure, it is possible to thin out starting points of heating in each second composite cell 82. Thereby, it is possible to suppress a local temperature rise in each second composite cell 82.

In this case, in each second unit cell 60B, the plurality of second channel regions 79B formed in one of the second channel cells 62B preferably face the plurality of second channel regions 79B formed in the other of the second channel cells 62B across the corresponding second trench structure 61B. In each second composite cell 82, the plurality of second channel regions 79B formed in a region between a pair of the second trench structures 61B are preferably arrayed so as to be shifted from each other in the second direction Y as viewed in plan.

The plurality of second channel regions 79B are preferably arrayed so as to be shifted in the second direction Y with respect to the plurality of first channel regions 79A in an inter-trench region between each first trench structure 61A and each second trench structure 61B. That is, the plurality of second channel regions 79B preferably face a region between the plurality of first contact regions 78A in the first direction X in the inter-trench region. According to the structures above, it is possible to thin out starting points of heating in the inter-trench region. It is therefore possible to suppress a local temperature rise in the inter-trench region.

In each second unit cell 60B, the plurality of second contact regions 78B formed in one of the second channel cells 62B may face the plurality of second contact regions 78B formed in the other of the second channel cells 62B across the corresponding second trench structure 61B. In each second composite cell 82, the plurality of second contact regions 78B arrayed on the side of one of the second trench structures 61B may face a region between the plurality of second contact regions 78B arrayed on the side of the other of the second trench structures 61B in the first direction X. As a matter of course, in each second unit cell 60B, the plurality of second channel regions 79B formed in one of the second channel cells 62B may face a region between the plurality of second channel regions 79B formed in the other of the second channel cells 62B across the corresponding second trench structure 61B.

In each second composite cell 82, the plurality of second contact regions 78B formed in a region between the pair of second trench structures 61B may be arrayed so as to be shifted from each other in the second direction Y as viewed in plan. The plurality of second contact regions 78B may face the plurality of second source regions 77B in the first direction X as viewed in plan.

The n-system main transistor 8 has a total channel ratio RT. The total channel ratio RT is a ratio of a total planar area of all of the channel regions 79 which occupies a planar area of all of the channel cells 62. A planar area of each channel region 79 is defined by a planar area of each source region 77. The total channel ratio RT is adjusted in a range of more than 0% and less than 100%. The total channel ratio RT is preferably adjusted in a range of not less than 25% and not more than 75%.

The total channel ratio RT is divided into an n-number of system channel ratios RS by the n-number of the system transistors 9. The total channel ratio RT of the 2-system main transistor 8 is constituted of an added value (RT=RSA+RSB) of a first system channel ratio RSA of the first system transistor 9A and a second system channel ratio RSB of the second system transistor 9B. The first system channel ratio RSA is a ratio of a total planar area of all of the first channel regions 79A which occupies a total planar area of all of the channel cells 62. The second system channel ratio RSB is a ratio of a total planar area of all of the second channel regions 79B which occupies a total planar area of all of the channel cells 62.

A planar area of each first channel region 79A is defined by a planar area of each first source region 77A, and a planar area of each second channel region 79B is defined by a planar area of each second source region 77B. The first system channel ratio RSA is adjusted by an arrayed pattern of the first source region 77A and the first contact region 78A. The second system channel ratio RSB is adjusted by an arrayed pattern of the second source region 77B and the second contact region 78B.

The first system channel ratio RSA is divided into a plurality of first channel ratios RCA by the plurality of first composite cells 81. The first channel ratio RCA is a ratio of a total planar area of the plurality of first channel regions 79A which occupies a total planar area of all of the channel cells 62 in each first composite cell 81. The first system channel ratio RSA is constituted of an added value of the plurality of first channel ratios RCA. The plurality of first composite cells 81 preferably have the first channel ratios RCA which are equal to each other. In each first unit transistor 10A, the plurality of first channel regions 79A may be formed in a first area which is different from each other or equal to each other for each unit area.

The second system channel ratio RSB is divided into a plurality of second channel ratios RCB by the plurality of second composite cells 82. The second channel ratio RCB is a ratio of a total planar area of the plurality of second channel regions 79B which occupies a total planar area of all of the channel cells 62 in each second composite cell 82. The plurality of second composite cells 82 are constituted of an added value of the plurality of second channel ratios RCB. The plurality of second composite cells 82 preferably have the second channel ratios RCB which are equal to each other. In each second unit transistor 10B, the plurality of second channel regions 79B may be formed in a second area which is different from each other or equal to each other for each unit area. The second area may be equal to or different from the first area of the plurality of first channel regions 79A for each unit area.

The second system channel ratio RSB may be substantially equal to the first system channel ratio RSA (RSA≈RSB). The second system channel ratio RSB may exceed the first system channel ratio RSA (RSA<RSB). The second system channel ratio RSB may be less than the first system channel ratio RSA (RSB<RSA). Hereinafter, in FIG. 18 to FIG. 21, configuration examples of the first channel region 79A and the second channel region 79B are shown.

Figure 18:
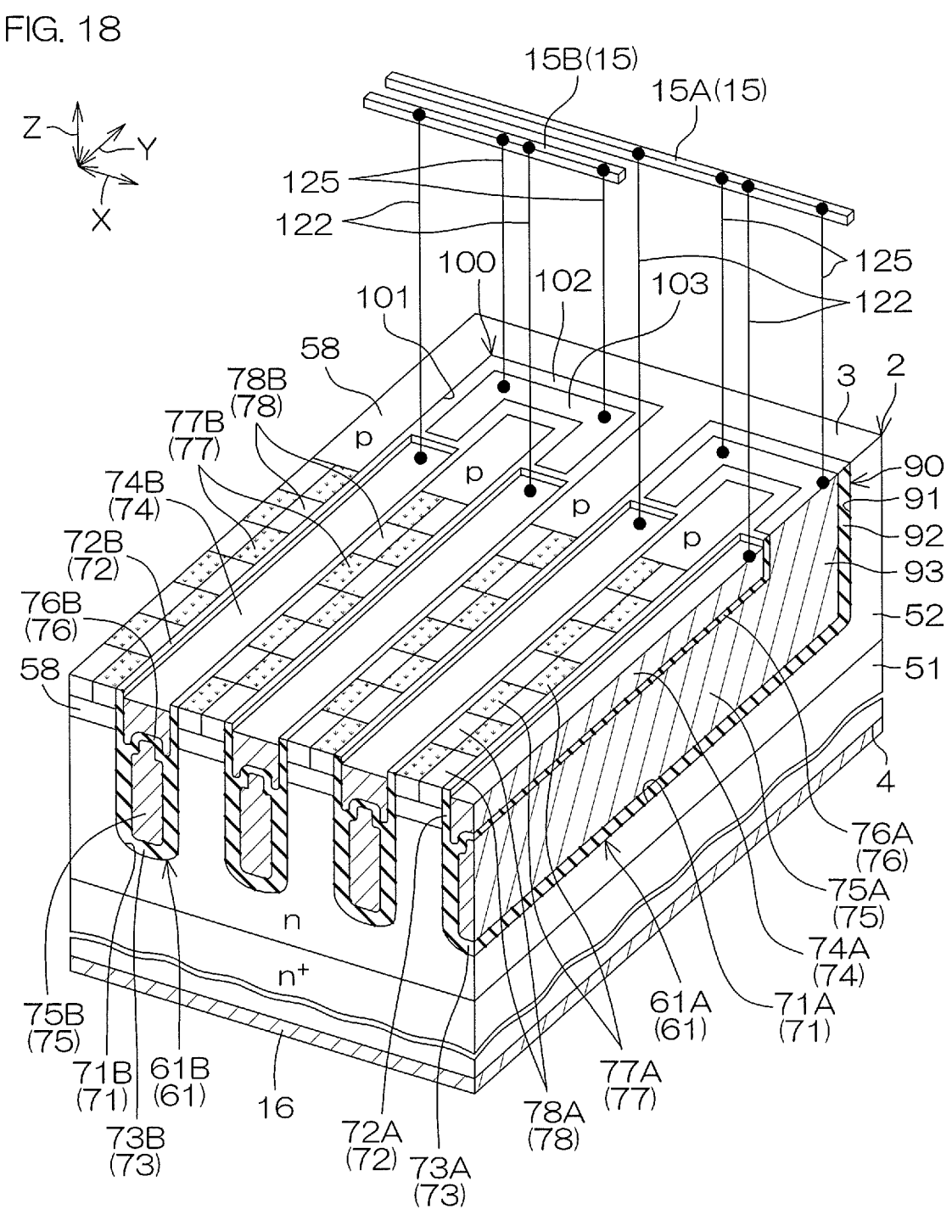
FIG. 18 is a cross-sectional perspective view which shows the main portion of the main transistor together with a first configuration example of the first channel region and the second channel region.

FIG. 18 is a cross-sectional perspective view which shows a main portion of the main transistor 8 together with a first configuration example of the first channel region 79A and the second channel region 79B. In this configuration example, the total channel ratio RT is 50%, the first system channel ratio RSA is 25% and the second system channel ratio RSB is 25%.

Figure 19:
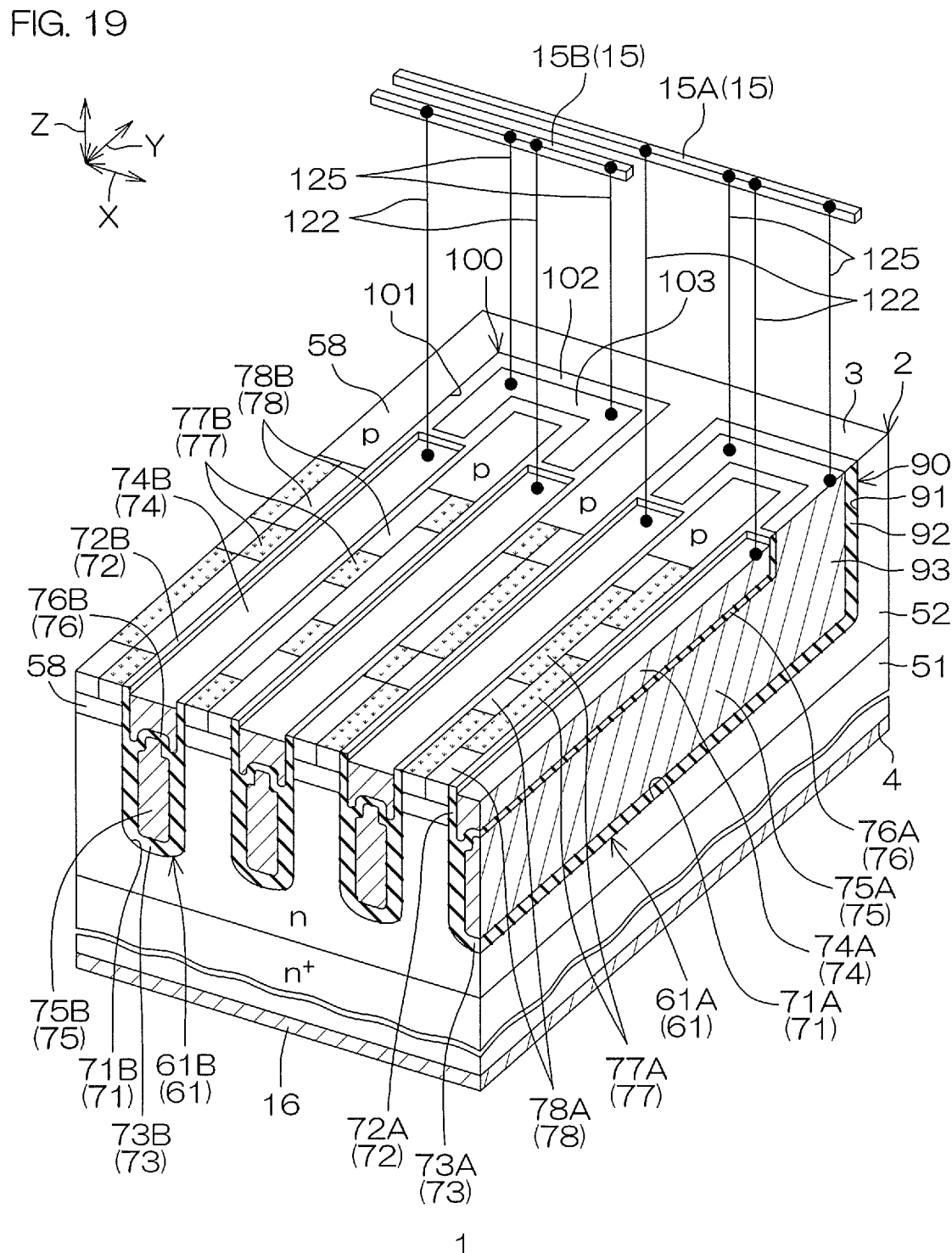
FIG. 19 is a cross-sectional perspective view which shows the main portion of the main transistor together with a second configuration example of the first channel region and the second channel region.

FIG. 19 is a cross-sectional perspective view which shows the main portion of the main transistor 8 together with a second configuration example of the first channel region 79A and the second channel region 79B. In this configuration example, the total channel ratio RT is 50%, the first system channel ratio RSA is 37.5% and the second system channel ratio RSB is 12.5%.

Figure 20:
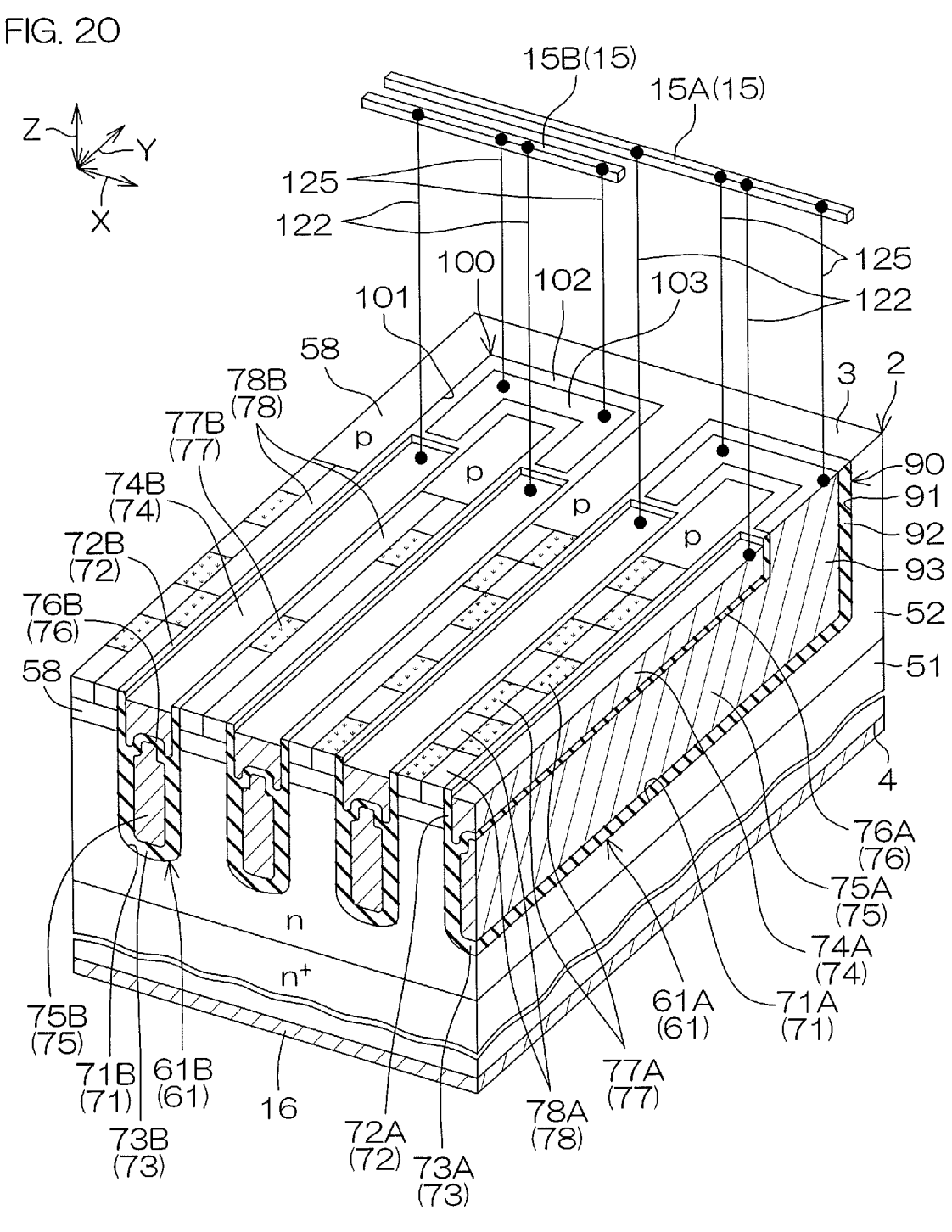
FIG. 20 is a cross-sectional perspective view which shows a main portion of the main transistor together with a third configuration example of the first channel region and the second channel region.

FIG. 20 is a cross-sectional perspective view which shows the main portion of the main transistor 8 together with a third configuration example of the first channel region 79A and the second channel region 79B. In this configuration example, the total channel ratio RT is 33%, the first system channel ratio RSA is 24.7% and the second system channel ratio RSB is 8.3%.

Figure 21:
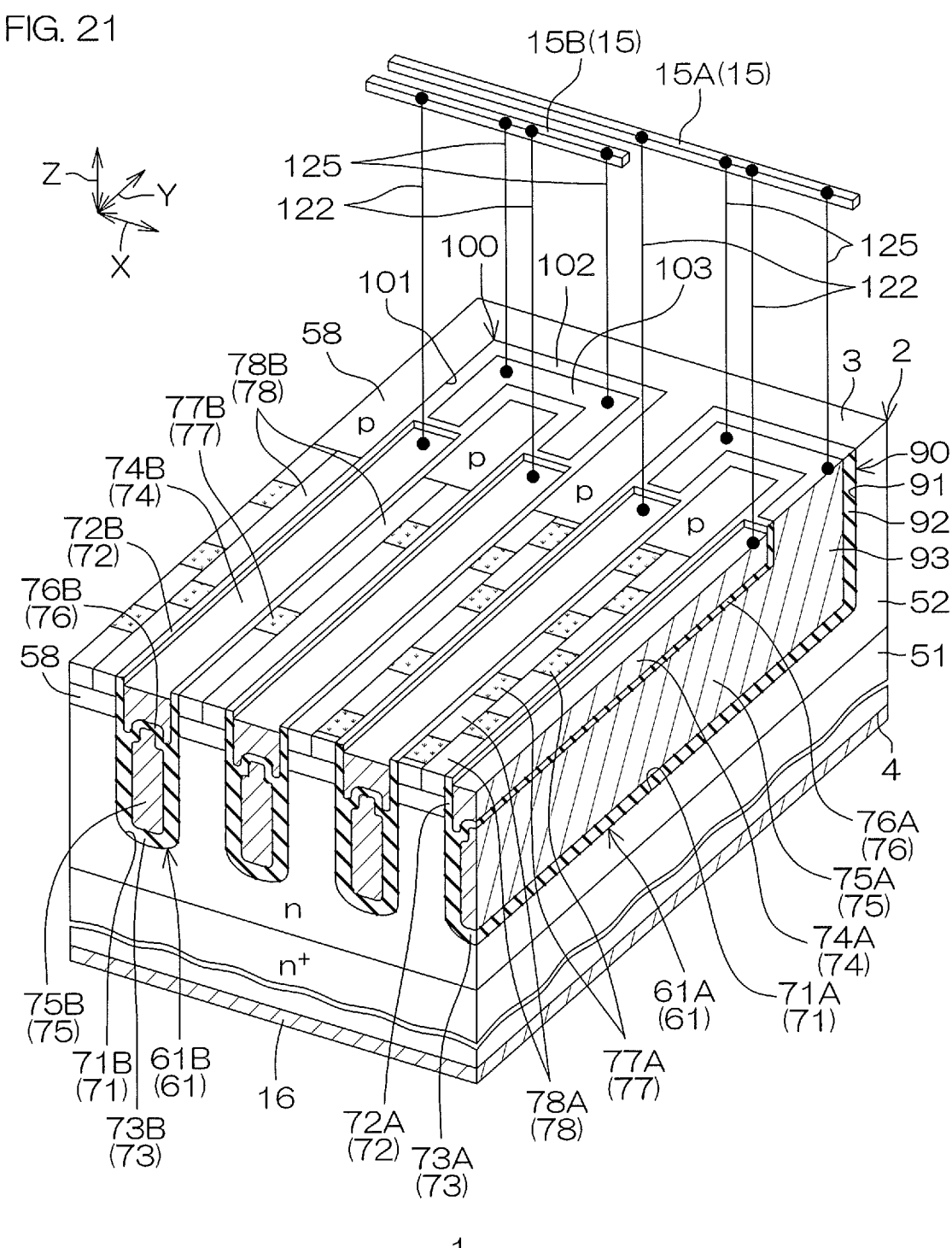
FIG. 21 is a cross-sectional perspective view which shows the main portion of the main transistor together with a fourth configuration example of the first channel region and the second channel region.

FIG. 21 is a cross-sectional perspective view which shows the main portion of the main transistor 8 together with a fourth configuration example of the first channel region 79A and the second channel region 79B. In this configuration example, the total channel ratio RT is 25%, the first system channel ratio RSA is 18.7% and the second system channel ratio RSB is 6.3%.

With again reference to FIG. 11 to FIG. 17, the main transistor 8 includes multiple pairs (in this embodiment, four pairs, total of eight) of first trench connection structures 90 which are formed in the first main surface 3 in the first device region 6. The multiple pairs of first trench connection structures 90 each include the first trench connection structure 90 on one side (first side surface 5A side) and the first trench connection structure 90 on the other side (second side surface 5B side) which face each other across one corresponding first composite cell 81 with respect to the second direction Y.

The first trench connection structure 90 on one side connects the first end portions 63 of the plurality (in this embodiment, one pair) of first trench structures 61A each other in an arch shape as viewed in plan. The first trench connection structure 90 on the other side connects the second end portions 64 of the plurality (in this embodiment, one pair) of first trench structures 61A each other in an arch shape as viewed in plan. With the plurality (in this embodiment, one pair) of first trench structures 61A which configure one first composite cell 81, the pair of first trench connection structures 90 configure one annular-shaped trench structure.

The first trench connection structure 90 on the other side has the same structure as the first trench connection structure 90 on one side except that it is connected to the second end portion 64 of the first trench structure 61A. Hereinafter, a description of a configuration of one first trench connection structure 90 on one side shall be given, and a description of a configuration of the first trench connection structure 90 on the other side shall be omitted.

The first trench connection structure 90 on one side has a first portion 90A extending in the first direction X and a plurality (in this embodiment, one pair) of second portions extending in the second direction Y. The first portion 90A faces the plurality of first end portions 63 as viewed in plan. The plurality of second portions 90B extend from the first portion 90A to the plurality of first end portions 63 and are connected to the plurality of first end portions 63.

The first trench connection structure 90 on one side has a connection width WC and a connection depth DC. The connection width WC is a width in a direction orthogonal to a direction in which the first trench connection structure 90 extends. The connection width WC is preferably substantially equal to the trench width W of the trench structure 61 (WC W). The connection depth DC is preferably substantially equal to the trench depth D of the trench structure 61 (DC D). It is preferable that an aspect ratio DC/WC of the first trench connection structure 90 is substantially equal to the aspect ratio D/W of the trench structure 61 (DC/WC D/W). A bottom wall of the first trench connection structure 90 is preferably at an interval of not less than 1 μm and not more than 5 μm from the bottom portion of the second semiconductor region 52.

The first trench connection structure 90 on one side has a single electrode structure including a first connection trench 91, a first connection insulating film 92, a first connection electrode 93 and a first cap insulating film 94. The first connection trench 91 extends in an arch shape so as to be communicatively connected to the first end portions 63 of the plurality of first trenches 71A as viewed in plan and is dug down from the first main surface 3 to the second main surface 4. The first connection trench 91 demarcates the first portion 90A and the second portion 90B of the first trench connection structure 90. The first connection trench 91 is formed at an interval from the bottom portion of the second semiconductor region 52 to the first main surface 3 side.

The first connection trench 91 includes a side wall and a bottom wall. An angle formed between the side wall of the first connection trench 91 and the first main surface 3 inside the semiconductor chip 2 may be not less than 90° and not more than 92°. The first connection trench 91 may be formed in a tapered shape in which an opening width is narrowed from an opening to the bottom wall. A corner portion of the bottom wall of the first connection trench 91 is preferably formed in a curved shape. An entirety of the bottom wall of the first connection trench 91 may be formed in a curved shape toward the second main surface 4. The side wall and the bottom wall of the first connection trench 91 are smoothly connected to the side wall and the bottom wall of the first trench 71A.

The first connection insulating film 92 is formed on a wall surface of the first connection trench 91. Specifically, the first connection insulating film 92 is formed as a film in an entire area of the wall surface of the first connection trench 91 and demarcates a recess space inside the first connection trench 91. The first connection insulating film 92 extends in the first direction X at the first portion 90A of the first connection trench 91. The first connection insulating film 92 extends in the second direction Y at the second portion 90B of the first connection trench 91. The first connection insulating film 92 is connected to the first upper insulating film 72A and the first lower insulating film 73A at a communicatively connected portion of the first connection trench 91 and the first trench 71A. The first connection insulating film 92 includes a silicon oxide film. It is in particular preferable that the first connection insulating film 92 includes a silicon oxide film constituted of an oxide of the semiconductor chip 2.

The first connection insulating film 92 has a third thickness T3. The third thickness T3 is a thickness along a normal direction of the wall surface of the first connection trench 91. The third thickness T3 exceeds the first thickness T1 of the first upper insulating film 72A (T1<T3). The third thickness T3 may be substantially equal to the second thickness T2 of the lower insulating film 73 (T2 T3). The third thickness T3 may be substantially equal to the separation thickness TI of the separation insulating film 55 (T3≈TI). The third thickness T3 may be not less than 0.1 μm and not more than 1 The third thickness T3 is preferably not less than 0.15 μm and not more than 0.65 Å thickness of a portion which covers the bottom wall of the first connection trench 91 in the first connection insulating film 92 may be less than a thickness of a portion which covers the side wall of the first connection trench 91.

The first connection electrode 93 is embedded in the first connection trench 91 as an integrated member across the first connection insulating film 92. In this embodiment, the first connection electrode 93 includes conductive polysilicon. The first connection electrode 93 extends in the first direction X at the first portion 90A of the first connection trench 91. The first connection electrode 93 extends in the second direction Y at the second portion 90B of the first connection trench 91. The first connection electrode 93 is connected to the first lower electrode 75A at the communicatively connected portion of the first connection trench 91 and the first trench 71A.

The first connection electrode 93 is electrically insulated from the first upper electrode 74A across the first intermediate insulating film 76A. That is, the first connection electrode 93 is constituted of a lead-out portion which is led out to the first connection trench 91 from the first trench 71A across the first connection insulating film 92 and the first intermediate insulating film 76A in the first lower electrode 75A. The first gate signal G1 is transmitted to the first lower electrode 75A via the first connection electrode 93. That is, the same first gate signal G1 is to be applied to the first connection electrode 93 at the same time with the first upper electrode 74A.

The first connection electrode 93 has an electrode surface (first connection electrode surface) which is exposed from the first connection trench 91. The electrode surface of the first connection electrode 93 may be recessed in a curved shape toward the bottom wall of the first connection trench 91. The electrode surface of the first connection electrode 93 is preferably located (protrudes) further on the first main surface 3 side than a depth position of the electrode surface of the upper electrode 74 of the trench structure 61 regarding a depth direction of the first connection trench 91. The electrode surface of the first connection electrode 93 is preferably at an interval of not less than 0 Å and less than 2000 Å from the first main surface 3 to the bottom wall of the first connection trench 91. It is in particular preferable that the electrode surface of the first connection electrode 93 is at an interval of less than 1000 Å from the first main surface 3 to the bottom wall of the first connection trench 91.

The first cap insulating film 94 covers the electrode surface of the first connection electrode 93 as a film inside the first connection trench 91. The first cap insulating film 94 prevents a short circuit of the first connection electrode 93 with another electrode. The first cap insulating film 94 continues to the first connection insulating film 92. The first cap insulating film 94 preferably includes a silicon oxide film. It is in particular preferable that the first cap insulating film 94 includes a silicon oxide film constituted of an oxide of the first connection electrode 93. That is, it is preferable that the first cap insulating film 94 includes an oxide of polysilicon and the first connection insulating film 92 includes an oxide of silicon monocrystal.

[The main transistor 8 includes multiple pairs (in this embodiment, four pairs, a total of eight) of second trench connection structures 100 which are formed in the first main surface 3 in the first device region 6. The multiple pairs of second trench connection structures 100 each include the second trench connection structure 100 on one side (first side surface 5A side) and the second trench connection structure 100 on the other side (second side surface 5B side) which face each other across one corresponding second composite cell 82 with respect to the second direction Y.

The second trench connection structure 100 on one side connects the first end portions 63 of the plurality (in this embodiment, one pair) of second trench structures 61B each other in an arch shape as viewed in plan. The second trench connection structure 100 on the other side connects the second end portions 64 of the plurality (in this embodiment, one pair) of second trench structures 61B each other in an arch shape as viewed in plan. With the plurality (in this embodiment, one pair) of second trench structures 61B which configure one second composite cell 82, the pair of second trench connection structures 100 configure one annular-shaped trench structure.

The second trench connection structure 100 on the other side has the same structure as the second trench connection structure 100 on one side except that it is connected to the second end portion 64 of the second trench structure 61B. Hereinafter, a description of a configuration of one second trench connection structure 100 on one side shall be given, and a description of a configuration of the second trench connection structure 100 on the other side shall be omitted.

The second trench connection structure 100 on one side has a first portion 100A which extends in the first direction X and a plurality (in this embodiment, one pair) of second portions 100B which extend in the second direction Y. The first portion 100A faces the plurality of first end portions 63 as viewed in plan. The plurality of second portions 100B extend from the first portion 100A to the plurality of first end portions 63 and are connected to the plurality of first end portions 63. As with each of the first trench connection structures 90, the second trench connection structure 100 on one side has the connection width WC and the connection depth DC.

The second trench connection structure 100 on one side has a single electrode structure including a second connection trench 101, a second connection insulating film 102, a second connection electrode 103 and a second cap insulating film 104. The second connection trench 101 extends in an arch shape so as to be communicatively connected to the first end portions 63 of the pair of second trenches 71B as viewed in plan and is dug down from the first main surface 3 toward the second main surface 4. The second connection trench 101 demarcates the first portion 100A and the second portion 100B of the second trench connection structure 100. The second connection trench 101 is formed at an interval from the bottom portion of the second semiconductor region 52 to the first main surface 3 side.

The second connection trench 101 includes a side wall and a bottom wall. An angle formed between the side wall of the second connection trench 101 and the first main surface 3 inside the semiconductor chip 2 may be not less than 90° and not more than 92°. The second connection trench 101 may be formed in a tapered shape in which an opening width is narrowed from an opening to the bottom wall. A corner portion of the bottom wall of the second connection trench 101 is preferably formed in a curved shape. An entirety of the bottom wall of the second connection trench 101 may be formed in a curved shape toward the second main surface 4. The side wall and the bottom wall of the second connection trench 101 are smoothly connected to the side wall and the bottom wall of the second trench 71B. The second connection insulating film 102 is formed on a wall surface of the second connection trench 101. Specifically, the second connection insulating film 102 is formed as a film in an entire area of the wall surface of the second connection trench 101 and demarcates a recess space inside the second connection trench 101. The second connection insulating film 102 extends in the first direction X at the first portion 100A of the second connection trench 101. The second connection insulating film 102 extends in the second direction Y at the second portion 100B of the second connection trench 101. The second connection insulating film 102 includes a silicon oxide film. It is in particular preferable that the second connection insulating film 102 includes a silicon oxide film constituted of an oxide of the semiconductor chip 2. As with the first connection insulating film 92, the second connection insulating film 102 has the third thickness T3.

The second connection electrode 103 is embedded as an integrated member in the second connection trench 101 across the second connection insulating film 102. In this embodiment, the second connection electrode 103 includes conductive polysilicon. The second connection electrode 103 extends in the first direction X at the first portion 100A of the second connection trench 101. The second connection electrode 103 extends in the second direction Y at the second portion 100B of the second connection trench 101. The second connection electrode 103 is connected to the second lower electrode 75B at a communicatively connected portion of the second connection trench 101 and the second trench 71B.

The second connection electrode 103 is electrically insulated from the second upper electrode 74B across the second intermediate insulating film 76B. That is, the second connection electrode 103 is constituted of a lead-out portion which is led out to the second connection trench 101 from the second trench 71B across the second connection insulating film 102 and the second intermediate insulating film 76B in the second lower electrode 75B. The second gate signal G2 is transmitted to the second lower electrode 75B via the second connection electrode 103. That is, the same second gate signal G2 is to be applied to the second connection electrode 103 at the same time with the second upper electrode 74B.

The second connection electrode 103 has an electrode surface (second connection electrode surface) which is exposed from the second connection trench 101. The electrode surface of the second connection electrode 103 may be recessed in a curved shape toward the bottom wall of the second connection trench 101. The electrode surface of the second connection electrode 103 is preferably located (protrudes) further on the first main surface 3 side than the depth position of the electrode surface of the upper electrode 74 of the trench structure 61 regarding a depth direction of the second connection trench 101. The electrode surface of the second connection electrode 103 is preferably at an interval of not less than 0 Å and less than 2000 Å from the first main surface 3 to the bottom wall of the second connection trench 101. It is in particular preferable that the electrode surface of the second connection electrode 103 is at an interval of less than 1000 Å from the first main surface 3 to the bottom wall of the second connection trench 101.

The second cap insulating film 104 covers the electrode surface (second connection electrode surface) of the second connection electrode 103 as a film inside the second connection trench 101. The second cap insulating film 104 prevents a short circuit of the second connection electrode 103 with another electrode. The second cap insulating film 104 continues to the second connection insulating film 102. The second cap insulating film 104 preferably includes a silicon oxide film. It is in particular preferable that the second cap insulating film 104 includes a silicon oxide film constituted of an oxide of the second connection electrode 103. That is, it is preferable that the second cap insulating film 104 includes an oxide of polysilicon and the second connection insulating film 102 includes an oxide of silicon monocrystal.

The semiconductor device 1 includes a body space 110 which is formed along an inner periphery (inner peripheral wall) of the trench separation structure 53 in the first device region 6. The body space 110 is constituted of a part of the body region 58. The body space 110 is formed as a band extending along the main transistor 8 as viewed in plan. Specifically, the body space 110 is formed in an annular shape which surrounds the main transistor 8 as viewed in plan.

The body space 110 has a space width WSP. The space width WSP may be not less than the separation width WI (WI≤WSP) or may be less than the separation width WI (WSP<WI). The body space 110 preferably has the substantially constant space width WSP, with the inner periphery of the trench separation structure 53 given as a reference. The space width WSP may be not less than 1 μm and not more than 2.5 μm. The space width WSP is preferably not less than 1.2 μm and not more than 2 μm.

The semiconductor device 1 includes a field insulating film 111 which partially covers the first main surface 3 in the first device region 6. The field insulating film 111 is formed at an interval from the main transistor 8 to the trench separation structure 53 side as viewed in plan and covers a periphery of the trench separation structure 53. That is, the field insulating film 111 covers the body space 110 (body region 58). The field insulating film 111 faces the second semiconductor region 52 (first semiconductor region 51) across the body space 110 (body region 58) at a peripheral edge portion of the first device region 6. The field insulating film 111 includes a silicon oxide film. It is in particular preferable that the field insulating film 111 includes a silicon oxide film constituted of an oxide of the semiconductor chip 2.

The field insulating film 111 is formed as a band extending along an inner periphery (inner peripheral wall) of the trench separation structure 53 as viewed in plan. In this embodiment, the field insulating film 111 is formed in an annular shape extending along an inner peripheral wall of the trench separation structure 53 as viewed in plan and surrounds an entire periphery of the inner portion of the first device region 6. The field insulating film 111 has a side that extends in one direction (first direction X) and a side that extends in an intersecting direction (second direction Y) which intersects the one direction as viewed in plan. The field insulating film 111 continues to the separation insulating film 55 on the inner periphery (inner peripheral wall) side of the trench separation structure 53. The first device region 6 is demarcated by the trench separation structure 53 inside the semiconductor chip 2 and demarcated by the field insulating film 111 on the semiconductor chip 2.

The field insulating film 111 has an insulating side wall 112 which demarcates an inner portion of the first device region 6. The insulating side wall 112 is formed along an entire periphery of the field insulating film 111. The insulating side wall 112 has a side that extends in one direction (first direction X) and a side that extends in an intersecting direction (second direction Y) which intersects the one direction. The insulating side wall 112 is positioned on the body space 110 (body region 58). The insulating side wall 112 is inclined obliquely downward so as to form an acute angle with the first main surface 3. Specifically, the insulating side wall 112 has an upper end portion which is positioned on the main surface side of the field insulating film 111 and a lower end portion which is positioned on the first main surface 3 side and is inclined obliquely downward from the upper end portion to the lower end portion.

The insulating side wall 112 forms an inclination angle of not less than 20° and not more than 40° (20°≤θ≤40°) between the insulating side wall 112 and the first main surface 3. Where there is drawn a straight line that connects the upper end portion and the lower end portion of the insulating side wall 112 in a cross-sectional view, the inclination angle is an angle (absolute value) formed between the straight line and the first main surface 3 inside the field insulating film 111. The inclination angle is preferably less than 40° (θ<40°).

It is in particular preferable that the inclination angle falls within a range of 30°±6° (24°≤θ≤36°). Typically, the inclination angle falls within a range of not less than 28° and not more than 36° (28°≤θ≤36°). The insulating side wall 112 may be inclined in a curved shape which is recessed to the first main surface 3 in a region between the upper end portion and the lower end portion. In this case as well, where there is drawn a straight line that connects the upper end portion and the lower end portion of the insulating side wall 112 in a cross-sectional view, the inclination angle is an angle (absolute value) formed between the straight line and the first main surface 3.

According to the insulating side wall 112 having a relatively gentle inclination angle, it is possible to prevent electrode residue which is produced upon formation of the trench structure 61, etc., from remaining in a state that it adheres on the insulating side wall 112. Thereby, it is possible to decrease a risk of short circuit between the plurality of unit transistors due to the electrode residue. in reducing a risk of short circuit between the first upper electrode 74A and the second upper electrode 74B due to the electrode residue, it is effective to dig down the electrode surface of the first upper electrode 74A and the electrode surface of the second upper electrode 74B deeper than the electrode surface of the separation electrode 56, etc.

The field insulating film 111 has a thickness exceeding the first thickness T1 of the upper insulating film 72. The thickness of the field insulating film 111 is a thickness along the normal direction Z of a portion other than the insulating side wall 112. The thickness of the field insulating film 111 preferably exceeds the intermediate thickness TM of the intermediate insulating film 76. The thickness of the field insulating film 111 may be substantially equal to the second thickness T2 of the lower insulating film 73. The thickness of the field insulating film 111 may be substantially equal to the separation thickness TI of the separation insulating film 55. The thickness of the field insulating film 111 may be not less than 0.1 μm and not more than 1 μm. The thickness of the field insulating film 111 is preferably not less than 0.15 μm and not more than 0.65 μm.

The semiconductor device 1 includes a main surface insulating film 113 which selectively covers the first main surface 3 in the first device region 6. The main surface insulating film 113 includes a silicon oxide film. It is in particular preferable that the main surface insulating film 113 includes a silicon oxide film constituted of an oxide of the semiconductor chip 2. The main surface insulating film 113 covers a region outside the trench structure 61, the first trench connection structure 90, the second trench connection structure 100 and the field insulating film 111 in the first main surface 3 and continues to the upper insulating film 72, the first connection insulating film 92, the second connection insulating film 102 and the field insulating film 111 (insulating side wall 112).

The main surface insulating film 113 has a thickness which is less than the thickness of the field insulating film 111. The thickness of the main surface insulating film 113 is preferably not more than one-fifth the thickness of the field insulating film 111. The thickness of the main surface insulating film 113 may be substantially equal to the first thickness T1 of the upper insulating film 72. The thickness of the main surface insulating film 113 may be not less than 0.01 μm and not more than 0.05 μm. The thickness of the main surface insulating film 113 is preferably not less than 0.02 μm and not more than 0.04 μm.

The semiconductor device 1 includes the aforementioned interlayer insulating layer 14 which covers the first main surface 3. The semiconductor device 1 includes a plurality of plug electrodes 121 to 125 which are embedded in the interlayer insulating layer 14. The plurality of plug electrodes 121 to 125 may be constituted of a plurality of first plug electrodes 121, a plurality of second plug electrodes 122, a plurality of third plug electrodes 123, a plurality of fourth plug electrodes 124, and a plurality of fifth plug electrodes 125. The plurality of plug electrodes 121 to 125 may be constituted of a tungsten plug electrode. In some of the attached drawings, the plurality of plug electrodes 121 to 125 are indicated, for simplification, by a cross mark or by a line.

The plurality of first plug electrodes 121 are each constituted of a source plug electrode for the separation electrode 56. The plurality of first plug electrodes 121 are each embedded at a portion which covers the trench separation structure 53 in the interlayer insulating layer 14. The plurality of first plug electrodes 121 are embedded at an interval along the separation electrode 56 and are each electrically connected to the separation electrode 56. The arrangement and shape of the plurality of first plug electrodes 121 are arbitrary. One or the plurality of first plug electrodes 121 extending as a band or in an annular shape as viewed in plan may be formed on the separation electrode 56.

The plurality of second plug electrodes 122 are each constituted of a gate plug electrode for the plurality of upper electrodes 74. The plurality of second plug electrodes 122 are each embedded at a portion which covers the plurality of trench structures 61 in the interlayer insulating layer 14. In this embodiment, the plurality of second plug electrodes 122 are each electrically connected to both end portions of the plurality of upper electrodes 74. The arrangement and shape of the plurality of second plug electrodes 122 are arbitrary. One or the plurality of second plug electrodes 122 extending as a band along the upper electrode 74 as viewed in plan may be formed on each of the upper electrodes 74.

The plurality of third plug electrodes 123 are each constituted of a source plug electrode for the plurality of channel cells 62. The plurality of third plug electrodes 123 are each embedded at a portion which covers the plurality of source regions 77 and the plurality of contact regions 78 in the interlayer insulating layer 14. The plurality of third plug electrodes 123 are each electrically connected to the channel cell 62. The arrangement and shape of the plurality of third plug electrodes 123 are arbitrary.

The plurality of fourth plug electrodes 124 are each constituted of a source plug electrode for the plurality of outermost contact regions 78. The plurality of fourth plug electrodes 124 are each embedded at a portion which covers the plurality of outermost contact regions 78 in the interlayer insulating layer 14. The plurality of fourth plug electrodes 124 are embedded at an interval along each of the outermost contact regions 78 and are each electrically connected to each of the outermost contact regions 78. The arrangement and shape of the plurality of fourth plug electrodes 124 are arbitrary. One or the plurality of fourth plug electrodes 124 extending as a band along the outermost contact region 78 as viewed in plan may be formed on each of the outermost contact regions 78.

The plurality of fifth plug electrodes 125 are each constituted of a gate plug electrode for the plurality of first and second connection electrodes 93 and 103. The plurality of fifth plug electrodes 125 are each embedded at a portion which covers the plurality of first and second connection electrodes 93 and 103 in the interlayer insulating layer 14. Each of the fifth plug electrodes 125 is electrically connected to the plurality of first and second connection electrodes 93 and 103. The arrangement and shape of the plurality of fifth plug electrodes 125 are arbitrary. One or the plurality of fifth plug electrodes 125 extending as a band along the plurality of first and second connection electrodes 93 and 103 as viewed in plan may be formed on the plurality of first and second connection electrodes 93 and 103.

The semiconductor device 1 includes one or a plurality of source wirings 126 which are arranged inside the interlayer insulating layer 14 (see FIG. 14). One or the plurality of source wirings 126 are constituted of a wiring layer formed inside the interlayer insulating layer 14. One or the plurality of main source wirings 126 are selectively routed inside the interlayer insulating layer 14, electrically connected to the separation electrode 56 via the plurality of first plug electrodes 121 and electrically connected to the source region 77 and the contact region 78 via the plurality of third plug electrodes 123 and the plurality of fourth plug electrodes 124. One or the plurality of source wirings 126 are electrically connected to the aforementioned source terminal 17.

The semiconductor device 1 includes the aforementioned n-number of the gate wirings 15 which are formed inside the interlayer insulating layer 14. The n-number of gate wirings 15 are selectively routed inside the interlayer insulating layer 14. The n-number of the gate wirings 15 are each electrically connected to one or the plurality of trench structures 61 (unit transistor 10) which are to be systematized as an individually controlled object in the first device region 6 and electrically connected to the aforementioned control IC 11 (gate control circuit 12) in the second device region 7.

In this embodiment, the n-number of the gate wirings 15 include the first gate wiring 15A and the second gate wiring 15B. The first gate wiring 15A is electrically connected to the first upper electrode 74A, the first lower electrode 75A and the first connection electrode 93 via the corresponding second plug electrode 122 and the corresponding fifth plug electrode 125 and imparts the first gate signal G1. The second gate wiring 15B is electrically connected to the second upper electrode 74B, the second lower electrode 75B and the second connection electrode 103 via the corresponding second plug electrode 122 and the corresponding fifth plug electrode 125 and imparts the second gate signal G2.

Figure 22A:
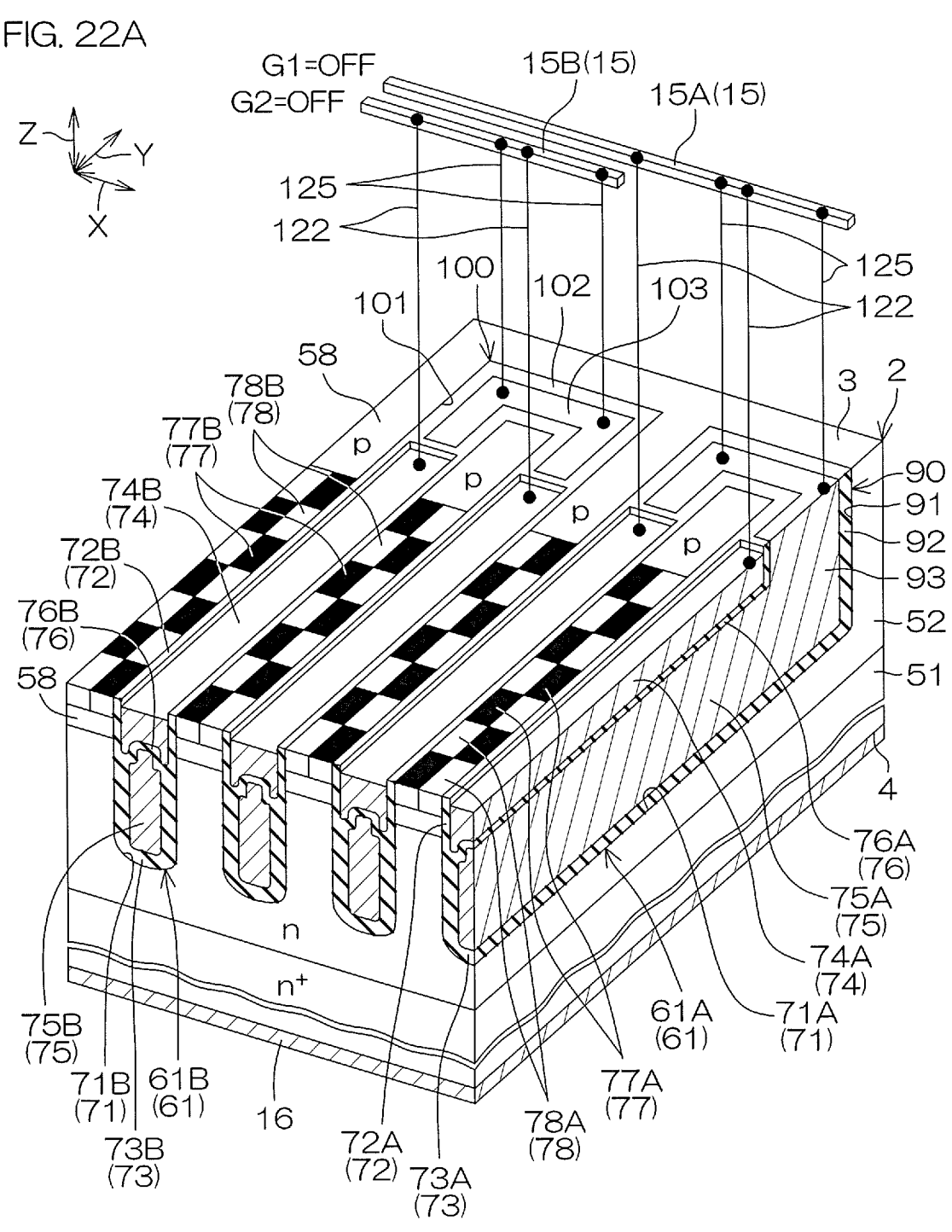
FIG. 22A is a cross-sectional perspective view which shows an operation example of the main transistor.
Figure 22B:
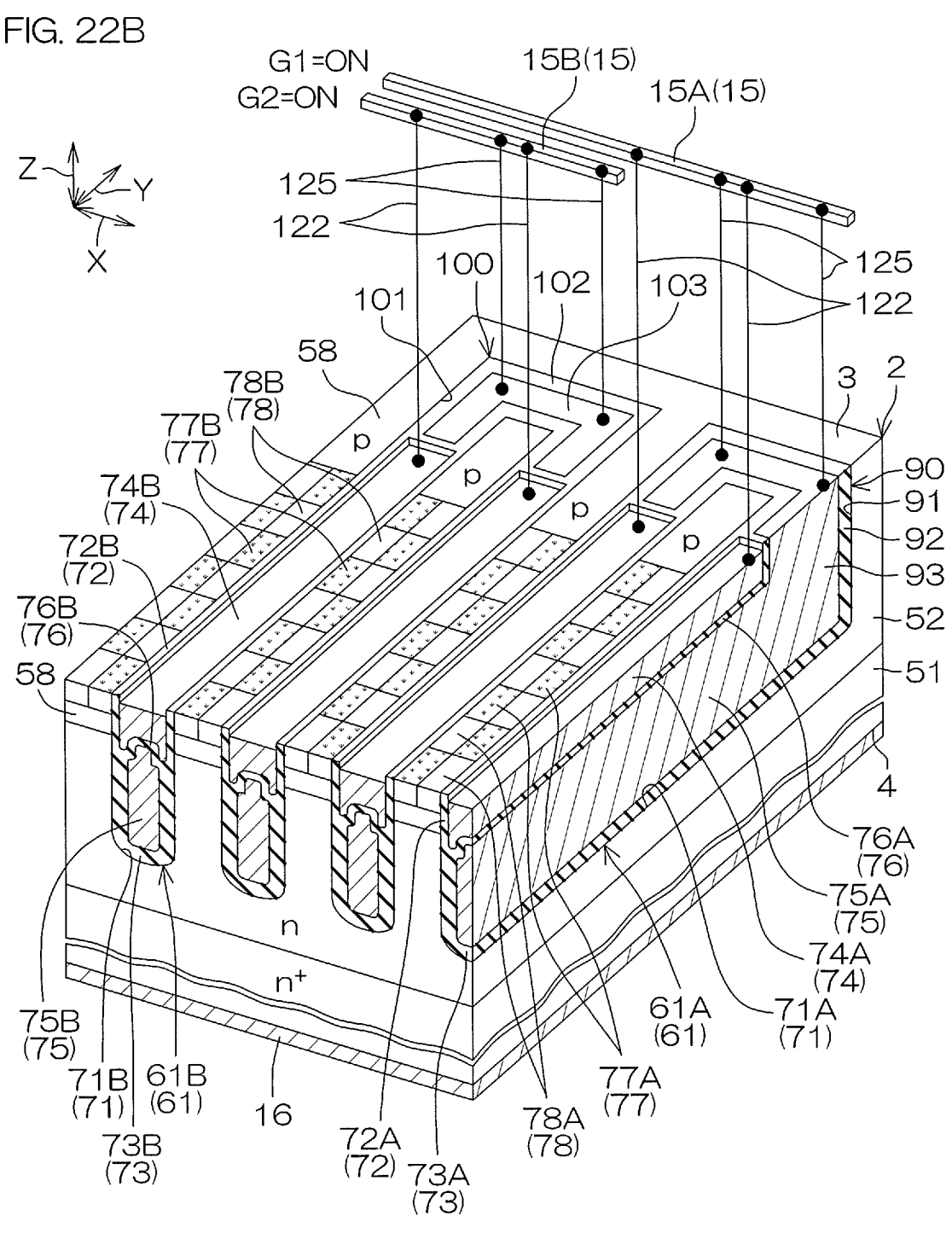
FIG. 22B is a cross-sectional perspective view which shows an operation example of the main transistor.
Figure 22C:
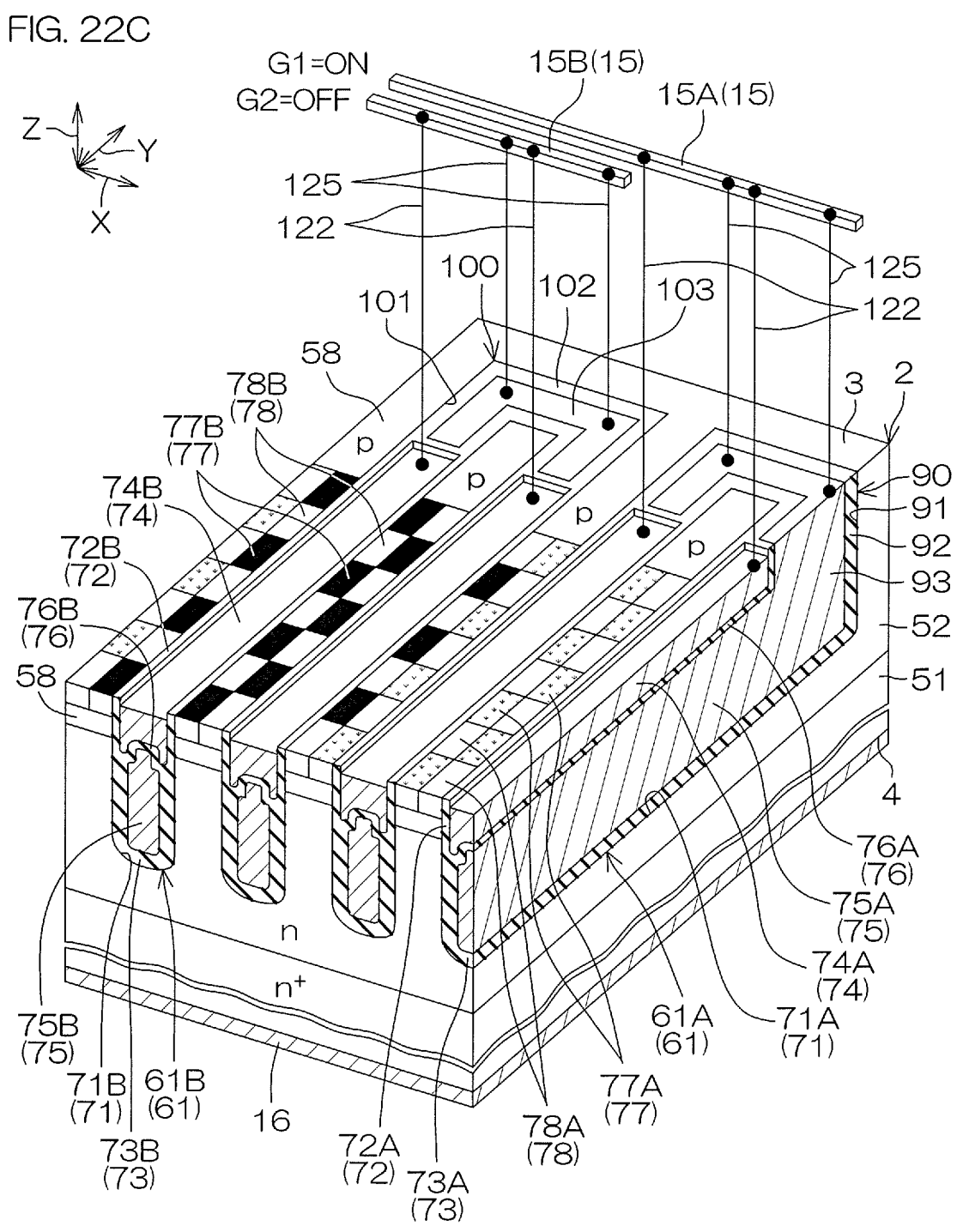
FIG. 22C is a cross-sectional perspective view which shows an operation example of the main transistor.

Hereinafter, with reference to FIG. 22A to FIG. 22C and FIG. 23 in addition to the circuit diagram of FIG. 10, a description of a control example of the 2-system main transistor 8 shall be given. FIG. 22A to FIG. 22C are each a cross-sectional perspective view which shows a control example of the main transistor 8. In FIG. 22A to FIG. 22C, there is shown a configuration example where the total channel ratio RT is 50%, the first system channel ratio RSA is 25% and the second system channel ratio RSB is 25% (also see FIG. 18). In FIG. 22A to FIG. 22C, a channel (source region 77) in an off state is indicated by a filled-in hatching.

Figure 23:
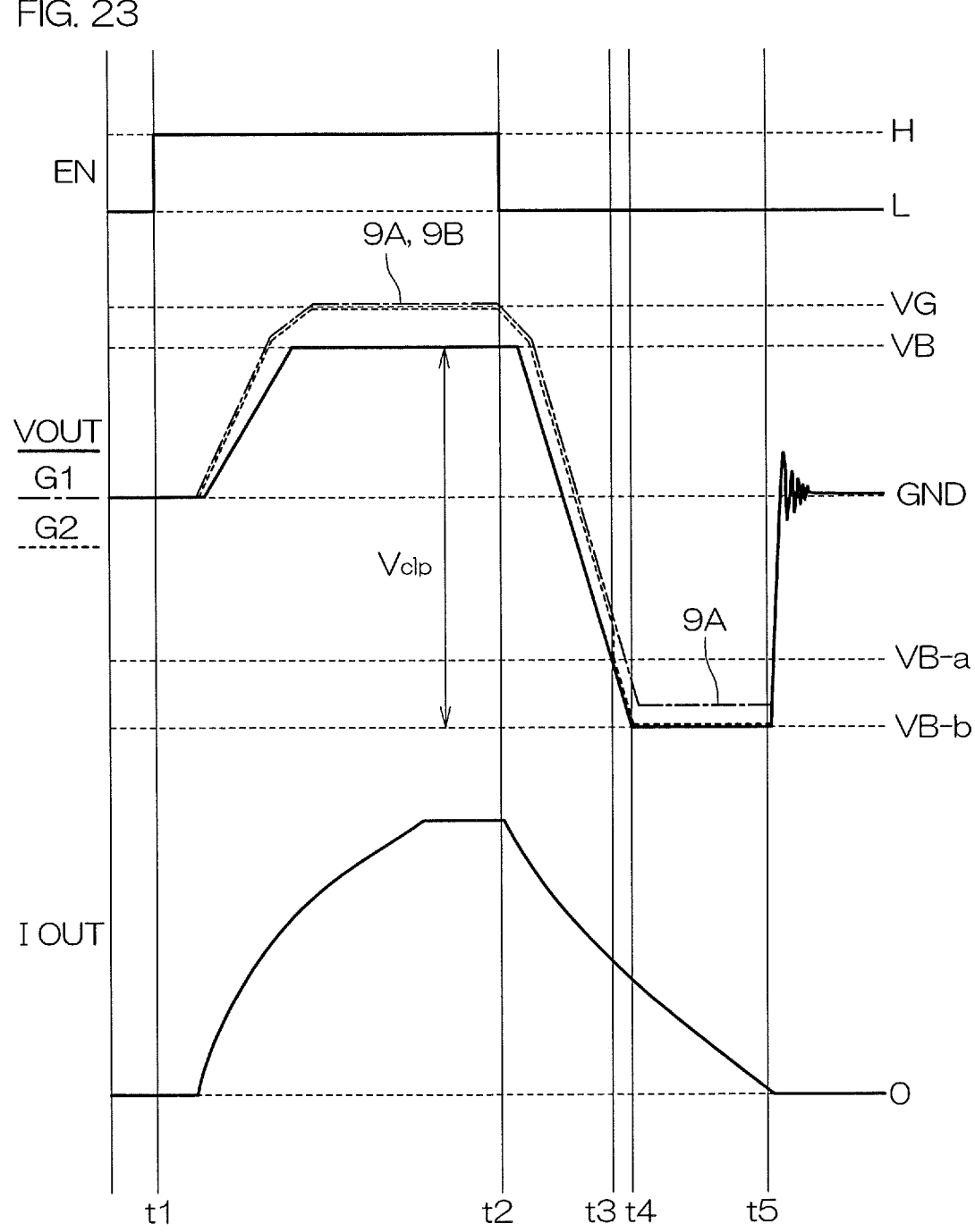
FIG. 23 is a timing chart which shows a control example of the main transistor.

FIG. 23 is a timing chart which shows the control example of the main transistor 8. There are sequentially shown, from the upper side of the sheet surface of FIG. 23, the enable signal EN, the output voltage VOUT (solid line), the first gate signal G1 (alternate long and short dashed line), the second gate signal G2 (broken line) and the output current TOUT. Hereinafter, a gate-source voltage of the first system transistor 9A is given as "Vgs1," a gate-source voltage of the clamp MISFET 39 is given as "Vgs2," a gate-source voltage of the drive MISFET 36 is given as "Vgs3," a breakdown voltage of the Zener diode array 37 is given as "VZ" and a forward direction drop voltage of the diode array 38 is given as "VF."

With reference to FIG. 23, the enable signal EN is kept at a low level up to a time t1. In the enable signal EN, the low level is a logical level when the main transistor 8 is turned off, and the high level is a logical level when the main transistor 8 is turned on. At this time, since the first and second gate signals G1 and G2 are kept at the low level VOUT), and the first and second system transistors 9A and 9B are controlled so as to be in an off state (see FIG. 22A). This state corresponds to a first operation mode of the main transistor 8.

At the time t1, the enable signal EN is controlled from a low level to a high level. When the enable signal EN is turned into the high level, the first and second gate signals G1 and G2 are raised from the low level (≈VOUT) to the high level (≈VG) and the first and second system transistors 9A and 9B are both controlled so as to be in an on state at the same time (see FIG. 22B). Thereby, the main transistor 8 is turned into the normal operation (first operation) state. This state corresponds to a second operation mode of the main transistor 8. When the first and second system transistors 9A and 9B are turned into an on state, the output current TOUT starts to flow. The output voltage VOUT rises to the vicinity of the power voltage VB. When in the normal operation, the main transistor 8 is driven at the total channel ratio RT (=50%).

At a time t2, the enable signal EN is controlled from a high level to a low level. When the enable signal EN is turned into the low level, the first and second gate signals G1 and G2 are raised from the high level to the low level. At this time, the main transistor 8 continues to flow the output current IOUT until all of the energy which was accumulated in the inductive load L (see FIG. 9, etc.) during an on state is released. As a result, the output voltage VOUT abruptly drops down to a negative voltage lower than the ground voltage GND. Thereby, the main transistor 8 is shifted to an active clamp operation (second operation).

At a time t3, when the output voltage VOUT falls down to a channel switching voltage VB-a that is lower than the power voltage VB by a predetermined value a (=VZ+VF+ Vgs3), the internal node voltage Vx becomes higher than the gate-source voltage Vgs3. Thereby, the drive MISFET 36 is turned into an on state, and a short circuit a gate-to-source portion of the second system transistor 9B is short-circuited (G2=VOUT). As a result, the second system transistor 9B is controlled so as to be in an off state.

On the other hand, at a time t4, when the output voltage VOUT drops down to a lower limit voltage VB-b which is lower than the power voltage VB by a predetermined value b (=VZ+VF+Vgs1+Vgs2), the first system transistor 9A is controlled so as to be in an on state by the active clamp circuit 13. The lower limit voltage VB-b is less than the channel switching voltage VB-a (VB-b<VB-a).

Therefore, the second system transistor 9B is completely stopped by the drive MISFET 36 before the active clamp circuit 13 is operated. Thereby, during the active clamp operation, the main transistor 8 is driven by the first system transistor 9A in a state that the second system transistor 9B is stopped (see FIG. 22C). This state corresponds to a third operation mode of the main transistor 8.

During the active clamp operation, the main transistor 8 is driven at the first system channel ratio RSA (=25%). That is, the main transistor 8 is controlled so that a channel utilization rate during the active clamp operation is more than zero and less than a channel utilization rate during the normal operation. In other words, the main transistor 8 is controlled so that an on-resistance during the active clamp operation is higher than an on-resistance during the normal operation.

The output current TOUT is discharged via the first system transistor 9A. Thereby, the output voltage VOUT is limited to a voltage not less than the lower limit voltage VB-b. That is, the active clamp circuit 13 limits the output voltage VOUT on the basis of the power voltage VB and limits a drain-source voltage Vds (=VB−VOUT) of the main transistor 8 to a voltage not more than the clamp voltage Vclp (=b). The active clamp operation continues up to a time t5 when an energy which was accumulated at the inductive load L is completely released out and the output current TOUT no longer flows.

As described above, according to this control example, it is possible to provide the semiconductor device 1 having the on-resistance changeable main transistor 8 in which an on-resistance can be changed depending on an operation state. That is, according to the semiconductor device 1, during the normal operation (during a first operation), a current is allowed to flow by utilizing the first and second system transistors 9A and 9B. Thereby, an on-resistance can be decreased. On the other hand, during the active clamp operation (during a second operation), in a state that the second system transistor 9B is stopped, a current is allowed to flow by utilizing the first system transistor 9A. Thereby, it is possible to consume (absorb) the back electromotive force by the first system transistor 9A while suppressing an abrupt temperature rise due to a back electromotive force of the inductive load L.

In other words, according to the semiconductor device 1, the main transistor 8 is relatively increased in channel utilization rate during the normal operation, and the main transistor 8 is relatively decreased in channel utilization rate during the active clamp operation. Thereby, an on-resistance can be decreased. Also, since it is possible to suppress an abrupt temperature rise due to the back electromotive force of the inductive load L during the active clamp operation, it is possible to improve an active clamp tolerance Eac. As described above, according to the semiconductor device 1, it is possible to realize both an excellent on-resistance and an excellent active clamp tolerance Eac.

Figure 24A:
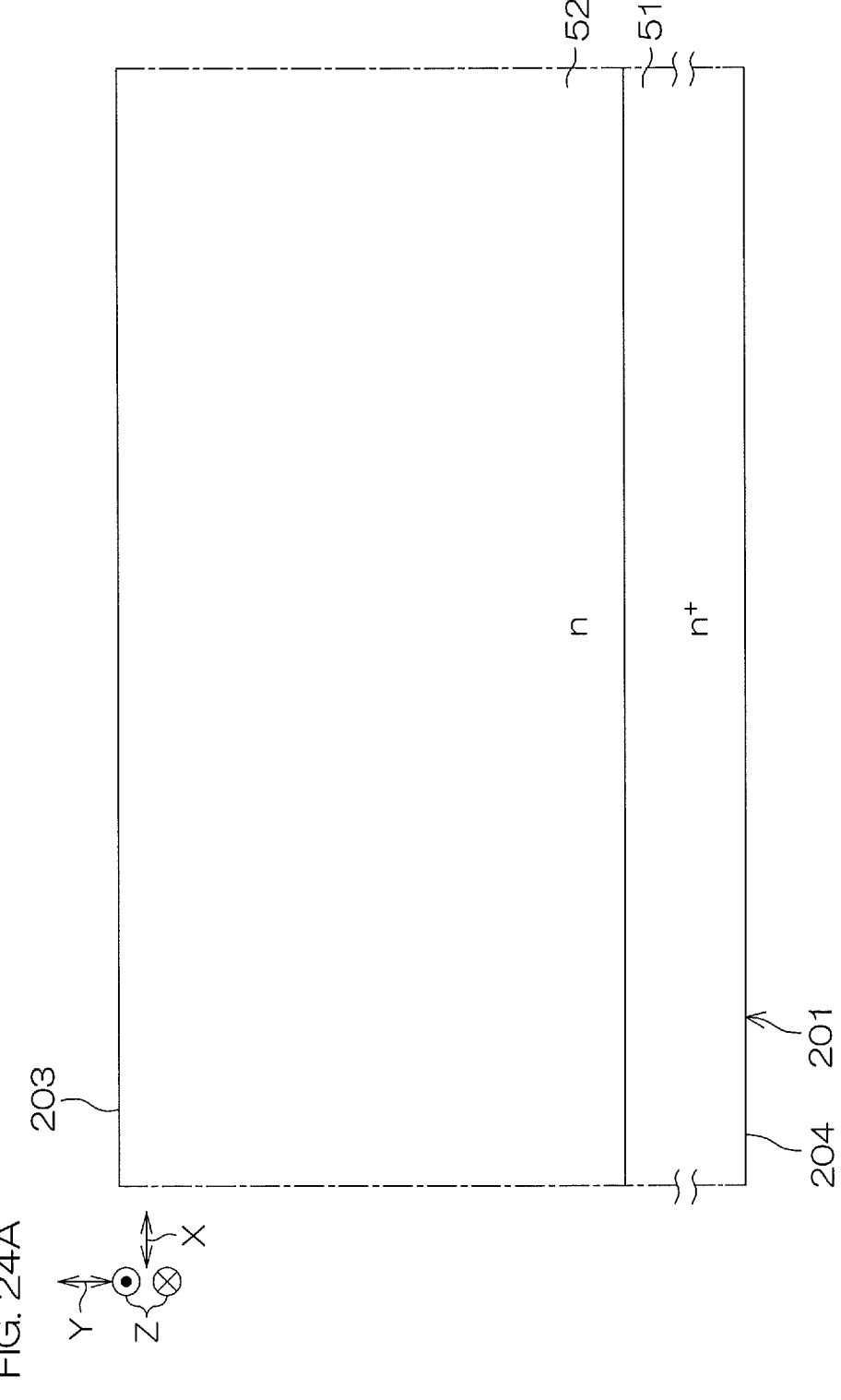
FIG. 24A is a cross-sectional view for describing an example of a method for manufacturing the semiconductor device shown in FIG. 1.

FIG. 24A to FIG. 24K are a cross-sectional view for describing an example of a method for manufacturing the semiconductor device 1 shown in FIG. 1. With reference to FIG. 24A, a disk-shaped semiconductor wafer 201 which serves as a base of the semiconductor chip 2 is prepared. The semiconductor wafer 201 has a first wafer main surface 203 on one side and a second wafer main surface 204 on the other side. The first wafer main surface 203 and the second wafer main surface 204 correspond respectively to the first main surface 3 and the second main surface 4 of the semiconductor chip 2.

The semiconductor wafer 201 has the n-type first semiconductor region 51 at a surface layer portion of the second wafer main surface 204. In this embodiment, the first semiconductor region 51 is constituted of a disk-shaped semiconductor substrate. The semiconductor wafer 201 has the n-type second semiconductor region 52 at a surface layer portion of the first wafer main surface 203. In this embodiment, the second semiconductor region 52 is constituted of an n-type epitaxial layer which is formed on a main surface of the semiconductor substrate (first semiconductor region 51) by an epitaxial growth method.

Figure 24B:
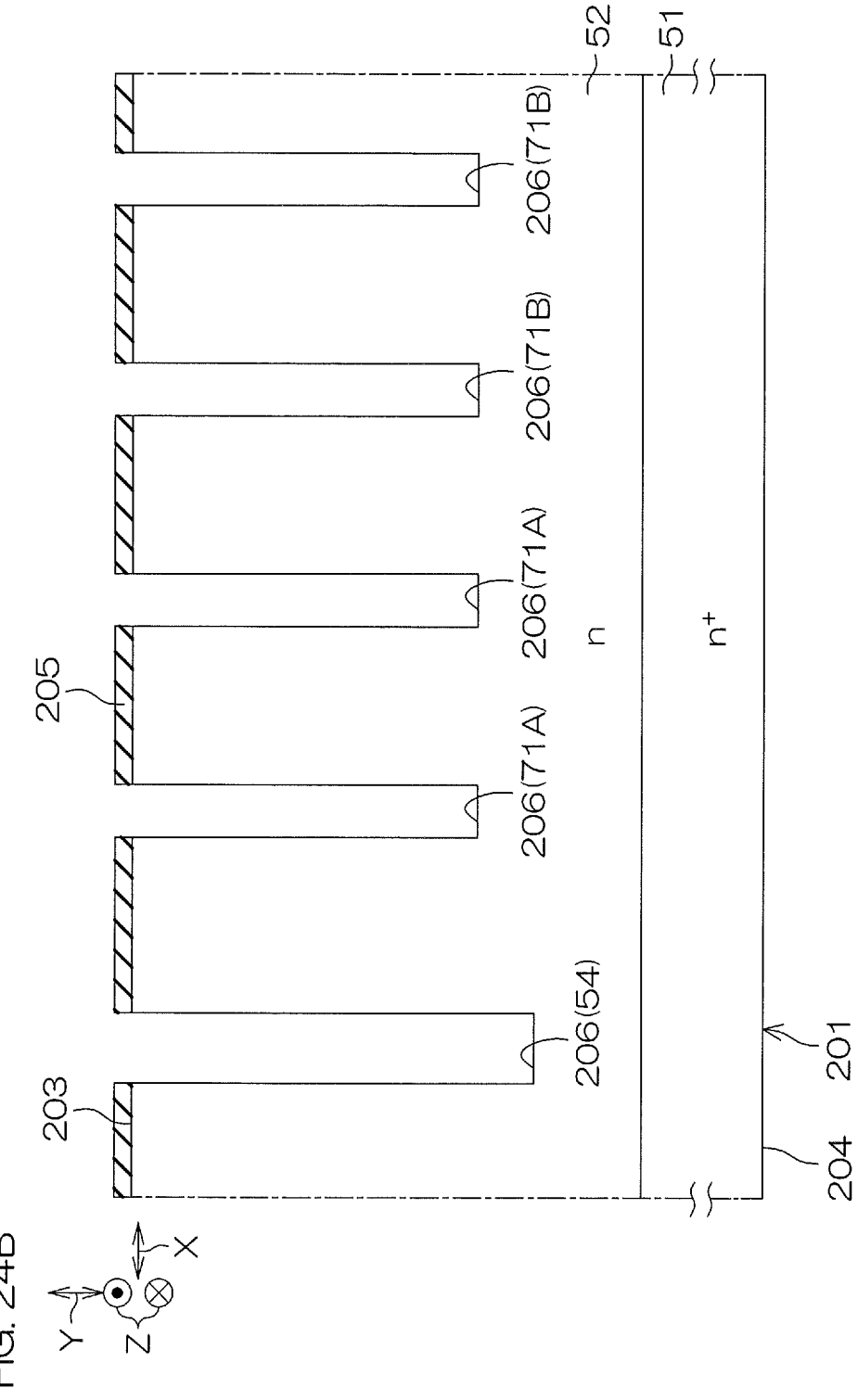
FIG. 24B is a cross-sectional view for describing a step subsequent to that of FIG. 24A.

Next, with reference to FIG. 24B, a mask 205 having a predetermined pattern is formed on the first wafer main surface 203. In this embodiment, the mask 205 is constituted of an inorganic insulator film (for example, silicon oxide film and/or silicon nitride film). The mask 205 has a pattern corresponding to a plurality of trenches 206. The plurality of trenches 206 include the separation trench 54, the plurality of first trenches 71A, the plurality of second trenches 71B, the plurality of first connection trenches 91 and the plurality of second connection trenches 101.

Next, unnecessary portions of the semiconductor wafer 201 are removed by an etching method via the mask 205. The etching method may be a wet etching method and/or a dry etching method. The etching method is preferably an anisotropic dry etching (for example, RIE (Reactive Ion Etching)) method. Thereby, the plurality of trenches 206 are formed in the first wafer main surface 203. Thereafter, the mask 205 is removed.

Figure 24C:
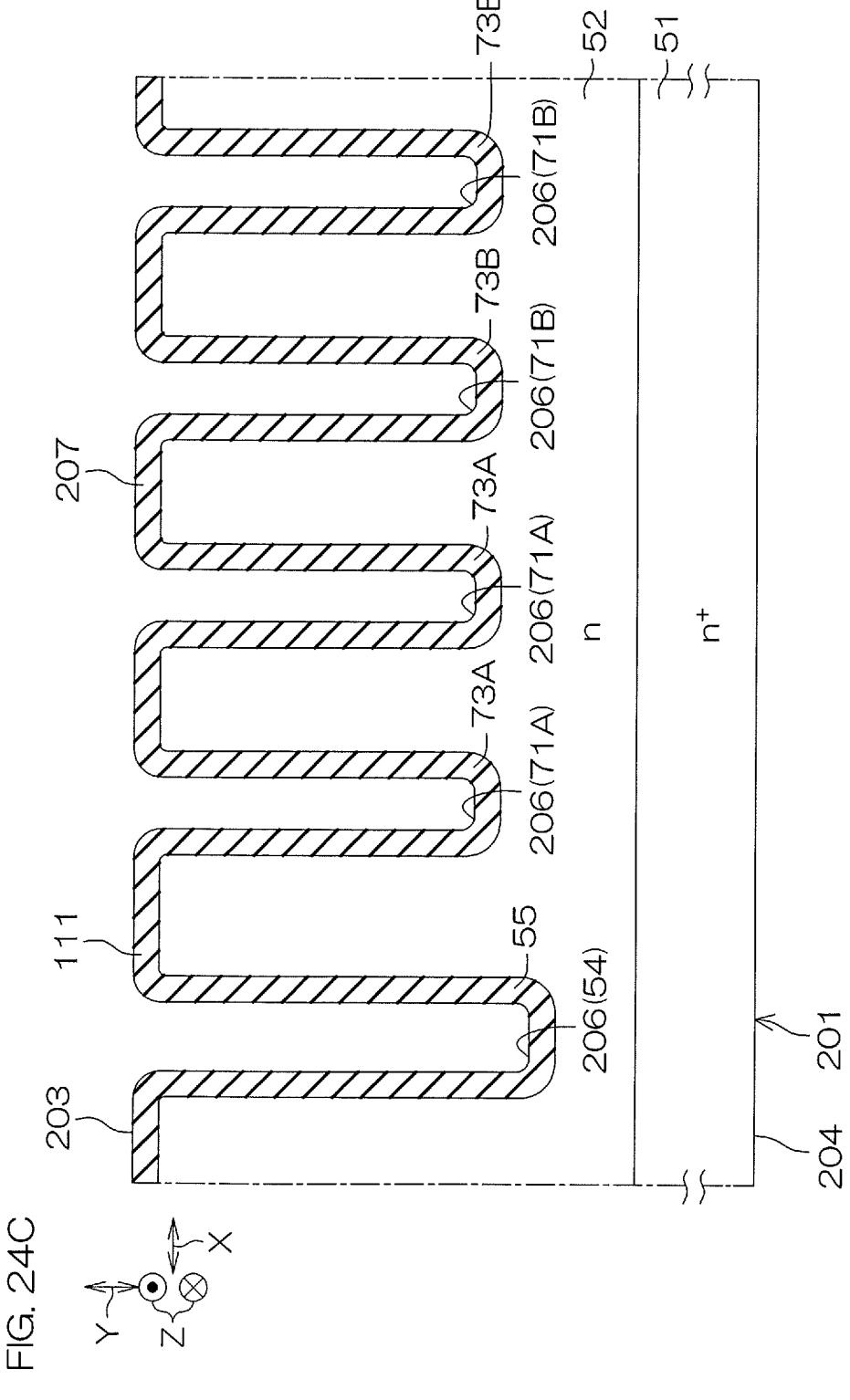
FIG. 24C is a cross-sectional view for describing a step subsequent to that of FIG. 24B.

Next, with reference to FIG. 24C, a first base insulating film 207 is formed on the first wafer main surface 203 and inner walls of the plurality of trenches 206. The first base insulating film 207 serves as a base of the separation insulating film 55, the plurality of first lower insulating films 73A, the plurality of second lower insulating films 73B, the plurality of first connection insulating films 92, the plurality of second connection insulating films 102 and the field insulating film 111. The first base insulating film 207 includes a silicon oxide film. The first base insulating film 207 may be formed by an oxidation treatment method (for example, thermal oxidation treatment method) and/or a CVD method. In this embodiment, the first base insulating film 207 is formed by the thermal oxidation treatment method.

Figure 24D:
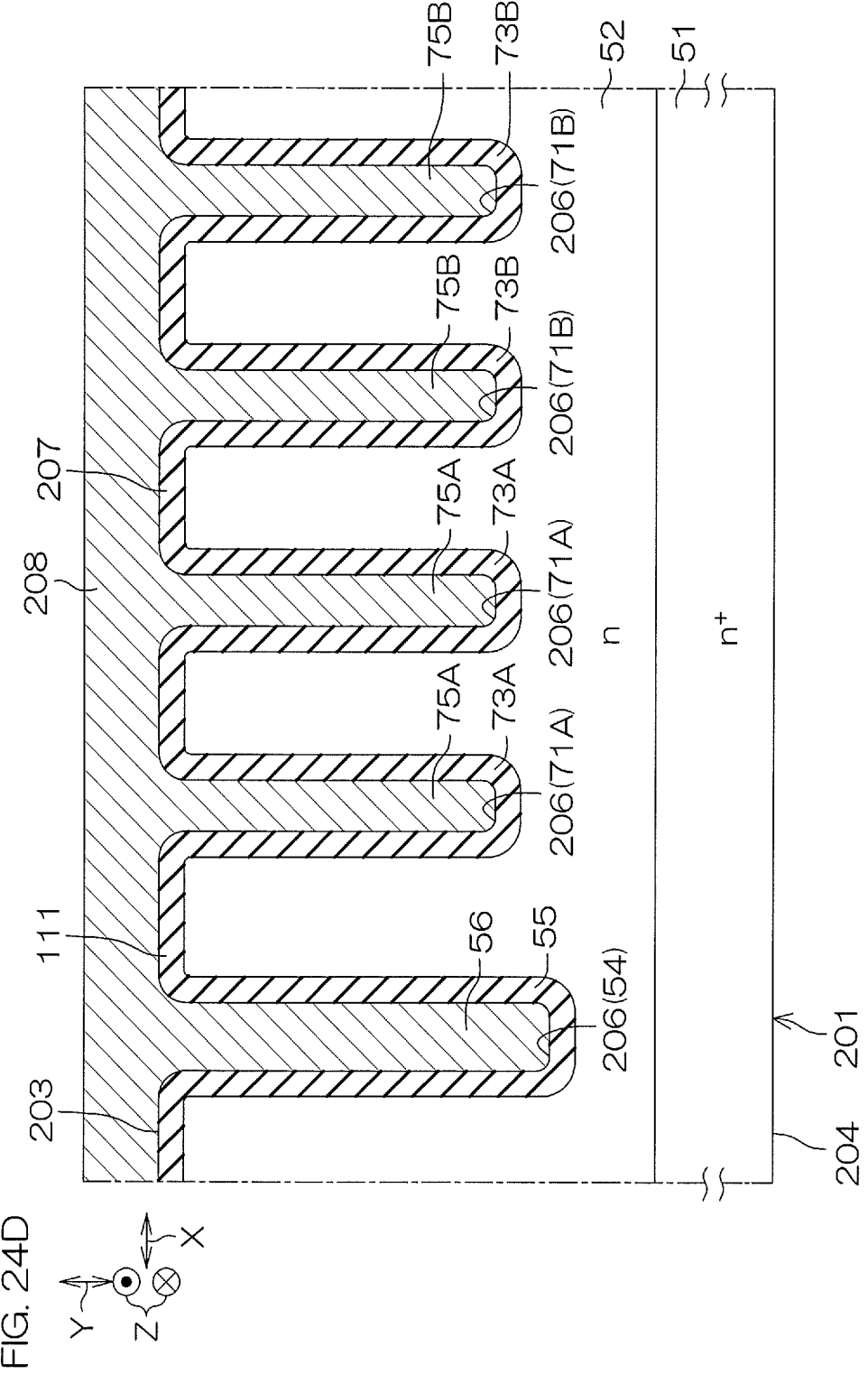
FIG. 24D is a cross-sectional view for describing a step subsequent to that of FIG. 24C.

Next, with reference to FIG. 24D, a first base electrode film 208 is formed on the first base insulating film 207. The first base electrode film 208 serves as a base of the separation electrode 56, the plurality of first lower electrodes 75A, the plurality of second lower electrodes 75B, the plurality of first connection electrodes 93 and the plurality of second connection electrodes 103. The first base electrode film 208 fills the plurality of trenches 206 across the first base insulating film 207 and covers the first wafer main surface 203 across the first base insulating film 207. In this embodiment, the first base insulating film 207 is constituted of conductive polysilicon. The first base electrode film 208 may be formed by a CVD method.

Figure 24E:
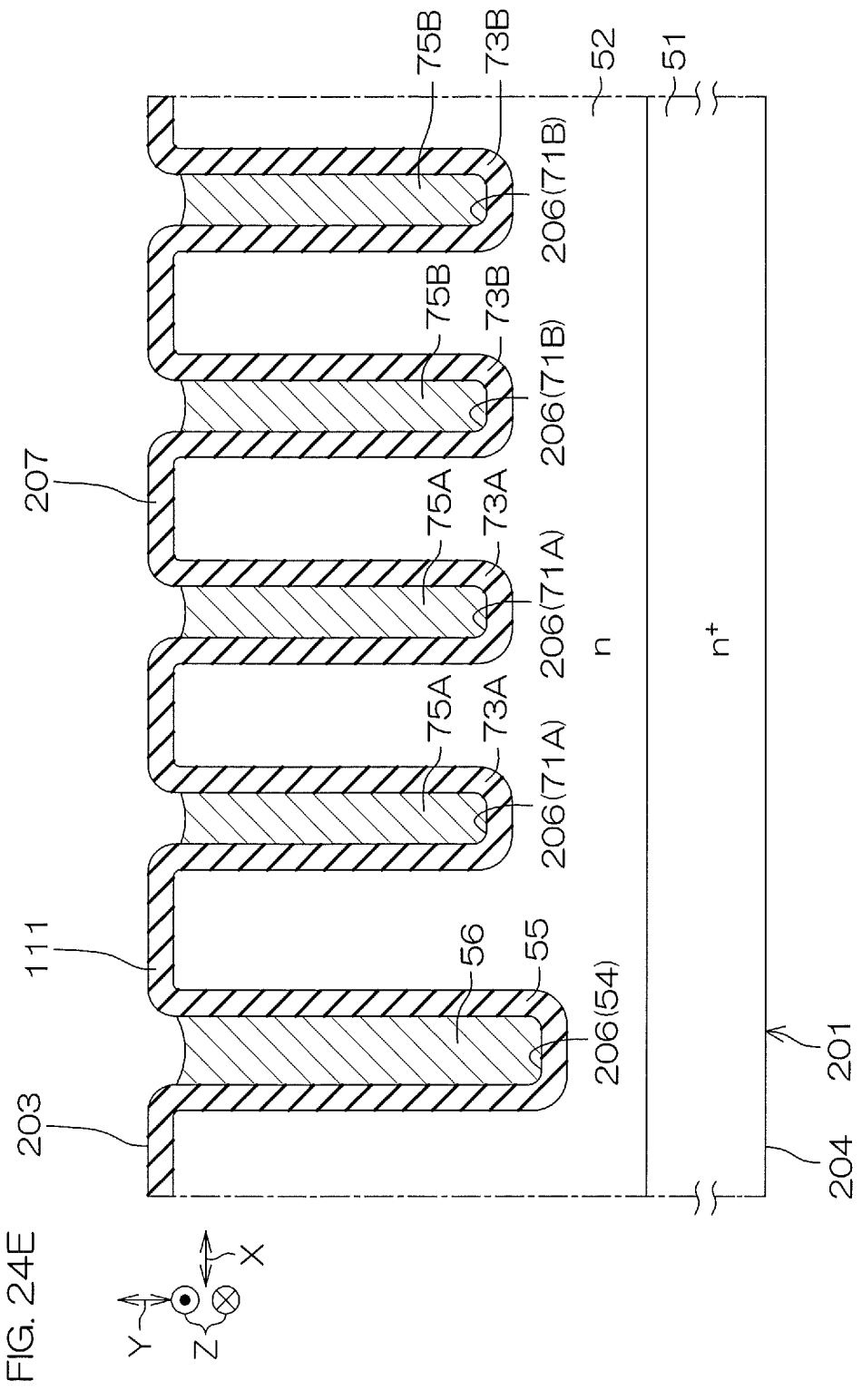
FIG. 24E is a cross-sectional view for describing a step subsequent to that of FIG. 24D.

Next, with reference to FIG. 24E, unnecessary portions of the first base electrode film 208 are removed by an etching method until the first base insulating film 207 is exposed. The etching method may be a wet etching method and/or a dry etching method. Thereby, a part of the first base electrode film 208 is embedded in the plurality of trenched 206 across the first base insulating film 207.

Figure 24F:
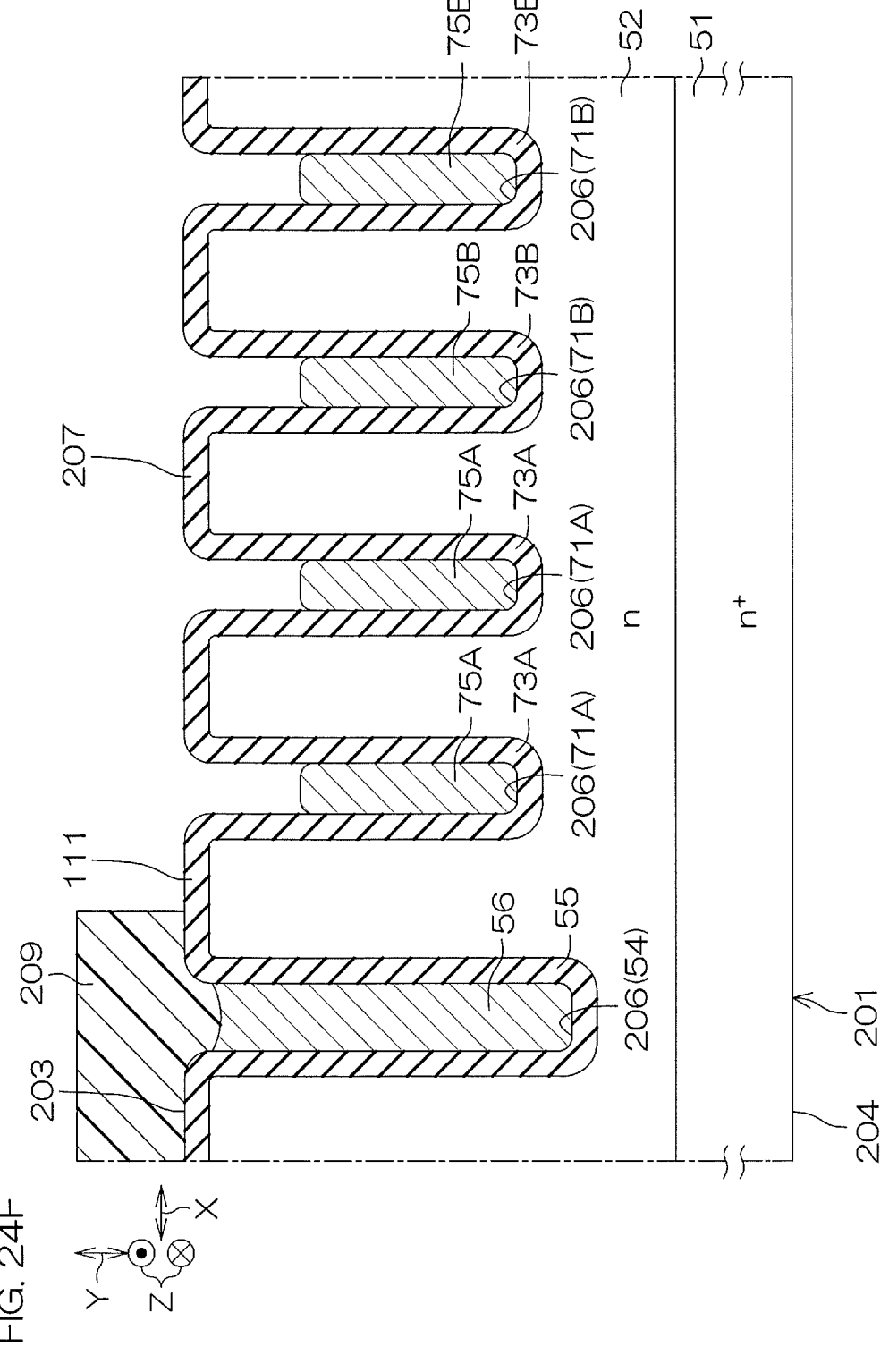
FIG. 24F is a cross-sectional view for describing a step subsequent to that of FIG. 24E.

Next, with reference to FIG. 24F, a first resist mask 209 having a predetermined pattern is formed on the first wafer main surface 203. The first resist mask 209 exposes regions in which the plurality of first lower electrodes 75A and the plurality of second lower electrodes 75B are to be formed and covers regions other than such regions. Next, the unnecessary portions of the first base electrode film 208 are removed by an etching method via the first resist mask 209.

The unnecessary portions of the first base electrode film 208 are removed until an electrode surface (etching surface) of the first base electrode film 208 is positioned at a depth direction middle portion of the plurality of trenches 206. The etching method may be a wet etching method and/or a dry etching method. Thereby, the separation electrode 56, the plurality of first lower electrodes 75A, the plurality of second lower electrodes 75B, the plurality of first connection electrodes 93 and the plurality of second connection electrodes 103 are formed. Thereafter, the first resist mask 209 is removed.

Figure 24G:
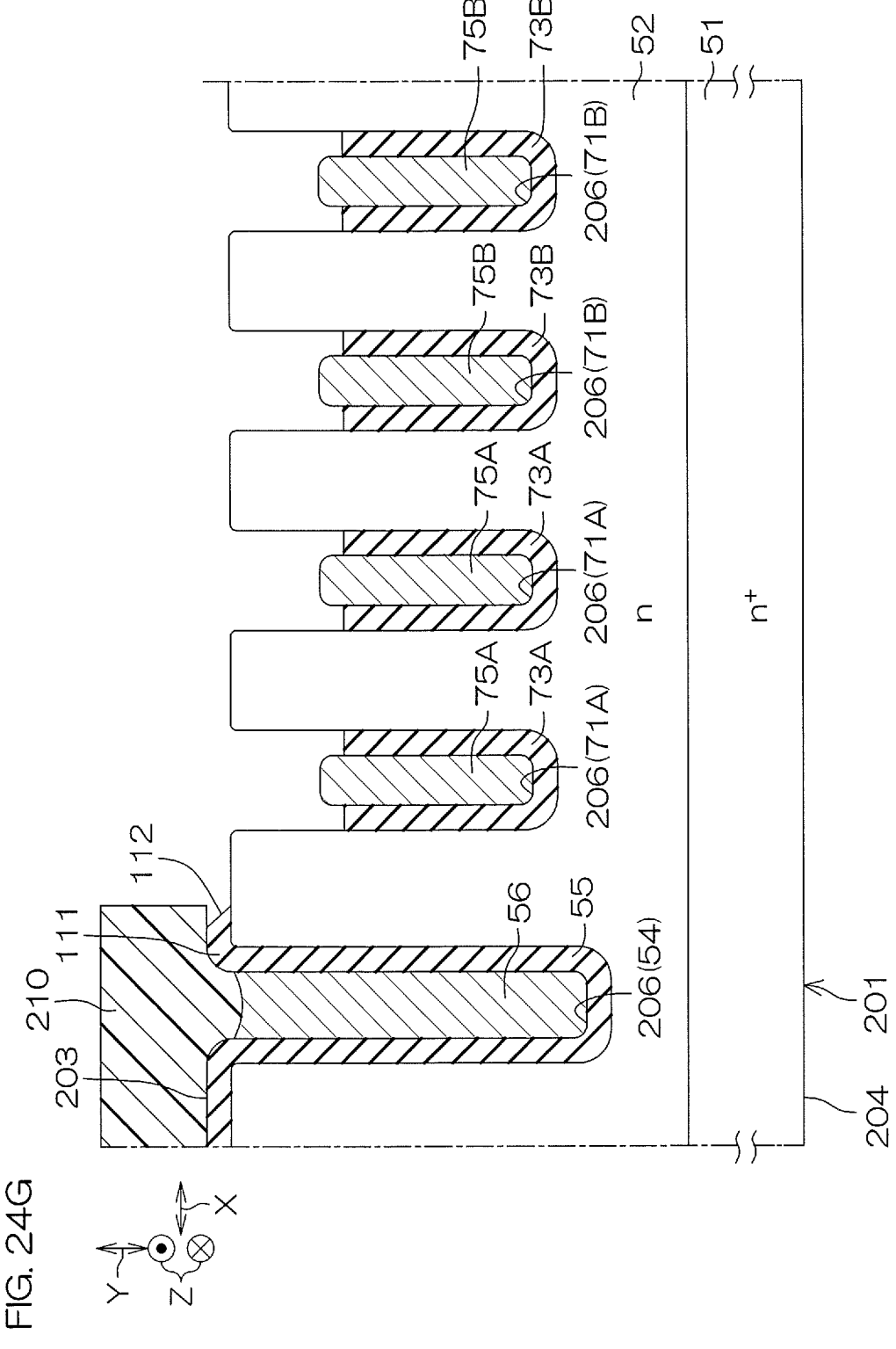
FIG. 24G is a cross-sectional view for describing a step subsequent to that of FIG. 24F.

Next, with reference to FIG. 24G, a second resist mask 210 having a predetermined pattern is formed on the first base electrode film 208. The second resist mask 210 covers regions in which the separation insulating film 55, the plurality of first connection insulating films 92, the plurality of second connection insulating films 102 and the field insulating film 111 are to be formed in the first base insulating film 207 and exposes regions in which the plurality of first lower insulating films 73A and the plurality of second lower insulating films 73B are to be formed.

Next, the unnecessary portions of the first base electrode film 208 are removed by an etching method via the second resist mask 210. The etching method may be a wet etching method and/or a dry etching method. The first base electrode film 208 is removed until upper end portions of the plurality of first lower electrodes 75A and upper end portions of the plurality of second lower electrodes 75B are exposed. Thereafter, the second resist mask 210 is removed.

Figure 24H:
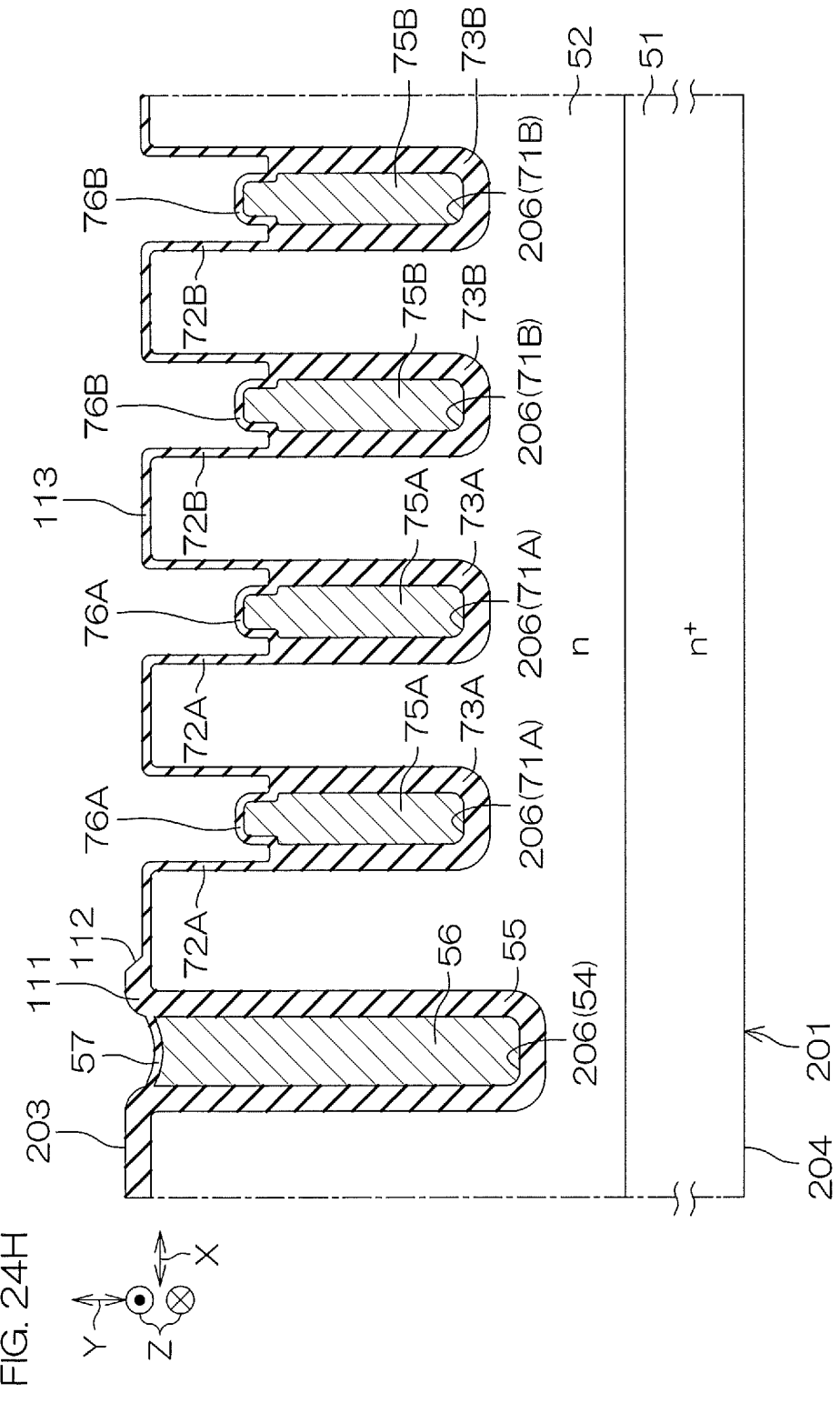
FIG. 24H is a cross-sectional view for describing a step subsequent to that of FIG. 24G.
Figure 24:
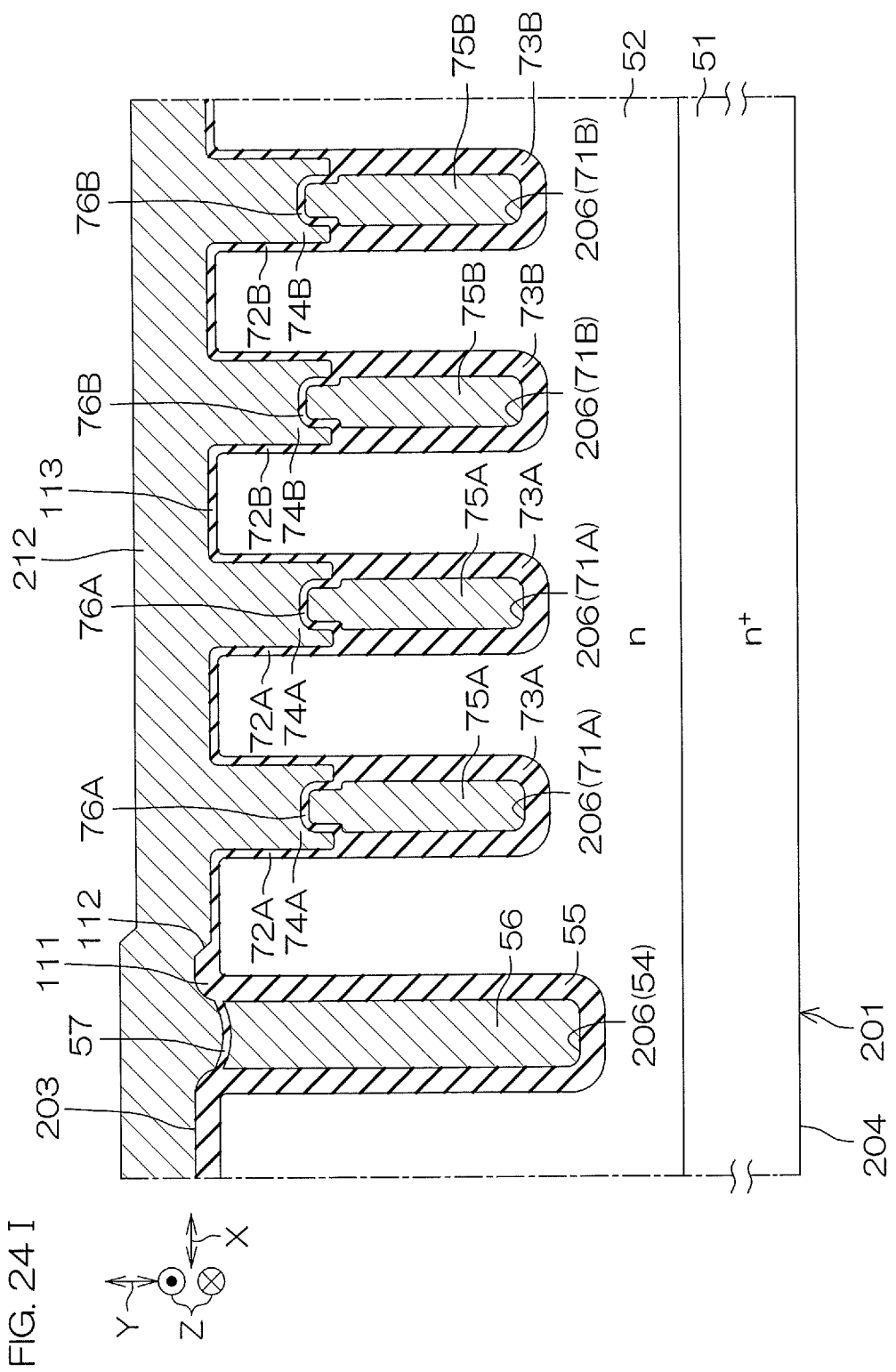
FIG. 24I is a cross-sectional view for describing a step subsequent to that of FIG. 24H.
FIG. 24J is a cross-sectional view for describing a step subsequent to that of FIG. 24I.
FIG. 24K is a cross-sectional view for describing a step subsequent to that of FIG. 24J.

Next, with reference to FIG. 24H, a second base insulating film 211 is formed on the first wafer main surface 203, an electrode surface of the separation electrode 56, electrode surfaces of the plurality of first lower electrodes 75A, electrode surfaces of the plurality of second lower electrodes 75B and inner wall surfaces of the plurality of trenches 206 (trench 71). The second base insulating film 211 includes the separation cap insulating film 57, the plurality of first upper insulating films 72A, the plurality of second upper insulating films 72B, the plurality of first intermediate insulating films 76A, the plurality of second intermediate insulating films 76B, the first cap insulating film 94, the second cap insulating film 104 and the main surface insulating film 113. In this embodiment, the second base insulating film 211 includes a silicon oxide film. The second base insulating film 211 may be formed by an oxidation treatment method (for example, thermal oxidation treatment method) and/or a CVD method. In this embodiment, the second base insulating film 211 is formed by the thermal oxidation treatment method.

Next, with reference to FIG. 24I, a second base electrode film 212 is formed on the first wafer main surface 203. The second base electrode film 212 serves as a base of the plurality of first upper electrodes 74A and the plurality of second upper electrodes 74B. The second base electrode film 212 fills the plurality of trenches 206 across the second base insulating film 211 and covers the first wafer main surface 203 across the second base insulating film 211. In this embodiment, the second base insulating film 211 is constituted of conductive polysilicon. The second base electrode film 212 may be formed by a CVD method.

Figure 24J:
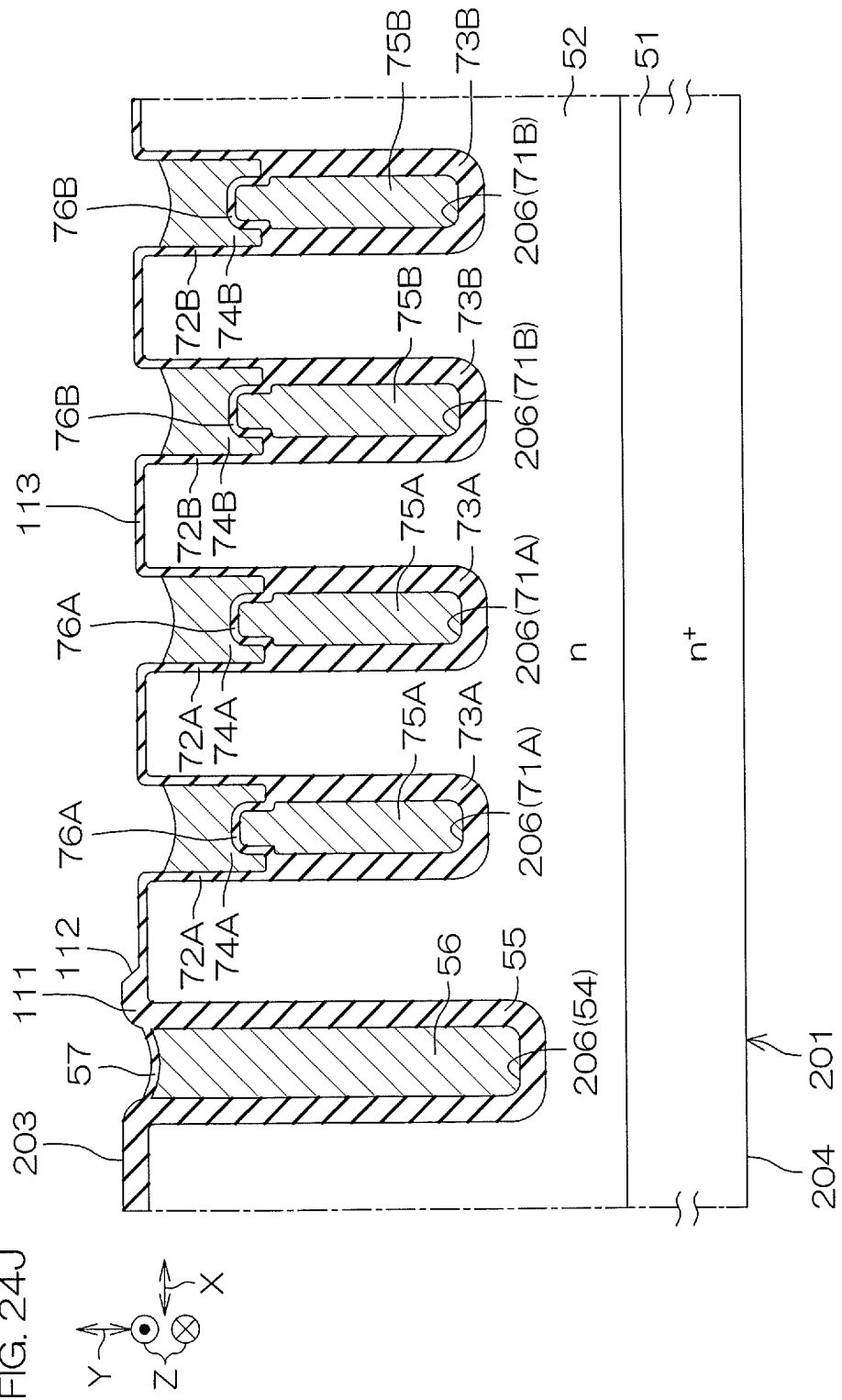

Next, with reference to FIG. 24J, unnecessary portions of the second base electrode film 212 are removed by an etching method until the second base insulating film 211 is exposed. The etching method may be a wet etching method and/or a dry etching method. Thereby, a part of the second base electrode film 212 is embedded in the plurality of trenches 206 across the second base insulating film 211, and the plurality of first upper electrodes 74A and the plurality of second upper electrodes 74B are formed.

At this time, an electrode surface (etching surface) of the second base electrode film 212 is preferably formed at an interval of not less than 2000 Å from the first wafer main surface 203 to bottom walls of the plurality of trenches 206 regarding a depth direction of the plurality of trenches 206. It is in particular preferable that the electrode surface of the second base electrode film 212 is formed at an interval of not less than 2500 Å and not more than 4500 Å from the first wafer main surface 203 to the bottom walls of the plurality of trenches 206.

According to this step, the plurality of first upper electrodes 74A can be appropriately separated from the plurality of second upper electrodes 74B and can be embedded in the plurality of trenches 206 (first trenches 71A), and the plurality of second upper electrodes 74B can be appropriately separated from the plurality of first upper electrodes 74A and can be embedded in the plurality of trenches 206 (second trenches 71B). Thereby, the first upper electrode 74A and the second upper electrode 74B can be appropriately decreased in risk of short circuit.

Also, according to this step, it is possible to prevent residues of the second base electrode film 212, etc., from remaining in a state that they adhere on the insulating side wall 112 of the field insulating film 111. Thereby, the first upper electrode 74A and the second upper electrode 74B can also be decreased in risk of short circuit due to the residues of the second base electrode film 212, etc. A short circuit of the separation electrode 56, the first connection electrode 93 and the second connection electrode 103 with any one of or both of the first upper electrode 74A and the second upper electrode 74B due to the residues of the second base electrode film 212, etc., is suppressed by the separation cap insulating film 57, the first cap insulating film 94 and the second cap insulating film 104.

Figure 24K:
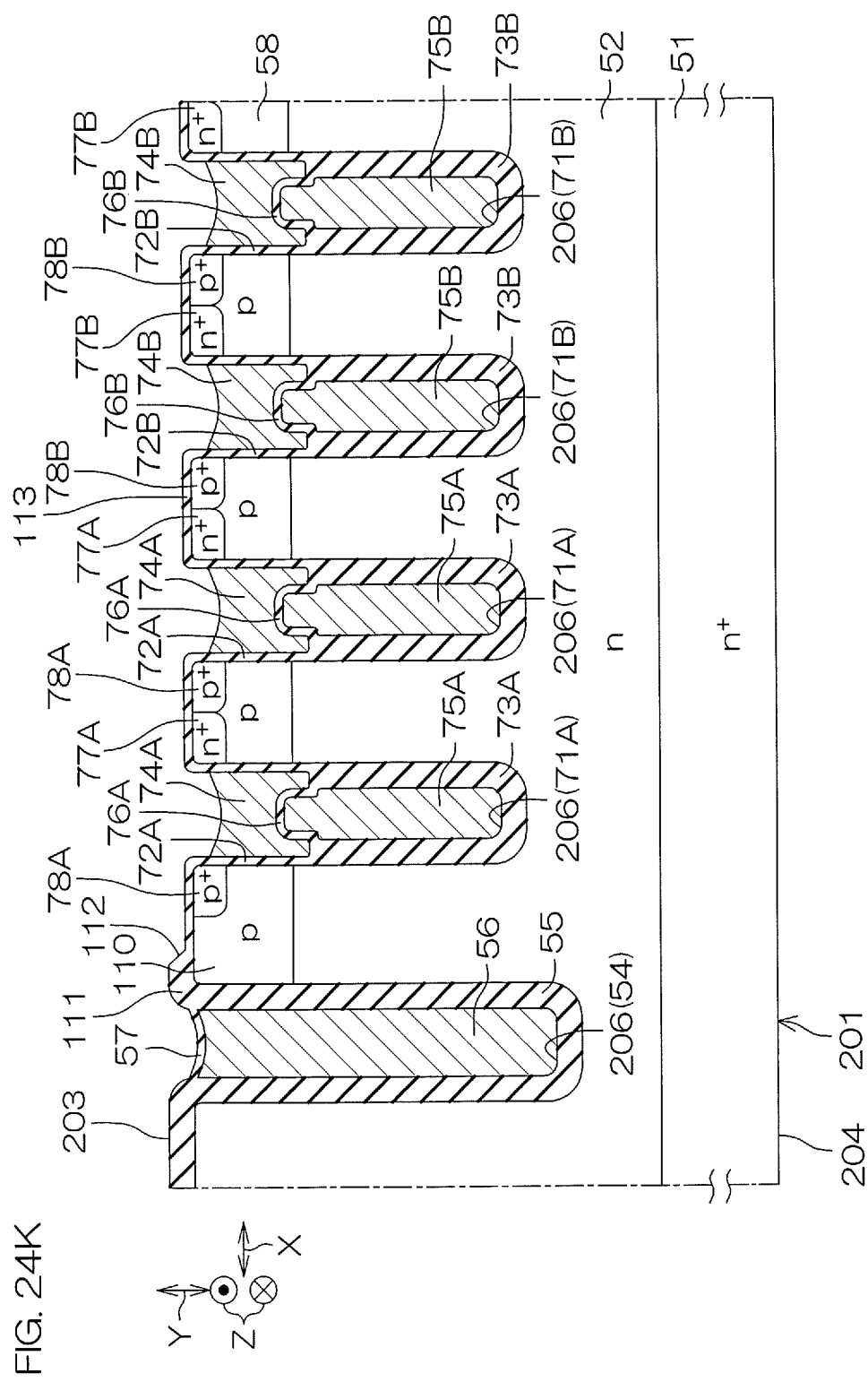

Next, with reference to FIG. 24K, the body region 67, the source region 77 and the contact region 78 are each formed in the surface layer portion of the first wafer main surface 203 by an ion implantation method via side walls of the plurality of trenches 206 (trenches 71). The body region 67 and the contact region 78 are formed by introduction of a p-type impurity, and the source region 77 is formed by introduction of an n-type impurity. A description of subsequent manufacturing steps shall be omitted. The semiconductor device 1 is manufactured through the steps including the above.

The above-described embodiment can be executed by still other embodiments. In the above-described embodiment, a specific structure of the 2-system main transistor 8 is shown. Where the n-system main transistor 8 is adopted, the n-number of the system transistors 9 each include at least one unit cell 60. The electric connection mode of the n-number of the system transistors 9 is adjusted by the number of each of the plurality of gate wirings 15, the plurality of plug electrodes 121 to 125, the plurality of source wirings 126, etc., and the routing mode thereof.

In the above-described embodiment, a description has been given of an example in which during the active clamp operation, the first system transistor 9A is controlled so as to be in an on state and the second system transistor 9B is controlled so as to be in an off state. However, during the active clamp operation, the second system transistor 9B may be controlled so as to be in an on state and the first system transistor 9A may be controlled so as to be in an off state. In this case, a relationship between the first system transistor 9A and the second system transistor 9B may be understood by replacing one of the relationship with the other of the relationship.

In the above-described embodiment, a description has been given of an example in which the semiconductor device 1 has the control IC 11. However, the semiconductor device 1 which does not have control IC 11 but includes main transistor 8 and the n-number of the gate wirings 15 may be adopted.

In each of the above-described embodiments, a description of an example where the first lower electrode 75A is to be fixed at the same potential as the first upper electrode 74A has been given. However, the first lower electrode 75A may be fixed at a potential different from the first upper electrode 74A. In this case, the first lower electrode 75A may be formed as a source electrode and may be fixed at a source potential. According to this structure, it is possible to lower a parasitic capacitance between the semiconductor chip 2 and the first lower electrode 75A. Thereby, the first unit transistor 10A (main transistor 8) can be improved in switching speed.

In each of the above-described embodiments, a description of an example where the second lower electrode 75B is to be fixed at the same potential as the second upper electrode 74B has been given. However, the second lower electrode 75B may be fixed at a potential different from the second upper electrode 74B. In this case, the second lower electrode 75B may be formed as a source electrode and may be fixed at a source potential. According to this structure, it is possible to lower a parasitic capacitance between the semiconductor chip 2 and the second lower electrode 75B. Thereby, the second unit transistor 10B (main transistor 8) can be improved in switching speed.

In the above-described embodiments, a description of an example where the first conductivity type is an n-type and the second conductivity type is a p-type has been given, however, the first conductivity type may be a p-type and the second conductivity type may be an n-type. A specific configuration of this case is obtained by replacing the n-type region with the p-type region and replacing the n-type region with the p-type region in the above description and attached drawings.

Hereinafter, examples of features extracted from this description and the drawings are shown. Hereinafter, a semiconductor device capable of improving reliability is provided. Hereinafter, although alphanumeric characters within parentheses express corresponding components, etc., in the above-described embodiments, these are not meant to limit the scopes of respective items (Clauses) to the embodiments.

[A1] A semiconductor device (1) comprising: a semiconductor chip (2) which has a main surface (3); and a main transistor (8) which includes a first system transistor (9: 9A) and a second system transistor (9: 9B) that are each formed in the main surface (3) so as to be individually controlled; wherein the first system transistor (9: 9A) includes a first composite cell (81) which is constituted of an α-number (α≥2) of first unit transistors (10: 10A) that are arrayed so as to be mutually adjacent to the main surface (3) and that each have a first trench structure (61: 61A) including a first electrode (74, 75: 74A, 75A) embedded in a first trench (71: 71A) formed in the main surface (3), and the second system transistor (9: 9B) includes a second composite cell (82) which is arranged so as to be adjacent to the first composite cell (81) and which is constituted of a β-number (β≥2) of second unit transistors (10: 10B) that are arrayed so as to be mutually adjacent to the main surface (3) and that each have a second trench structure (61: 61B) including a second electrode (74, 75: 74B, 75B) embedded in a second trench (71: 71B) formed in the main surface (3).

[A2] The semiconductor device (1) according to A1, wherein the first system transistor (9: 9A) is controlled by a first gate signal (G: G1), and the second system transistor (9: 9B) is controlled by a second gate signal (G: G2) which is different from the first gate signal (G: G1).

[A3] The semiconductor device (1) according to A1 or A2, wherein the main transistor (8) generates a single output signal (TOUT) by individual controls of the first system transistor (9: 9A) and the second system transistor (9: 9B).

[A4] The semiconductor device (1) according to any one of A1 to A3, wherein the main transistor (8) is changed in on-resistance by individual controls of the first system transistor (9: 9A) and the second system transistor (9: 9B).

[A5] The semiconductor device (1) according to any one of A1 to A4, wherein the main transistor (8) is controlled so that an on-resistance during an active clamp operation is made different from an on-resistance during a normal operation by individual controls of the first system transistor (9: 9A) and the second system transistor (9: 9B).

[A6] The semiconductor device (1) according to any one of A1 to A5, wherein the first composite cells (81) are arrayed at an interval as viewed in plan, and the second composite cell (82) is arranged between the first composite cells (81) as viewed in plan.

[A7] The semiconductor device (1) according to A6, wherein the second composite cells (82) are alternately arrayed with the first composite cells (81) as viewed in plan.

[A8] The semiconductor device (1) according to any one of A1 to A7, wherein the first electrode (74, 75: 74A, 75A) is embedded at an interval from the main surface (3) to a bottom wall side of the first trench (71: 71A), and the second electrode (74, 75: 74B, 75B) is embedded at an interval from the main surface (3) to a bottom wall side of the second trench (71: 71B).

[A9] The semiconductor device (1) according to A8, wherein the first electrode (74, 75: 74A, 75A) is embedded at an interval of not less than 2000 Å from the main surface (3) to the bottom wall side of the first trench (71: 71A), and the second electrode (74, 75: 74B, 75B) is embedded at an interval of not less than 2000 Å from the main surface (3) to the bottom wall side of the second trench (71: 71B).

[A10] The semiconductor device (1) according to any one of A1 to A9, wherein the first electrode (74, 75: 74A, 75A) has a multi-electrode structure which includes a first upper electrode (74: 74A) and a first lower electrode (75: 75A) that are embedded so as to be insulated and separated in an up/down direction inside the first trench (71: 71A), and the second electrode (74, 75: 74B, 75B) has a multi-electrode structure which includes a second upper electrode (74: 74B) and a second lower electrode (75: 75B) that are embedded so as to be insulated and separated in an up/down direction inside the second trench (71: 71B).

[A11] The semiconductor device (1) according to A10, wherein the first lower electrode (75: 75A) is to be fixed at the same potential as the first upper electrode (74: 74A), and the second lower electrode (75: 75B) is to be fixed at the same potential as the second upper electrode (74: 74B).

[A12] The semiconductor device (1) according to A10 or A11, further comprising: a pair of first trench connection structures (90) which each connect both of one ends of the first trench structures (61: 61A) as well as both of the other ends of the first trench structures (61: 61A), and which each include a first connection trench (91) that is formed in the main surface (3) and a first connection electrode (93) that is embedded inside the first connection trench (91); and a pair of second trench connection structures (100) which each connect both of one ends of the second trench structures (61: 61B) as well as both of the other ends of the second trench structures (61: 61B), and which each include a second connection trench (101) that is formed in the main surface (3) and a second connection electrode (103) that is embedded inside the second connection trench (101).

[A13] The semiconductor device (1) according to A12, wherein the pair of first trench connection structure (90) constitute one annular trench structure together with the two first trench structures (61: 61A) as viewed in plan, and the pair of second trench connection structures (100) constitute one annular trench structure together with the two second trench structures (61: 61B) as viewed in plan.

[A14] The semiconductor device (1) according to any one of A1 to A13, wherein the first unit transistor (10: 10A) includes first channel regions (79: 79A) which are formed in a first area for each unit area in a region on both sides of the first trench structure (61: 61A) at a surface layer portion of the main surface (3), and the second unit transistor (10: 10B) includes second channel regions (79: 79B) which are formed in a second area that is equal to the first area in a region on both sides of the second trench structure (61: 61B) at the surface layer portion of the main surface (3).

[A15] The semiconductor device (1) according to any one of A1 to A13, wherein the first unit transistor (10: 10A) includes first channel regions (79: 79A) which are formed in a first area for each unit area in a region on both sides of the first trench structure (61: 61A) at the surface layer portion of the main surface (3), and the second unit transistor (10: 10B) includes second channel regions (79: 79B) which are formed in a second area that is different from the first area for each unit area in a region on both sides of the second trench structure (61: 61B) at the surface layer portion of the main surface (3).

[A16] The semiconductor device (1) according to A14 or A15, wherein the first channel regions (79: 79A) are arrayed at an interval in one direction along the first trench structure (61: 61A) as viewed in plan, and the second channel regions (79: 79B) are arrayed at an interval in the one direction so as to oppose a region between the first channel regions (79: 79A) in an intersecting direction which intersects the one direction as viewed in plan.

[A17] The semiconductor device (1) according to any one of A1 to A16, further comprising: a region separation structure (53) which is formed in the main surface (3) so as to demarcate a device region (6); wherein the first system transistor (9: 9A) and the second system transistor (9: 9B) are formed inside the device region (6).

[A18] The semiconductor device (1) according to any one of A1 to A17, further comprising: control wirings (15: 15A, 15B) which are individually connected to the first system transistor (9: 9A) and the second system transistor (9: 9B).

[A19] The semiconductor device (1) according to any one of A1 to A18, further comprising: a control circuit (11, 12) which is formed in a region different from the main transistor (8) in the main surface (3) and by which the first system transistor (9: 9A) and the second system transistor (9: 9B) are individually controlled.

[A20] The semiconductor device (1) according to any one of A1 to A19, wherein α=2, and β=2.

[B1] A semiconductor device (1) comprising: a semiconductor chip (2) which has a main surface (3); a region separation structure (53) which demarcates a device region (6) in the main surface (3); and an n-system main transistor (8) which includes an n-number (n≥2) of system transistors (9) that are each formed in the main surface (3) in the device region (6) so as to be individually controlled; wherein the region separation structure (53) includes a trench separation structure (53) which includes a separation trench (54) that is formed in the main surface (3) and a separation electrode (56) that is embedded in the separation trench (54) and has a separation electrode surface exposed from the separation trench (54), and each of the system transistors (9) includes a trench structure (61) which includes a trench (71) that is formed in the main surface (3) and an embedded electrode (74, 75) that is embedded in the trench (71) and has an embedded electrode surface that is positioned on a bottom wall side of the trench (71) with respect to a depth position of the separation electrode surface regarding a depth direction of the trench (71).

[B2] The semiconductor device (1) according to B1, wherein the embedded electrode (74, 75) is embedded at an interval of not less than 2000 Å from the main surface (3) to the bottom wall side of the trench (71).

[B3] The semiconductor device (1) according to B2, wherein the embedded electrode (74, 75) is embedded at an interval of not less than 2500 Å and not more than 4500 Å from the main surface (3) to the bottom wall side of the trench (71).

[B4] The semiconductor device (1) according to any one of B1 to B3, wherein the separation electrode (56) is embedded at an interval of less than 2000 Å from the main surface (3) to a bottom wall side of the separation trench (54).

[B5] The semiconductor device (1) according to B4, wherein the separation electrode (56) is embedded at an interval of less than 1000 Å from the main surface (3) to the bottom wall side of the separation trench (54).

[B6] The semiconductor device (1) according to any one of B1 to B5, wherein a potential different from a potential that is to be applied to the separation electrode (56) is to be applied to the embedded electrode (74, 75).

[B7] The semiconductor device (1) according to any one of B1 to B6, wherein the main transistor (8) generates a single output signal (TOUT) by individual controls of the n-number of the system transistors (9).

[B8] The semiconductor device (1) according to any one of B1 to B7, wherein the main transistor (8) is changed in on-resistance by individual controls of the n-number of the system transistors (9).

[B9] The semiconductor device (1) according to any one of B1 to B8, wherein the main transistor (8) is controlled so that an on-resistance during an active clamp operation is made different from an on-resistance during a normal operation by individual controls of the n-number of the system transistors (9).

[B10] The semiconductor device (1) according to any one of B1 to B9, wherein the n-number of the system transistors (9) include a first system transistor (9: 9A) which is controlled by a first gate signal (G: G1) and a second system transistor (9: 9B) which is controlled by a second gate signal (G: G2) that is different from the first gate signal (G: G1).

[B11] The semiconductor device (1) according to B10, wherein the first system transistor (9: 9A) has a first channel area for each unit area, and the second system transistor (9: 9B) has a second channel area which is equal to the first channel area for each unit area.

[B12] The semiconductor device (1) according to B10, wherein the first system transistor (9: 9A) has a first channel area for each unit area, and the second system transistor (9: 9B) has a second channel area which is different from the first channel area for each unit area.

[B13] The semiconductor device (1) according to any one of B1 to B12, wherein the trench (71) has a width which is less than a width of the separation trench (54).

[B14] The semiconductor device (1) according to any one of B1 to B13, wherein the trench (71) has a depth which is less than a depth of the separation trench (54).

[B15] The semiconductor device (1) according to any one of B1 to B14, wherein the region separation structure (53) surrounds a part of the main surface (3) so as to demarcate the device region (6) as viewed in plan.

[B16] The semiconductor device (1) according to any one of B1 to B15, wherein the trench structures (61) are arrayed as a stripe as viewed in plan.

[B17] The semiconductor device (1) according to any one of B1 to B16, wherein the trench separation structure (53) includes a cap insulating film (57) which covers the separation electrode surface.

[B18] The semiconductor device (1) according to any one of B1 to B17, wherein the separation electrode (56) has a single electrode structure which is embedded as an integrated member in the separation trench (54), and the embedded electrode (74, 75) has a multi-electrode structure which includes an upper electrode (74) and a lower electrode (75) that are embedded inside the trench (71) so as to be insulated and separated in an up/down direction.

[B19] The semiconductor device (1) according to B18, wherein the lower electrode (75) is to be fixed at the same potential as the upper electrode (74).

[B20] The semiconductor device (1) according to any one of B1 to B19, further comprising: a control circuit (11, 12) which is formed in a region different from the device region (6) and individually controls the n-number of the system transistors (9).

[B21] The semiconductor device (1) according to any one of B1 to B20, further comprising: an n-number of control wirings (15: 15A, 15B) which are individually connected to the n-number of the system transistors (9).

[B22] The semiconductor device (1) according to any one of B1 to B21, wherein n=2.

[B23] A semiconductor device (1) comprising: a semiconductor chip (2) which has a main surface (3); a region separation structure (53) which demarcates a device region (6) in the main surface (3); and an insulated gate-type transistor (8) which is formed in the main surface (3) of the device region (6); wherein the region separation structure (53) includes a trench separation structure (53) which includes a separation trench (54) that is formed in the main surface (3) and a separation electrode (56) that is embedded in the separation trench (54) and has a separation electrode surface exposed from the separation trench (54), and the transistor (8) includes a trench structure (61) which includes a trench (71) that is formed in the main surface (3) and an embedded electrode (74, 75) that is embedded in the trench (71) and has an embedded electrode surface positioned on the bottom wall side of the trench (71) with respect to a depth position of the separation electrode surface regarding a depth direction of the trench (71).

[B24] The semiconductor device (1) according to B23, wherein a potential which is different from a potential applied to the separation electrode (56) is to be applied to the embedded electrode (74, 75).

[B25] The semiconductor device (1) according to B23 or B24, wherein the separation electrode (56) is embedded at an interval of less than 2000 Å from the main surface (3) to the bottom wall side of the separation trench (54), and the embedded electrode (74, 75) is embedded at an interval of not less than 2000 Å from the main surface (3) to the bottom wall side of the trench (71).

[B26] The semiconductor device (1) according to any one of B23 to B25, wherein the transistor (8) is constituted of an n-system main transistor (8) which includes an n-number (n≥2) of system transistors (9) that are each formed in the main surface (3) of the device region (6) so as to be individually controlled, and the n-number of the system transistors (9) each include the trench structure (61).

[C1] A semiconductor device (1) comprising: a semiconductor chip (2) which has a main surface (3); and an n-system main transistor (8) which includes an n-number (n≥2) of system transistors (9) that are each formed in the main surface (3) so as to be individually controlled; wherein each of the system transistors (9) includes a trench structure (61) which includes a trench (71) that is formed in the main surface (3) and an embedded electrode (74, 75) that is embedded in the trench (71) and has an embedded electrode surface that is formed at an interval from the main surface (3) to a bottom wall side of the trench (71) regarding a depth direction of the trench (71), and a trench connection structure (90, 100) which includes a connection trench (91, 101) that is formed in the main surface (3) so as to be communicatively connected to the trench (71) and a connection electrode (93, 103) that is embedded inside the connection trench (91, 101) and has a connection electrode surface that protrudes to the main surface (3) side with respect to a depth position of the embedded electrode surface regarding a depth direction of the connection trench (91, 101).

[C2] The semiconductor device (1) according to C1, wherein the embedded electrode (74, 75) is embedded at an interval of not less than 2000 Å from the main surface (3) to the bottom wall side of the trench (71).

[C3] The semiconductor device (1) according to C2, wherein the embedded electrode (74, 75) is embedded at an interval of not less than 2500 Å and not more than 4500 Å from the main surface (3) to the bottom wall side of the trench (71).

[C4] The semiconductor device (1) according to any one of C1 to C3, wherein the connection electrode (93, 103) is embedded at an interval of less than 2000 Å from the main surface (3) to a bottom wall side of the connection trench (91, 101).

[C5] The semiconductor device (1) according to C4, wherein the connection electrode (93, 103) is embedded at an interval of less than 1000 Å from the main surface (3) to the bottom wall side of the connection trench (91, 101).

[C6] The semiconductor device (1) according to any one of C1 to C5, wherein the main transistor (8) generates a single output signal (TOUT) by individual controls of the n-number of the system transistors (9).

[C7] The semiconductor device (1) according to any one of C1 to C6, wherein the main transistor (8) is changed in on-resistance by individual controls of the n-number of the system transistors (9).

[C8] The semiconductor device (1) according to any one of C1 to C7, wherein the main transistor (8) is controlled so that an on-resistance during an active clamp operation is made different from an on-resistance during a normal operation by individual controls of the n-number of the system transistors (9).

[C9] The semiconductor device (1) according to any one of C1 to C8, wherein the n-number of the system transistors (9) include a first system transistor (9: 9A) which is controlled by a first gate signal (G: G1), and a second system transistor (9: 9B) which is controlled by a second gate signal (G: G2) that is different from the first gate signal (G: G1).

[C10] The semiconductor device (1) according to C9, wherein the first system transistor (9: 9A) has a first channel area for each unit area, and the second system transistor (9: 9B) has a second channel area which is equal to the first channel area for each unit area.

[C11] The semiconductor device (1) according to C9, wherein the first system transistor (9: 9A) has a first channel area for each unit area, and the second system transistor (9: 9B) has a second channel area which is different from the first channel area for each unit area.

[C12] The semiconductor device (1) according to any one of C1 to C11, wherein the trench structures (61) are arrayed as a stripe as viewed in plan, and the trench connection structure (90, 100) connects the trench structures (61) in an arch shape as viewed in plan.

[C13] The semiconductor device (1) according to any one of C1 to C12, wherein the trench connection structure (90, 100) includes a cap insulating film (94, 104) which covers the connection electrode surface.

[C14] The semiconductor device (1) according to any one of C1 to C13, wherein the embedded electrode (74, 75) has a multi-electrode structure including an upper electrode (74) and a lower electrode (75) which are embedded so as to be insulated and separated in an up/down direction inside the trench (71), and the connection electrode (93, 103) has a single electrode structure which is embedded as an integrated member in the connection trench (91, 101).

[C15] The semiconductor device (1) according to C14, wherein the connection electrode (93, 103) is to be fixed at the same potential as the lower electrode (75).

[C16] The semiconductor device (1) according to C14 or C15, wherein the connection electrode (93, 103) continues to the lower electrode (75) at a communicatively connected portion of the trench (71) and the connection trench (91, 101).

[C17] The semiconductor device (1) according to any one of C14 to C16, wherein the connection electrode (93, 103) is insulated and separated from the upper electrode (74).

[C18] The semiconductor device (1) according to any one of C14 to C17, wherein the lower electrode (75) is to be fixed at the same potential as the upper electrode (74).

[C19] The semiconductor device (1) according to any one of C1 to C18, further comprising: a region separation structure (53) which demarcates a device region (6) in the main surface (3); wherein the main transistor (8) is formed in the device region (6).

[C20] The semiconductor device (1) according to C19, wherein the region separation structure (53) includes a trench separation structure (53) which includes a separation trench (54) that is formed in the main surface (3) and a separation electrode (56) that is embedded in the separation trench (54) and has a separation electrode surface exposed from the separation trench (54), and the embedded electrode surface of the embedded electrode (74, 75) is positioned on the bottom wall side of the trench (71) with respect to a depth position of the separation electrode surface regarding a depth direction of the trench (71).

[C21] The semiconductor device (1) according to C20, wherein the trench separation structure (53) includes a separation cap insulating film (57) which covers the separation electrode surface.

[C22] The semiconductor device (1) according to C20 or C21, wherein a potential different from the separation electrode (56) is to be applied to the connection electrode (93, 103).

[C23] The semiconductor device (1) according to any one of C20 to C22, wherein the region separation structure (53) surrounds a part of the main surface (3) so as to demarcate the device region (6) as viewed in plan.

[C24] The semiconductor device (1) according to any one of C1 to C23, further comprising: a control circuit (11, 12) which is formed in a region different from the main transistor (8) and individually controls the n-number of the system transistors (9).

[C25] The semiconductor device (1) according to any one of C1 to C24, further comprising: an n-number of control wirings (15: 15A, 15B) which are individually connected to the n-number of the system transistors (9).

[C26] The semiconductor device (1) according to any one of C1 to C25, wherein n=2.

[C27] A semiconductor device (1) comprising: a semiconductor chip (2) which has a main surface (3); and an insulated gate-type transistor (8) which is formed in the main surface (3); wherein the transistor (8) includes a trench structure (61) which includes a trench (71) that is formed in the main surface (3) and an embedded electrode (74, 75) that is embedded in the trench (71) and has an embedded electrode surface that is formed at an interval from the main surface (3) to the bottom wall side of the trench (71) regarding a depth direction of the trench (71), and a trench connection structure (90, 100) which includes a connection trench (91, 101) that is formed in the main surface (3) so as to be communicatively connected to the trench (71) and a connection electrode (93, 103) that is embedded inside the connection trench (91, 101) and has a connection electrode surface that is positioned on the main surface (3) side with respect to a depth position of the embedded electrode surface regarding a depth direction of the connection trench (91, 101).

[C28] The semiconductor device (1) according to C27, wherein the embedded electrode surface is embedded at an interval of not less than 2000 Å from the main surface (3) to the bottom wall side of the trench (71), and the connection electrode surface is embedded at an interval of less than 2000 Å from the main surface (3) to the bottom wall side of the connection trench (91, 101).

[C29] The semiconductor device (1) according to C27 or C28, wherein the trench connection structure (90, 100) includes a cap insulating film (94, 104) which covers the connection electrode surface.

[C30] The semiconductor device (1) according to any one of C27 to C29, wherein the transistor (8) is constituted of an n-system main transistor (8) which includes an n-number (n≥2) of system transistors (9) that are each formed in the main surface (3) so as to be individually controlled, and the n-number of the system transistors (9) each include the trench structure (61).

While the embodiments of the present invention have been described in detail, these are merely specific examples used to clarify the technical contents of the present invention and the present invention should not be interpreted as being limited to these specific examples, and the scope of the present invention is to be limited by the appended claims.

The invention claimed is:

1. A semiconductor device comprising:
a semiconductor chip which has a main surface; and
a main transistor which includes a first system transistor and a second system transistor that are each formed in the main surface so as to be individually controlled;
wherein the first system transistor includes a first composite cell which is constituted of an α-number (α≥2) of first unit transistors that are arrayed so as to be mutually adjacent to the main surface and that each have a first trench structure including a first electrode embedded in a first trench formed in the main surface,
the second system transistor includes a second composite cell which is arranged so as to be adjacent to the first composite cell and constituted of a β-number (β≥2) of second unit transistors that are arrayed so as to be mutually adjacent to the main surface and that each have a second trench structure including a second electrode embedded in a second trench formed in the main surface,
the first electrode is embedded at an interval of not less than 2500 Å and not more than 4500 Å from the main surface to a bottom wall side of the first trench, and
the second electrode is embedded at an interval of not less than 2500 Å and not more than 4500 Å from the main surface to a bottom wall side of the second trench.

2. The semiconductor device according to claim 1, wherein the first system transistor is controlled by a first gate signal, and the second system transistor is controlled by a second gate signal which is different from the first gate signal.

3. The semiconductor device according to claim 1, wherein the main transistor generates a single output signal by individual controls of the first transistor and second system transistor.

4. The semiconductor device according to claim 1, wherein the main transistor is changed in on-resistance by individual controls of the first transistor and second system transistor.

5. The semiconductor device according to claim 1, wherein the main transistor is to be controlled so that an on-resistance during an active clamp operation is made different from an on-resistance during a normal operation by individual controls of the first transistor and second system transistor.

6. The semiconductor device according to claim 1, wherein a plurality of first composite cells are arrayed at an interval as viewed in plan, and
the second composite cell is arranged between the plurality of first composite cells as viewed in plan.

7. The semiconductor device according to claim 6, wherein a plurality of second composite cells are arrayed alternately with the plurality of first composite cells as viewed in plan.

8. The semiconductor device according to claim 1, wherein the first electrode has a multi-electrode structure which includes a first upper electrode and a first lower electrode that are embedded so as to be insulated and separated in an up/down direction inside the first trench, and
the second electrode has a multi-electrode structure which includes a second upper electrode and a second lower electrode that are embedded so as to be insulated and separated in an up/down direction inside the second trench.

9. The semiconductor device according to claim 8, wherein the first lower electrode is to be fixed at the same potential as the first upper electrode, and
the second lower electrode is to be fixed at the same potential as the second upper electrode.

10. The semiconductor device according to claim 8, further comprising:
a pair of first trench connection structures which each connect both of one ends of the first trench structures as well as both of the other ends of the first trench structures, and which each include a first connection trench that is formed in the main surface and a first connection electrode that is embedded inside the first connection trench, and
a pair of second trench connection structures which each connect both of one ends of the second trench structures as well as both of the other ends of the second trench structures, and which each include a second connection trench that is formed in the main surface and a second connection electrode that is embedded inside the second connection trench.

11. The semiconductor device according to claim 10, wherein the pair of first trench connection structures constitute an annular trench structure together with the first trench structures as viewed in plan, and
the pair of second trench connection structures constitute an annular trench structure together with the second trench structures as viewed in plan.

12. The semiconductor device according to claim 1, wherein the first unit transistor includes first channel regions which are formed in a first area for each unit area in a region on both sides of the first trench structure at a surface layer portion of the main surface, and the second unit transistor includes second channel regions which are formed in a second area equal to the first area for each unit area in a region on both sides of the second trench structure at the surface layer portion of the main surface.

13. The semiconductor device according to claim 12, wherein the first channel regions are arrayed at an interval in one direction along the first trench structure as viewed in plan, and the second channel regions are arrayed at an interval in the one direction so as to oppose a region between the first channel regions in an intersecting direction which intersects the one direction as viewed in plan.

14. The semiconductor device according to claim 1, wherein the first unit transistor includes first channel regions which are formed in a first area for each unit area in a region on both sides of the first trench structure at the surface layer portion of the main surface, and the second unit transistor includes second channel regions which are formed in a second area that is different from the first area for each unit area in a region on both sides of the second trench structure at the surface layer portion of the main surface.

15. The semiconductor device according to claim 1, further comprising:

a region separation structure which is formed in the main surface so as to demarcate a device region;

wherein the first system transistor and the second system transistor are formed inside the device region.

16. The semiconductor device according to claim 15, wherein the region separation structure is a trench separation structure, a width of the first trench structure is less than a width of the region separation structure, and a width of the second trench structure is less than the width of the region separation structure.

17. The semiconductor device according to claim 15, wherein the region separation structure is a trench separation structure, a depth of the first trench structure is less than a depth of the region separation structure, and a depth of the second trench structure is less than the depth of the region separation structure.

18. The semiconductor device according to claim 1, further comprising:

control wirings which are individually connected to the first system transistor and the second system transistor.

19. The semiconductor device according to claim 1, further comprising:

a control circuit which is formed in a region different from the main transistor in the main surface and by which the first system transistor and the second system transistor are individually controlled.

20. The semiconductor device according to claim 1, wherein $\alpha=2$, and $\beta=2$.

* * * * *